(12) United States Patent
Masuyama et al.

(10) Patent No.: US 8,304,164 B2
(45) Date of Patent: Nov. 6, 2012

(54) PHOTORESIST COMPOSITION

(75) Inventors: Tatsuro Masuyama, Toyonaka (JP); Yuichi Mukai, Sanda (JP); Masahiko Shimada, Toyonaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 188 days.

(21) Appl. No.: 12/983,594

(22) Filed: Jan. 3, 2011

(65) Prior Publication Data

US 2011/0171575 A1    Jul. 14, 2011

(30) Foreign Application Priority Data

Jan. 12, 2010   (JP) ................. 2010-003803

(51) Int. Cl.
*G03F 7/004* (2006.01)
*G03F 7/30* (2006.01)
(52) U.S. Cl. ............ 430/270.1; 430/326; 430/330; 430/905; 430/910; 430/919; 430/921; 526/311; 560/220
(58) Field of Classification Search ......... 430/270.1, 430/326, 330, 910, 919; 526/311; 560/220
See application file for complete search history.

(56) References Cited

U.S. PATENT DOCUMENTS

| | | | |
|---|---|---|---|
| 5,015,559 A | 5/1991 | Ogawa | |
| 5,459,216 A * | 10/1995 | Bott et al. | 526/311 |
| 5,514,762 A * | 5/1996 | Bott et al. | 526/301 |
| 5,965,325 A | 10/1999 | Matsuo et al. | |
| 2008/0057436 A1 | 3/2008 | Kim et al. | |
| 2008/0166660 A1 | 7/2008 | Takata et al. | |
| 2008/0286687 A1 * | 11/2008 | Endo et al. | 430/281.1 |
| 2011/0091807 A1 | 4/2011 | Masuyama et al. | |

FOREIGN PATENT DOCUMENTS

| | | |
|---|---|---|
| EP | 0741126 | * 11/1996 |
| JP | 63260912 | * 10/1988 |
| JP | 6-295063 A | 10/1994 |
| JP | 2001-305735 A | 11/2001 |

* cited by examiner

*Primary Examiner* — John Chu
(74) *Attorney, Agent, or Firm* — Birch, Stewart, Kolasch & Birch, LLP

(57) ABSTRACT

The present invention provides a photoresist composition comprising:

at least one selected from the group consisting of a monomer represented by the formula (I):

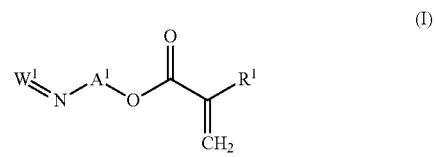

wherein $R^1$ represents a hydrogen atom or a methyl group, $W^1$ represents a C3-C20 divalent saturated cyclic hydrocarbon group, $A^1$ represents a single bond or *-O—CO—$W^1$— wherein * represents a binding position to $W^1$=N— and W1 represents a C1-C10 divalent saturated hydrocarbon group, a polymer consisting of a structural unit derived from the monomer represented by the formula (I) and a polymer consisting of a structural unit derived from the monomer represented by the formula (I) and a structural unit derived from a monomer represented by the formula (II):

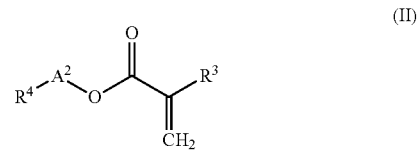

wherein $R^3$ represents a hydrogen atom or a methyl group, $A^2$ represents a single bond or *-O—CO—$(CH_2)_n$— wherein * represents a binding position to $R^4$—, n represents an integer of 1 to 7 and $R^4$ represents a C3-C20 saturated cyclic hydrocarbon group, a resin having an acid-labile group and being insoluble or poorly soluble in an aqueous alkali solution but becoming soluble in an aqueous alkali solution by the action of an acid, and an acid generator.

5 Claims, No Drawings

PHOTORESIST COMPOSITION

This nonprovisional application claims priority under 35 U.S.C. §119(a) on Patent Application No. 2010-003803 filed in JAPAN on Jan. 12, 2010, the entire contents of which are hereby incorporated by reference.

FIELD OF THE INVENTION

The present invention relates to a photoresist composition.

BACKGROUND OF THE INVENTION

A photoresist composition is used for semiconductor microfabrication employing a lithography process.

US 2008/0166660 A1 discloses a photoresist composition comprising a resin having a structural unit derived from 2-ethyl-2-adamantyl methacrylate, a structural unit derived from 3-hydroxy-1-adamantyl methacrylate, a structural unit derived from 2-(5-oxo-4-oxatricyclo[4.2.1.0$^{3,7}$]nonan-2-yloxy)-2-oxoethyl methacrylate and a structural unit derived from α-methacryloyloxy-γ-butyrolactone, an acid generator comprising triphenylsulfonium 4-oxoadamantan-1-yloxy-carbonyl(difluoro)methanesulfonate, a basic compound comprising 2,6-diisopropylaniline and solvents.

SUMMARY OF THE INVENTION

The present invention is to provide a photoresist composition.

The present invention relates to the followings:

<1> A photoresist composition comprising:

at least one selected from the group consisting of a monomer represented by the formula (I):

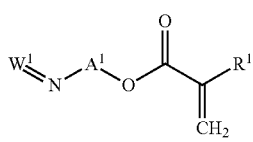

(I)

wherein $R^1$ represents a hydrogen atom or a methyl group, $W^1$ represents a C3-C20 divalent saturated cyclic hydrocarbon group which can have one or more substituents selected from the group consisting of a hydroxyl group, a halogen atom, a cyano group and a nitro group and in which one or more —CH$_2$— can be replaced by —O— or —CO—, $A^1$ represents a single bond or *-O—CO—$R^2$— wherein * represents a binding position to $W^1$=N— and $R^2$ represents a C1-C10 divalent saturated hydrocarbon group in which one or more —CH$_2$— can be replaced by —O—, —CO— or —NH—, a polymer consisting of a structural unit derived from the monomer represented by the formula (I) and a polymer consisting of a structural unit derived from the monomer represented by the formula (I) and a structural unit derived from a monomer represented by the formula (II):

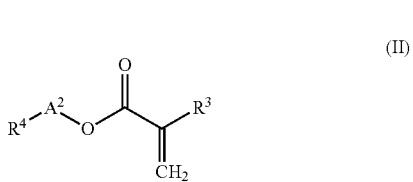

(II)

wherein $R^3$ represents a hydrogen atom or a methyl group, $A^2$ represents a single bond or *-O—CO—(CH$_2$)$_n$— wherein * represents a binding position to $R^4$—, n represents an integer of 1 to 7 and $R^4$ represents a C3-C20 saturated cyclic hydrocarbon group in which one or more —CH$_2$— can be replaced by —O— or —CO—, a resin having an acid-labile group and being insoluble or poorly soluble in an aqueous alkali solution but becoming soluble in an aqueous alkali solution by the action of an acid, and an acid generator;

<2> The photoresist composition according to <1>, wherein $W^1$ is a group represented by the formula ($W^1$-A):

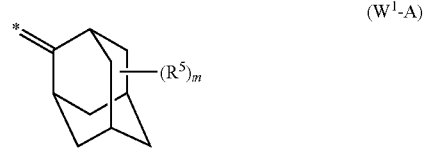

($W^1$-A)

wherein $R^5$ is independently in each occurrence a hydroxyl group, a halogen atom, a cyano group or a nitro group and m represents an integer of 0 to 5;

<3> The photoresist composition according to <2>, wherein $R^5$ is a hydroxyl group;

<4> The photoresist composition according to any one of <1> to <3>, wherein the acid generator is a salt represented by the formula (B1):

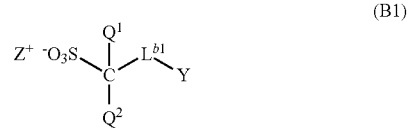

(B1)

wherein $Q^1$ and $Q^2$ each independently represent a fluorine atom or a C1-C6 perfluoroalkyl group, $L^{b1}$ represents a single bond or a C1-C17 divalent saturated hydrocarbon group in which one or more —CH$_2$— can be replaced by —O— or —CO—, Y represents a C1-C18 aliphatic hydrocarbon group which can have one or more substituents or a C3-C18 saturated cyclic hydrocarbon group which can have one or more substituents, and one or more —CH$_2$— in the aliphatic hydrocarbon group and the saturated cyclic hydrocarbon group can be replaced by —O—, —SO$_2$— or —CO—, and $Z^+$ represents an organic counter cation;

<5> A process for producing a photoresist pattern comprising the following steps (1) to (5):

(1) a step of applying the photoresist composition according to any one of <1> to <4> on a substrate, (2) a step of forming a photoresist film by conducting drying, (3) a step of exposing the photoresist film to radiation, (4) a step of baking the exposed photoresist film, and (5) a step of developing the baked photoresist film with an alkaline developer, thereby forming a photoresist pattern.

DESCRIPTION OF PREFERRED EMBODIMENTS

The photoresist composition of the present invention comprises the following Component (A), Component (B) and Component (C):

Component (A): at least one selected from the group consisting of a monomer represented by the formula (I), a polymer consisting of a structural unit derived from MONOMER (I) and a polymer consisting of a structural unit derived from MONOMER (I) and a structural unit derived from a monomer represented by the formula (II), Component (B): a resin having an acid-labile group and being insoluble or poorly soluble in an aqueous alkali solution but becoming soluble in an aqueous alkali solution by the action of an acid, Component (C): an acid generator.

Hereinafter, the monomer represented by the formula (I) is simply referred to as MONOMER (I), and the monomer represented by the formula (II) is simply referred to as MONOMER (II).

Hereinafter, the polymer consisting of a structural unit derived from MONOMER (I) is simply referred to as POLYMER (I), and the polymer consisting of a structural unit derived from MONOMER (I) and a structural unit derived from MONOMER (II) is simply referred to as POLYMER (II).

First, Component (A) will be illustrated.

Component (A) is at least one selected from the group consisting of MONOMER (I), POLYMER (I) and POLYMER (II).

MONOMER (I) is represented by the formula (I):

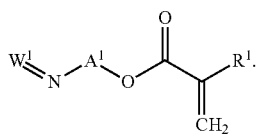

(I)

In the formula (I), $R^1$ represents a hydrogen atom or a methyl group, $W^1$ represents a C3-C20 divalent saturated cyclic hydrocarbon group which can have one or more substituents selected from the group consisting of a hydroxyl group, a halogen atom, a cyano group and a nitro group and in which one or more —CH$_2$— can be replaced by —O— or —CO—, $A^1$ represents a single bond or *-O—CO—R$^2$— wherein * represents a binding position to $W^1$=N— and $R^2$ represents a C1-C10 divalent saturated hydrocarbon group in which one or more —CH$_2$— can be replaced by —O—, —CO— or —NH—.

The C3-C20 divalent saturated cyclic hydrocarbon group represented by $W^1$ has a carbon atom having a double bond to be bonded to a nitrogen atom. The C3-C20 divalent saturated cyclic hydrocarbon group can have one or more substituents selected from the group consisting of a hydroxyl group, a halogen atom such as a fluorine atom, a chlorine atom, a bromine atom and an iodine atom, a cyano group and a nitro group, and one or more —CH$_2$— in the C3-C20 divalent saturated cyclic hydrocarbon group can be replaced by —O— or —CO—.

Examples thereof include the following groups represented by the formulae ($W^1$-1) to ($W^1$-45), and in the following formulae, * represents a binding position to a nitrogen atom.

($W^1$-1)

($W^1$-2)

($W^1$-3)

($W^1$-4)

($W^1$-5)

($W^1$-6)

($W^1$-7)

($W^1$-8)

($W^1$-9)

($W^1$-10)

($W^1$-11)

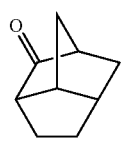 (W¹-12)
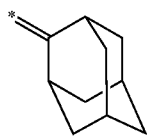 (W¹-13)
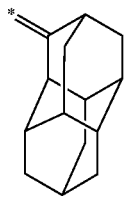 (W¹-14)
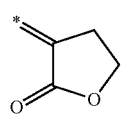 (W¹-15)
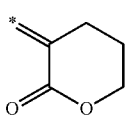 (W¹-16)
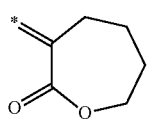 (W¹-17)
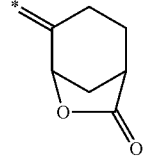 (W¹-18)
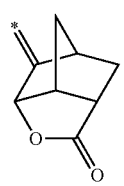 (W¹-19)
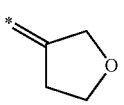 (W¹²-20)
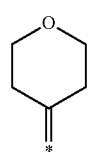 (W¹-21)
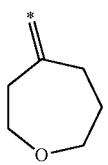 (W¹-22)
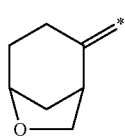 (W¹-23)
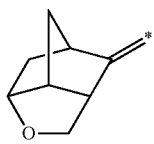 (W¹-24)
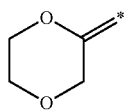 (W¹-25)
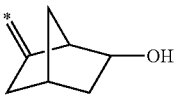 (W¹-30)
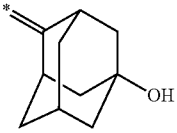 (W¹-31)
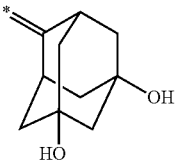 (W¹-32)
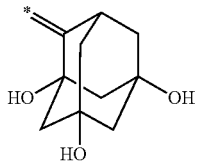 (W¹-33)
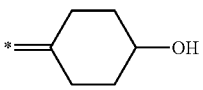 (W¹-34)
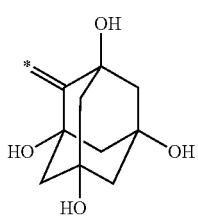 (W¹-35)

(W¹-36)
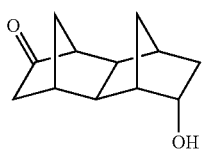

(W¹-37)
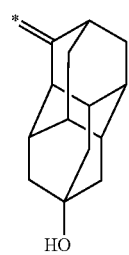

(W¹-38)
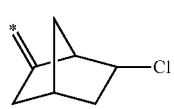

(W¹-39)
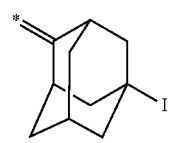

(W¹-40)
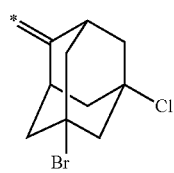

(W¹-41)
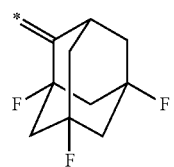

(W¹-42)
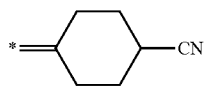

(W¹-43)
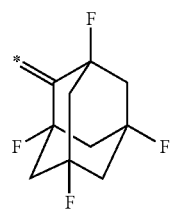

(W¹-44)
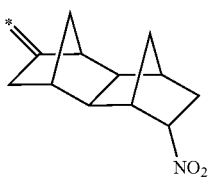

(W¹-45)
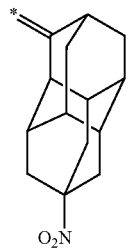

Among them, preferred is the group represented by the formula (W¹-4), (W¹-13) or (W¹-31).

Examples of the C1-C10 divalent saturated hydrocarbon group represented by $R^2$ include a C1-C10 alkylene group such as a methylene group, an ethylene group, a trimethylene group, a tetramethylene group, a pentamethylene group, a hexamethylene group, a heptamethylene group, an octamethylene group, a nonamethylene group and a decamethylene group. One or more —CH₂— in the C1-C10 divalent saturated hydrocarbon group can be replaced by —O—, —CO— or —NH—.

Examples of $A^1$ include the following groups represented by the formulae ($A^1$-1) to ($A^1$-10), and in the followings, ($A^1$-1) means a single bond.

($A^1$-1)
———

($A^1$-2)
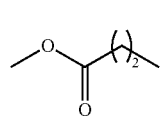

($A^1$-3)
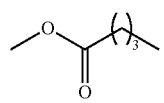

($A^1$-4)
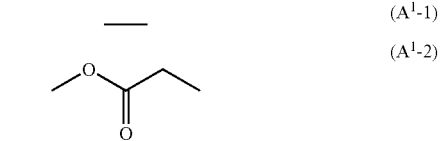

($A^1$-5)

($A^1$-6)
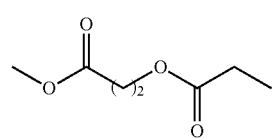

($A^1$-7)
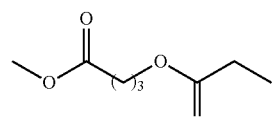

($A^1$-8)
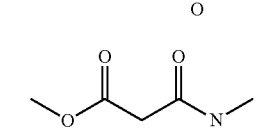

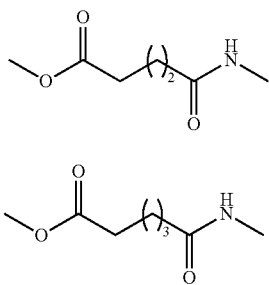

Among them, preferred are the groups represented by the formulae (A¹-1) to (A¹-4).

Specific examples of MONOMER (I) include the following monomer (I-1) to monomer (I-138) shown in Tables 1 to 8. For example, monomer (I-13) in Table 1 is a monomer represented by the following formula:

TABLE 1

(I-13)

| Compound (I) | $A^1$ | $R^1$ | $W^1$ |
|---|---|---|---|
| I-1 | $A^1$-1 | $CH_3$ | $W^1$-1 |
| I-2 | $A^1$-1 | $CH_3$ | $W^1$-2 |
| I-3 | $A^1$-1 | $CH_3$ | $W^1$-3 |
| I-4 | $A^1$-1 | $CH_3$ | $W^1$-4 |
| I-5 | $A^1$-1 | $CH_3$ | $W^1$-5 |
| I-6 | $A^1$-1 | $CH_3$ | $W^1$-6 |
| I-7 | $A^1$-1 | $CH_3$ | $W^1$-7 |
| I-8 | $A^1$-1 | $CH_3$ | $W^1$-8 |
| I-9 | $A^1$-1 | $CH_3$ | $W^1$-9 |
| I-10 | $A^1$-1 | $CH_3$ | $W^1$-10 |
| I-11 | $A^1$-1 | $CH_3$ | $W^1$-11 |
| I-12 | $A^1$-1 | $CH_3$ | $W^1$-12 |
| I-13 | $A^1$-1 | $CH_3$ | $W^1$-13 |
| I-14 | $A^1$-1 | $CH_3$ | $W^1$-14 |
| I-15 | $A^1$-1 | $CH_3$ | $W^1$-15 |
| I-16 | $A^1$-1 | $CH_3$ | $W^1$-16 |
| I-17 | $A^1$-1 | $CH_3$ | $W^1$-17 |
| I-18 | $A^1$-1 | $CH_3$ | $W^1$-18 |
| I-19 | $A^1$-1 | $CH_3$ | $W^1$-19 |
| I-20 | $A^1$-1 | $CH_3$ | $W^1$-20 |

TABLE 2

| Compound (I) | $A^1$ | $R^1$ | $W^1$ |
|---|---|---|---|
| I-21 | $A^1$-1 | $CH_3$ | $W^1$-21 |
| I-22 | $A^1$-1 | $CH_3$ | $W^1$-22 |
| I-23 | $A^1$-1 | $CH_3$ | $W^1$-23 |
| I-24 | $A^1$-1 | $CH_3$ | $W^1$-24 |
| I-25 | $A^1$-1 | $CH_3$ | $W^1$-25 |
| I-26 | $A^1$-1 | $CH_3$ | $W^1$-30 |
| I-27 | $A^1$-1 | $CH_3$ | $W^1$-31 |
| I-28 | $A^1$-1 | $CH_3$ | $W^1$-32 |
| I-29 | $A^1$-1 | $CH_3$ | $W^1$-33 |
| I-30 | $A^1$-1 | $CH_3$ | $W^1$-34 |
| I-31 | $A^1$-1 | $CH_3$ | $W^1$-35 |
| I-32 | $A^1$-1 | $CH_3$ | $W^1$-36 |
| I-33 | $A^1$-1 | $CH_3$ | $W^1$-37 |
| I-34 | $A^1$-1 | $CH_3$ | $W^1$-38 |
| I-35 | $A^1$-1 | $CH_3$ | $W^1$-39 |
| I-36 | $A^1$-1 | $CH_3$ | $W^1$-40 |
| I-37 | $A^1$-1 | $CH_3$ | $W^1$-41 |
| I-38 | $A^1$-1 | $CH_3$ | $W^1$-42 |
| I-39 | $A^1$-1 | $CH_3$ | $W^1$-43 |
| I-40 | $A^1$-1 | $CH_3$ | $W^1$-44 |
| I-41 | $A^1$-1 | $CH_3$ | $W^1$-45 |
| I-42 | $A^1$-1 | H | $W^1$-3 |
| I-43 | $A^1$-1 | H | $W^1$-4 |
| I-44 | $A^1$-1 | H | $W^1$-8 |
| I-45 | $A^1$-1 | H | $W^1$-9 |
| I-46 | $A^1$-1 | H | $W^1$-11 |
| I-47 | $A^1$-1 | H | $W^1$-13 |
| I-48 | $A^1$-1 | H | $W^1$-14 |
| I-49 | $A^1$-1 | H | $W^1$-15 |
| I-50 | $A^1$-1 | H | $W^1$-16 |

TABLE 3

| Compound (I) | $A^1$ | $R^1$ | $W^1$ |
|---|---|---|---|
| I-51 | $A^1$-1 | H | $W^1$-18 |
| I-52 | $A^1$-1 | H | $W^1$-19 |
| I-53 | $A^1$-1 | H | $W^1$-20 |
| I-54 | $A^1$-1 | H | $W^1$-21 |
| I-55 | $A^1$-1 | H | $W^1$-23 |
| I-56 | $A^1$-1 | H | $W^1$-24 |
| I-57 | $A^1$-1 | H | $W^1$-25 |
| I-58 | $A^1$-1 | H | $W^1$-30 |
| I-59 | $A^1$-1 | H | $W^1$-31 |
| I-60 | $A^1$-1 | H | $W^1$-32 |
| I-61 | $A^1$-1 | H | $W^1$-33 |
| I-62 | $A^1$-1 | H | $W^1$-34 |
| I-63 | $A^1$-1 | H | $W^1$-35 |
| I-64 | $A^1$-1 | H | $W^1$-36 |
| I-65 | $A^1$-1 | H | $W^1$-37 |
| I-66 | $A^1$-1 | H | $W^1$-38 |
| I-67 | $A^1$-1 | H | $W^1$-39 |
| I-68 | $A^1$-1 | H | $W^1$-40 |
| I-69 | $A^1$-1 | H | $W^1$-41 |
| I-70 | $A^1$-1 | H | $W^1$-42 |

TABLE 4

| Compound (I) | $A^1$ | $R^1$ | $W^1$ |
|---|---|---|---|
| I-71 | $A^1$-2 | $CH_3$ | $W^1$-3 |
| I-72 | $A^1$-2 | $CH_3$ | $W^1$-4 |
| I-73 | $A^1$-2 | $CH_3$ | $W^1$-8 |
| I-74 | $A^1$-2 | $CH_3$ | $W^1$-9 |
| I-75 | $A^1$-2 | $CH_3$ | $W^1$-11 |
| I-76 | $A^1$-2 | $CH_3$ | $W^1$-13 |
| I-77 | $A^1$-2 | $CH_3$ | $W^1$-14 |
| I-78 | $A^1$-2 | $CH_3$ | $W^1$-15 |
| I-79 | $A^1$-2 | $CH_3$ | $W^1$-16 |
| I-80 | $A^1$-2 | $CH_3$ | $W^1$-18 |
| I-81 | $A^1$-2 | $CH_3$ | $W^1$-19 |
| I-82 | $A^1$-2 | $CH_3$ | $W^1$-20 |
| I-83 | $A^1$-2 | $CH_3$ | $W^1$-21 |
| I-84 | $A^1$-2 | $CH_3$ | $W^1$-23 |
| I-85 | $A^1$-2 | $CH_3$ | $W^1$-24 |
| I-86 | $A^1$-2 | $CH_3$ | $W^1$-25 |
| I-87 | $A^1$-2 | $CH_3$ | $W^1$-31 |
| I-88 | $A^1$-2 | $CH_3$ | $W^1$-34 |
| I-89 | $A^1$-2 | $CH_3$ | $W^1$-41 |
| I-90 | $A^1$-2 | $CH_3$ | $W^1$-43 |

TABLE 5

| Compound (I) | $A^1$ | $R^1$ | $W^1$ |
|---|---|---|---|
| I-91 | $A^1$-5 | $CH_3$ | $W^1$-3 |
| I-92 | $A^1$-5 | $CH_3$ | $W^1$-4 |
| I-93 | $A^1$-5 | $CH_3$ | $W^1$-8 |
| I-94 | $A^1$-5 | $CH_3$ | $W^1$-9 |
| I-95 | $A^1$-5 | $CH_3$ | $W^1$-11 |
| I-96 | $A^1$-5 | $CH_3$ | $W^1$-13 |
| I-97 | $A^1$-5 | $CH_3$ | $W^1$-14 |
| I-98 | $A^1$-5 | $CH_3$ | $W^1$-15 |
| I-99 | $A^1$-5 | $CH_3$ | $W^1$-16 |
| I-100 | $A^1$-5 | $CH_3$ | $W^1$-18 |
| I-101 | $A^1$-5 | $CH_3$ | $W^1$-19 |
| I-102 | $A^1$-5 | $CH_3$ | $W^1$-20 |
| I-103 | $A^1$-5 | $CH_3$ | $W^1$-21 |
| I-104 | $A^1$-5 | $CH_3$ | $W^1$-23 |
| I-105 | $A^1$-5 | $CH_3$ | $W^1$-24 |
| I-106 | $A^1$-5 | $CH_3$ | $W^1$-25 |
| I-107 | $A^1$-5 | $CH_3$ | $W^1$-31 |
| I-108 | $A^1$-5 | $CH_3$ | $W^1$-34 |
| I-109 | $A^1$-5 | $CH_3$ | $W^1$-41 |
| I-110 | $A^1$-3 | $CH_3$ | $W^1$-4 |

TABLE 6

| Compound (I) | $A^1$ | $R^1$ | $W^1$ |
|---|---|---|---|
| I-111 | $A^1$-3 | $CH_3$ | $W^1$-11 |
| I-112 | $A^1$-3 | $CH_3$ | $W^1$-13 |
| I-113 | $A^1$-3 | $CH_3$ | $W^1$-19 |
| I-114 | $A^1$-3 | $CH_3$ | $W^1$-20 |
| I-115 | $A^1$-3 | $CH_3$ | $W^1$-21 |
| I-116 | $A^1$-3 | $CH_3$ | $W^1$-23 |
| I-117 | $A^1$-3 | $CH_3$ | $W^1$-31 |
| I-118 | $A^1$-3 | $CH_3$ | $W^1$-34 |
| I-119 | $A^1$-3 | $CH_3$ | $W^1$-40 |
| I-120 | $A^1$-3 | $CH_3$ | $W^1$-41 |
| I-121 | $A^1$-4 | $CH_3$ | $W^1$-13 |
| I-122 | $A^1$-4 | $CH_3$ | $W^1$-15 |
| I-123 | $A^1$-4 | $CH_3$ | $W^1$-31 |
| I-124 | $A^1$-6 | $CH_3$ | $W^1$-13 |
| I-125 | $A^1$-6 | $CH_3$ | $W^1$-15 |
| I-126 | $A^1$-6 | $CH_3$ | $W^1$-16 |
| I-127 | $A^1$-6 | $CH_3$ | $W^1$-31 |
| I-128 | $A^1$-7 | $CH_3$ | $W^1$-13 |
| I-129 | $A^1$-7 | $CH_3$ | $W^1$-15 |
| I-130 | $A^1$-7 | $CH_3$ | $W^1$-164 |

TABLE 7

| Compound (I) | $A^1$ | $R^1$ | $W^1$ |
|---|---|---|---|
| I-131 | $A^1$-7 | $CH_3$ | $W^1$-31 |
| I-132 | $A^1$-8 | $CH_3$ | $W^1$-13 |
| I-133 | $A^1$-8 | $CH_3$ | $W^1$-13 |
| I-134 | $A^1$-8 | $CH_3$ | $W^1$-31 |
| I-135 | $A^1$-9 | $CH_3$ | $W^1$-13 |
| I-136 | $A^1$-9 | $CH_3$ | $W^1$-31 |
| I-137 | $A^1$-10 | $CH_3$ | $W^1$-13 |
| I-138 | $A^1$-10 | $CH_3$ | $W^1$-31 |

MONOMER (I) wherein $A^1$ is a single bond can be produced, for example, by reacting a compound represented by the formula (III):

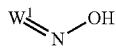

(III)

wherein $W^1$ is the same as defined above, with a compound represented by the formula (IV):

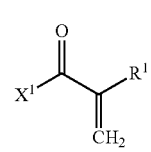

(IV)

wherein $R^1$ is the same as defined above and $X^1$ represents a halogen atom. Examples of the halogen atom include a chlorine atom and a bromine atom. The reaction is usually conducted by mixing the compound represented by the formula (III) with the compound represented by the formula (IV) in an inert solvent in the presence of a base. The amount of the compound represented by the formula (IV) is usually 0.9 to 2 moles and preferably 1 to 1.5 moles relative to 1 mole of the compound represented by the formula (III). The reaction temperature is usually 0 to 150° C. and preferably 0 to 60° C.

Examples of the inert solvent include toluene, tetrahydrofuran, N,N-dimethylformamide, dimethylsulfoxide, acetonitrile, chloroform and dichloromethane. Examples of the base include inorganic bases such as sodium hydroxide, potassium hydroxide and potassium carbonate, and organic bases such as pyridine, triethylamine and lutidine. The amount of the base is usually 1 to 3 moles and preferably 1 to 2 moles relative to 1 mole of the compound represented by the formula (III). MONOMER (I) wherein $A^1$ is a single bond obtained can be purified by recrystallization or column chromatography.

MONOMER (I) wherein $A^1$ is a single bond can be also produced by reacting the compound represented by the formula (III) with a compound represented by the formula (V):

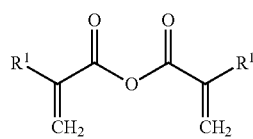

(V)

wherein $R^1$ is the same as defined above.

MONOMER (I) wherein $A^1$ is *-O—CO—$R^2$— can be produced, for example, by reacting the compound represented by the formula (III) with a compound represented by the formula (VI):

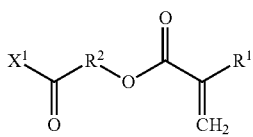

(VI)

wherein $R^1$ and $R^2$ are the same as defined above and $X^1$ represents a halogen atom. Examples of the halogen atom include a chlorine atom and a bromine atom. The reaction is usually conducted by mixing the compound represented by the formula (III) with the compound represented by the formula (VI) in an inert solvent in the presence of a base. The amount of the compound represented by the formula (VI) is usually 0.9 to 2 moles and preferably 1 to 1.5 moles relative to 1 mole of the compound represented by the formula (III). The reaction temperature is usually 0 to 150° C. and preferably 0 to 60° C.

Examples of the inert solvent include toluene, tetrahydrofuran, N,N-dimethylformamide, dimethylsulfoxide, acetonitrile, chloroform and dichloromethane. Examples of the base include inorganic bases such as sodium hydroxide, potassium hydroxide and potassium carbonate, and organic bases such as pyridine, triethylamine and lutidine. The amount of the base is usually 1 to 3 moles and preferably 1 to 2 moles relative to 1 mole of the compound represented by the formula (III). MONOMER (I) wherein $A^1$ is *-O—CO—$R^2$— obtained can be purified by recrystallization or column chromatography.

MONOMER (I) wherein $A^1$ is *-O—CO—$R^2$— can be also produced by reacting the compound represented by the formula (III) with a compound represented by the formula (VII):

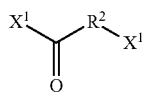
(VII)

wherein $R^1$, $R^2$ and $X^1$ are the same as defined above in the presence of a base, to obtain a compound represented by the formula (VIII):

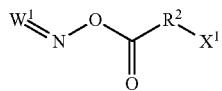
(VIII)

wherein $W^1$, $R^2$ and $X^1$ are the same as defined above, followed by reacting the compound represented by the formula (VIII) with acrylic acid or methacrylic acid in the presence of a base.

The content of MONOMER (I) in the photoresist composition of the present invention is usually 0.1 to 5% by weight based on 100% by weight of the solid component. In this specification, "solid component" means components other than solvent in the photoresist composition.

POLYMER (I) consists of a structural unit derived from MONOMER (I). The structural unit derived from MONOMER (I) is represented by the following:

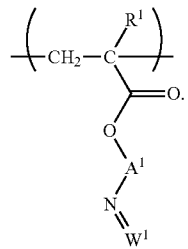

POLYMER (I) can have two or more kinds of the structural unit derived from MONOMER (I).

POLYMER (I) can be produced by polymerizing MONOMER (I) in the presence of an initiator in an inert solvent such as 1,4-dioxane, tetrahydrofuran, acetonitrile and dichloroethane. Examples of the initiator include azobisisobutyronitrile, azobis(2,4-dimethylvaleronitrile) and benzoyl peroxide. The polymerization temperature is usually room temperature to 100° C., and preferably 60 to 80° C. POLYMER (I) can be isolated by charging the reaction mixture obtained into water, a polar solvent such as methanol or a nonpolar solvent such as hexane and heptane to cause a precipitation followed by collecting the precipitation by filtration.

The content of POLYMER (I) in the photoresist composition of the present invention is usually 0.1 to 5% by weight based on 100% by weight of the solid component. In this specification, "solid component" means components other than solvent in the photoresist composition.

POLYMER (II) consists of a structural unit derived from MONOMER (I) and a structural unit derived from MONOMER (II).

The structural unit derived from MONOMER (I) is represented by the following:

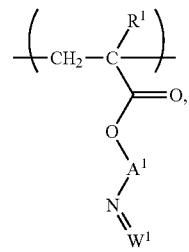

and the structural unit derived from MONOMER (II) is represented by the following:

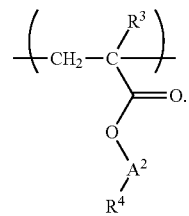

POLYMER (II) can have two or more kinds of the structural unit derived from MONOMER (I). POLYMER (II) can have two or more kinds of the structural unit derived from MONOMER (II).

MONOMER (I) is represented by the formula (II):

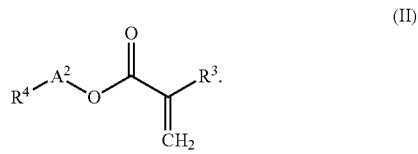
(II)

In the formula (II), $R^3$ represents a hydrogen atom or a methyl group, $A^2$ represents a single bond or *-O—CO—$(CH_2)_n$— wherein * represents a binding position to $R^4$—, n represents an integer of 1 to 7 and $R^4$ represents a C3-C20 saturated cyclic hydrocarbon group in which one or more —$CH_2$— can be replaced by —O— or —CO—.

Examples of MONOMER (II) include a monomer having an acid-labile group (hereinafter, simply referred to as Monomer (a1)), a monomer having one or more hydroxyl group and no acid-labile group (hereinafter, simply referred to as Monomer (a2)) and a monomer having a lactone ring and no acid-labile group (hereinafter, simply referred to as Monomer (a3)).

In this specification, "an acid-labile group" means a group capable of being eliminated by the action of an acid.

POLYMER (II) can be produced by polymerizing MONOMER (I) with MONOMER (II) in the presence of an initiator in an inert solvent such as 1,4-dioxane, tetrahydrofuran, acetonitrile and dichloroethane. Examples of the initiator include azobisisobutyronitrile, azobis(2,4-dimethylvaleronitrile) and benzoyl peroxide. The polymerization temperature is usually room temperature to 100° C., and preferably 60 to 80° C. POLYMER (II) can be isolated by charging the reaction mixture obtained into water, a polar solvent such as methanol or a nonpolar solvent such as hexane and heptane to cause a precipitation followed by collecting the precipitation by filtration.

The content of the structural unit derived from MONOMER (I) is usually 1 to 99% by mole based on 100% by mole of the all structural units of POLYMER (II), and preferably 1 to 50% by mole and more preferably 1 to 30% by mole and especially preferably 1 to 10% by mole. The content of the structural unit derived from MONOMER (II) is usually 99 to 1% by mole based on 100% by mole of the all structural units of POLYMER (II), and preferably 50 to 99% by mole, and more preferably 70 to 99% by mole and especially preferably 90 to 99% by mole.

POLYMER (I) usually has 2,500 or more of the weight-average molecular weight, and preferably 5,000 or more of the weight-average molecular weight. POLYMER (I) usually has 30,000 or less of the weight-average molecular weight, and preferably has 20,000 or less of the weight-average molecular weight. The weight-average molecular weight can be measured with gel permeation chromatography.

The content of POLYMER (II) in the photoresist composition of the present invention is usually 0.1 to 5% by weight based on 100% by weight of the solid component.

POLYMER (II) is preferably a polymer being insoluble or poorly soluble in an alkali aqueous solution but becoming soluble in an alkali aqueous solution by the action of an acid. POLYMER (II) preferably has one or more structural unit derived from Monomer (a1).

Examples of the acid-labile group include a group represented by the formula (I):

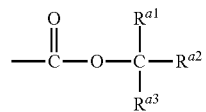

(1)

wherein $R^{a1}$, $R^{a2}$ and $R^{a3}$ independently each represent an aliphatic hydrocarbon group or a saturated cyclic hydrocarbon group, and $R^{a1}$ and $R^{a2}$ can be bonded each other to form a ring together with a carbon atom to which $R^{a1}$ and $R^{a2}$ are bonded.

Examples of the aliphatic hydrocarbon group include a C1-C8 alkyl group. Specific examples of the C1-C8 alkyl group include a methyl group, an ethyl group, a propyl group, an isopropyl group, a butyl group, a pentyl group, a hexyl group, a heptyl group and an octyl group. The saturated cyclic hydrocarbon group may be monocyclic or polycyclic, and preferably has 3 to 20 carbon atoms.

Examples of the saturated cyclic hydrocarbon group include a monocyclic alicyclic hydrocarbon group such as a C3-C20 cycloalkyl group (e.g. a cyclopentyl group, a cyclohexyl group, a methylcyclohexyl group, a dimethylcyclohexyl group, a cycloheptyl group and a cyclooctyl group) and a polycyclic alicyclic hydrocarbon group such as a decahydronaphthyl group, an adamantyl group, a norbornyl group, a methylnorbornyl group, and the followings:

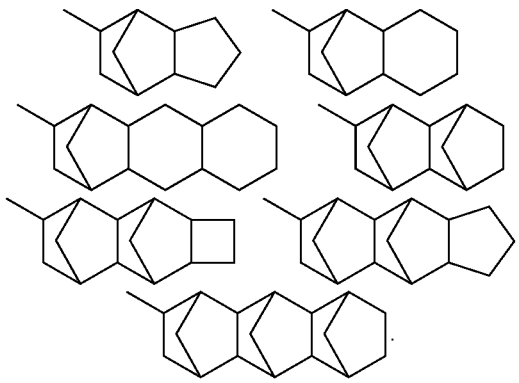

Examples of the ring formed by bonding $R^{a1}$ and $R^{a2}$ each other include the following groups and the ring preferably has 5 to 20 carbon atoms.

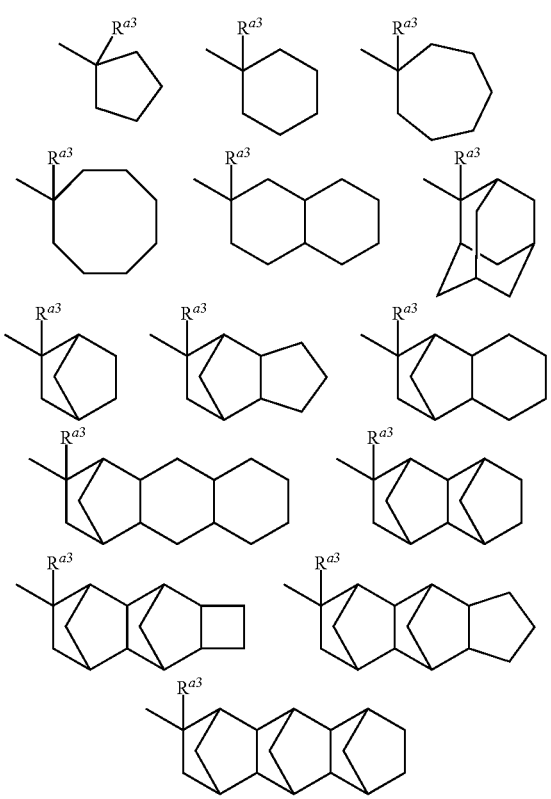

wherein $R^{a3}$ is the same as defined above.

The group represented by the formula (I) wherein $R^{a1}$, $R^{a2}$ and $R^{a3}$ independently each represent a C1-C8 alkyl group such as a tert-butyl group, the group represented by the formula (I) wherein $R^{a1}$ and $R^{a2}$ are bonded each other to form an adamantyl ring and $R^{a3}$ is a C1-C8 alkyl group such as a 2-alkyl-2-adamantyl group, and the group represented by the formula (I) wherein $R^{a1}$ and $R^{a2}$ are C1-C8 alkyl groups and $R^{a3}$ is an adamantyl group such as a 1-(1-adamantyl)-1-alkylalkoxycarbonyl group are preferable.

Monomer (a1) is preferably an acrylate monomer having an acid-labile group in its side chain or a methacrylate monomer having an acid-labile group in its side chain. In this specification, "(meth)acrylate monomer" means a monomer having a structure represented by $CH_2=CH-CO-$ or $CH_2=C(CH_3)-CO-$, and "acrylate monomer" means a monomer having a structure represented by $CH_2=CH-CO-$, and "methacrylate monomer" means a monomer having a structure represented by $CH_2=C(CH_3)-CO-$.

Preferable examples of Monomer (a1) include (meth)acrylate monomers having C5-C20 saturated cyclic hydrocarbon group. As (meth)acrylate monomers having C5-C20 saturated cyclic hydrocarbon group, preferred are monomers represented by the formulae (a1-1) and (a1-2):

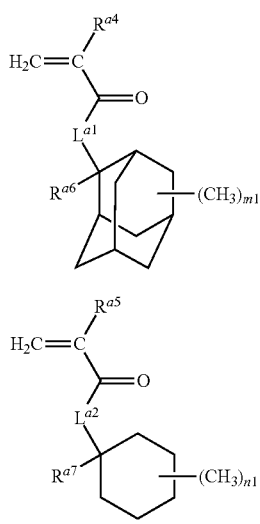

wherein $R^{a4}$ and $R^{a5}$ independently represent a hydrogen atom or a methyl group, $R^{a6}$ and $R^{a7}$ independently represents a C1-C8 aliphatic hydrocarbon group or a C3-C10 saturated cyclic hydrocarbon group, $L^{a1}$ and $L^{a2}$ independently represents *-O— or *-O—$(CH_2)_{k1}$—CO—O— in which * represents a binding position to —CO—, and k1 represents an integer of 1 to 7, m1 represents an integer of 0 to 14 and n1 represents an integer of 0 to 10.

The aliphatic hydrocarbon group preferably has 1 to 6 carbon atoms, and the saturated cyclic hydrocarbon group preferably has 3 to 8 carbon atoms and more preferably 3 to 6 carbon atoms.

Examples of the aliphatic hydrocarbon group include a C1-C8 alkyl group such as a methyl group, an ethyl group, a propyl group, an isopropyl group, a butyl group, a tert-butyl group, a 2,2-dimethylethyl group, a 1-methylpropyl group, a 2,2-dimethylpropyl group, a 1-ethylpropyl group, a 1-methylbutyl group, a 2-methylbutyl group, a 3-methylbutyl group, a 1-propylbutyl group, a pentyl group, a 1-methylpentyl group, a hexyl group, a 1,4-dimethylhexyl group, a heptyl group, a 1-methylheptyl group and an octyl group. Examples of the saturated cyclic hydrocarbon group include a cyclohexyl group, a methylcyclohexyl group, a dimethylcyclohexyl group, a cycloheptyl group, a methylcycloheptyl group, a norbornyl group and a methylnorbornyl group.

$L^{a1}$ is preferably *-O— or *-O—$(CH_2)_{f1}$—CO—O— in which * represents a binding position to —CO—, and f1 represents an integer of 1 to 4, and is more preferably *-O— or *-O—$CH_2$—CO—O—, and is especially preferably *-O—. $L^{a2}$ is preferably *-O— or *-O—$(CH_2)_{f1}$—CO—O— in which * represents a binding position to —CO—, and f1 is the same as defined above, and is more preferably *-O— or *-O—$CH_2$—CO—O—, and is especially preferably *-O—.

In the formula (a1-1), m1 is preferably an integer of 0 to 3, and is more preferably 0 or 1. In the formula (a1-2), n1 is preferably an integer of 0 to 3, and is more preferably 0 or 1.

Particularly when the photoresist composition contains a resin derived from a monomer having a bulky structure such as a saturated cyclic hydrocarbon group, the photoresist composition having excellent resolution tends to be obtained.

Examples of the monomer represented by the formula (a1-1) include the followings.

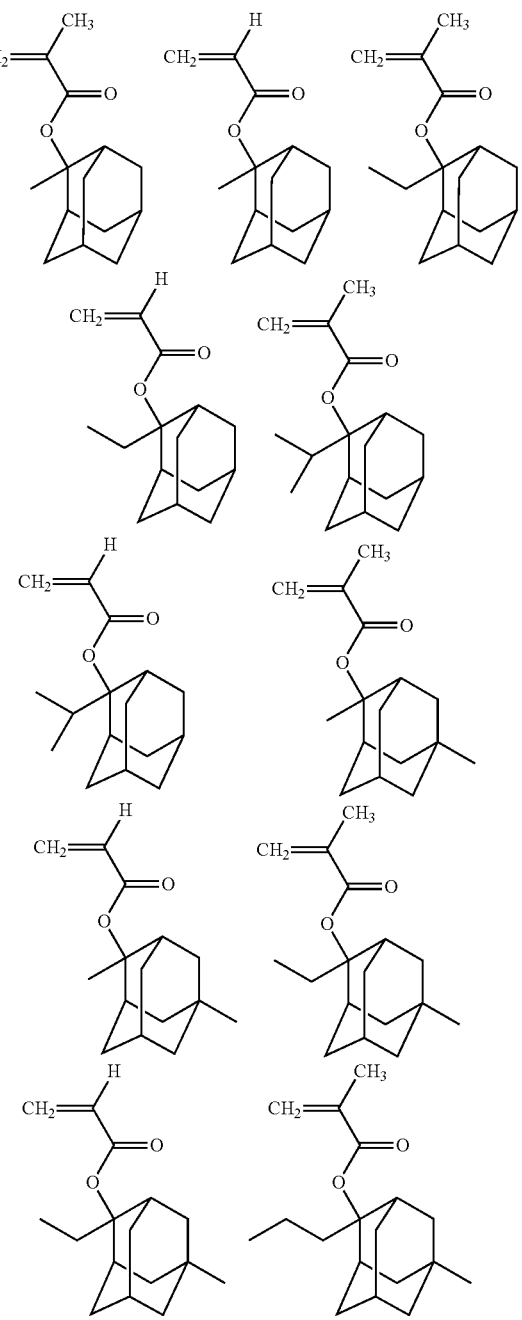

-continued
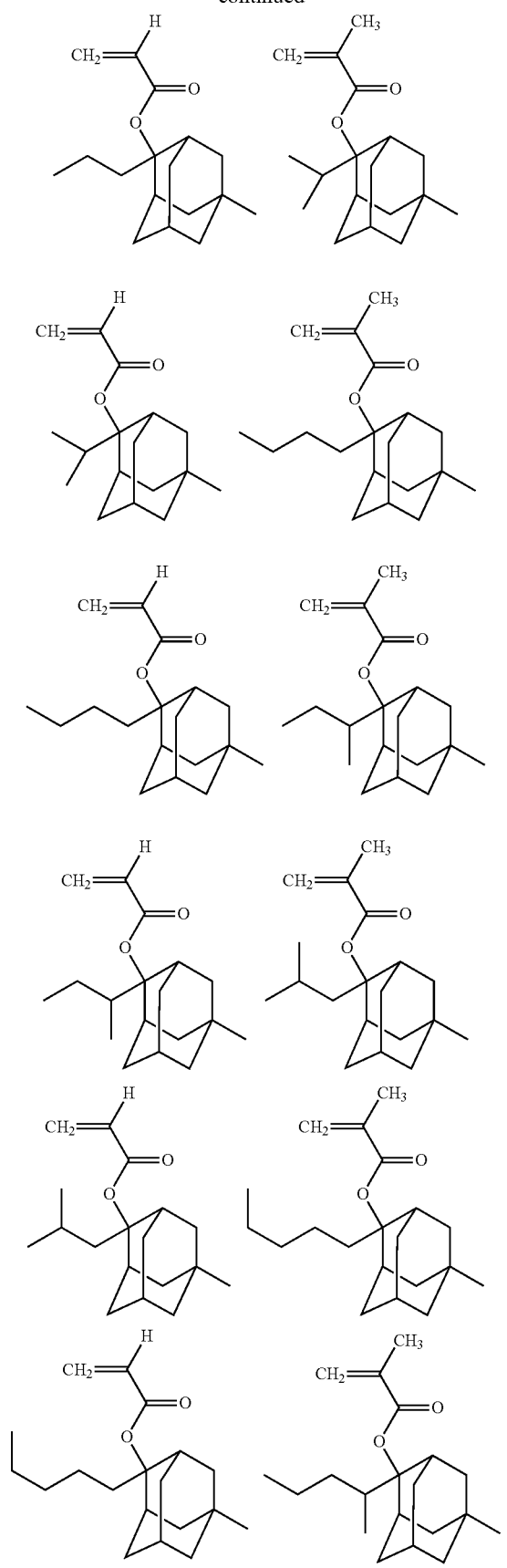
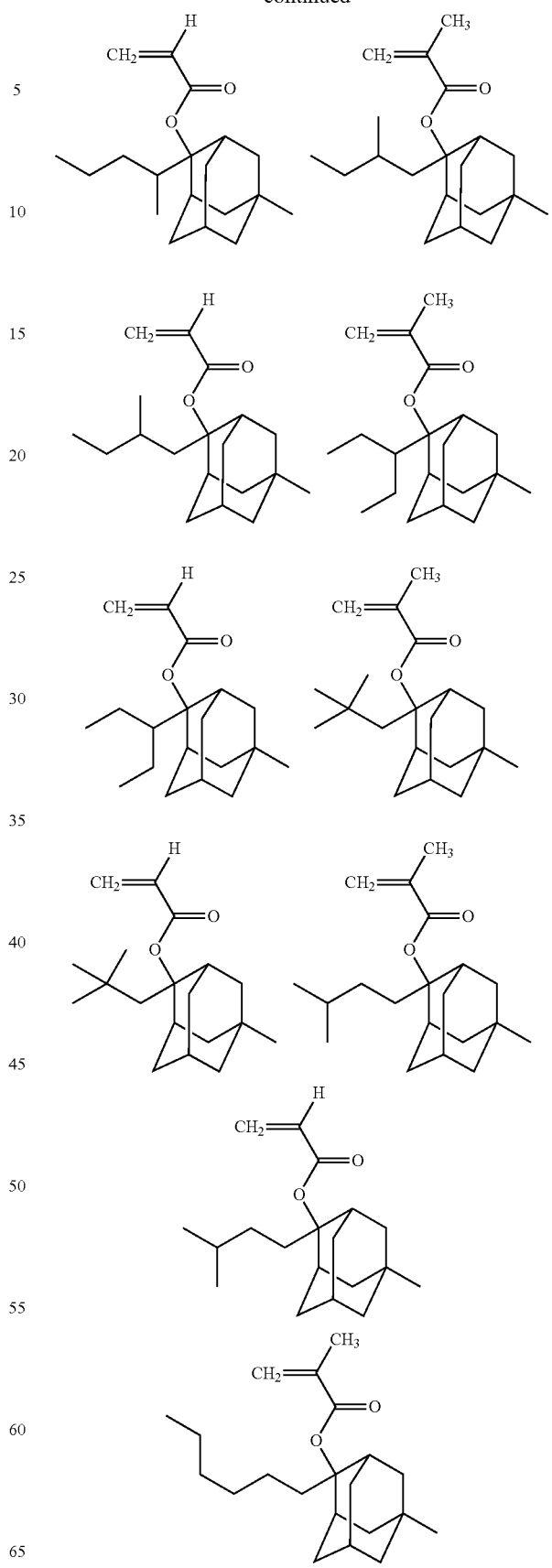

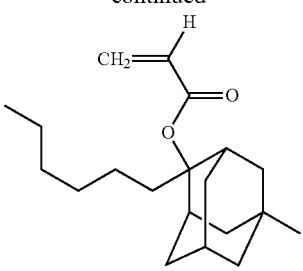
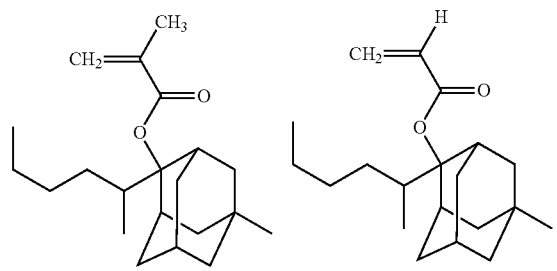
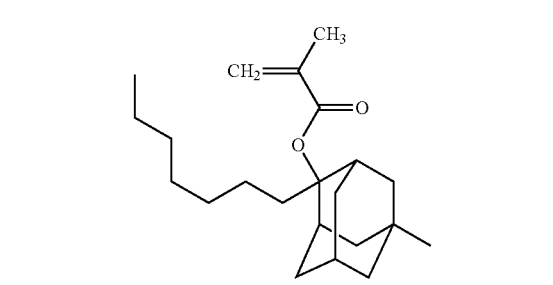
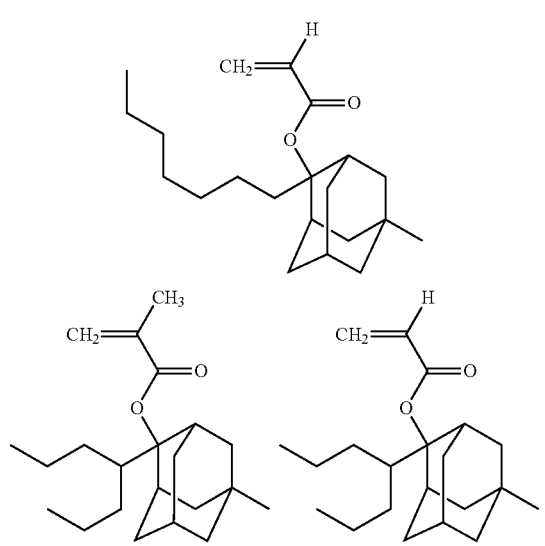
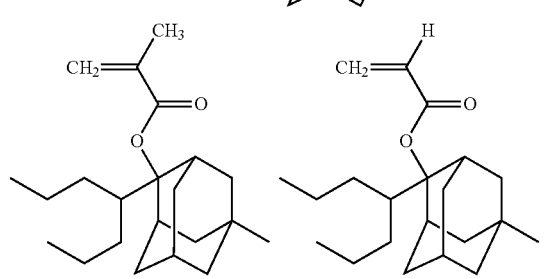
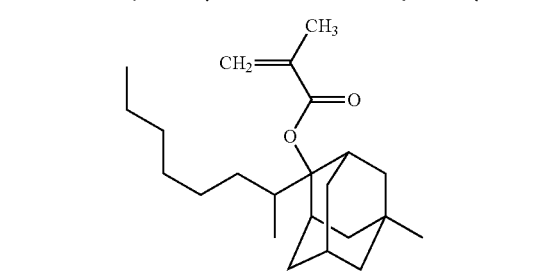
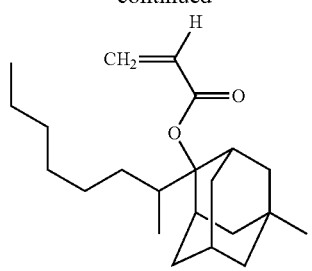
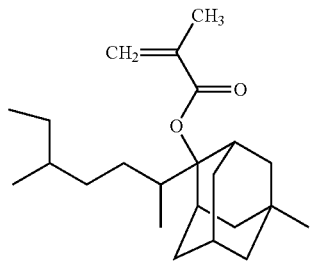
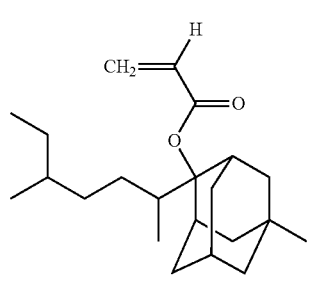
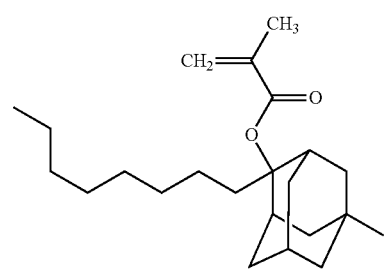
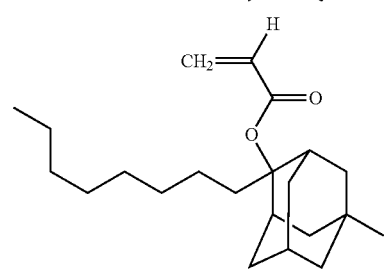
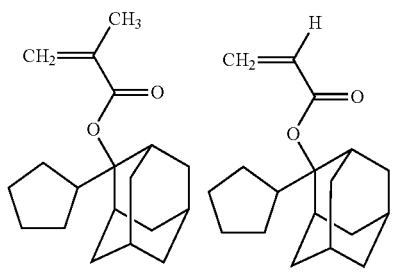

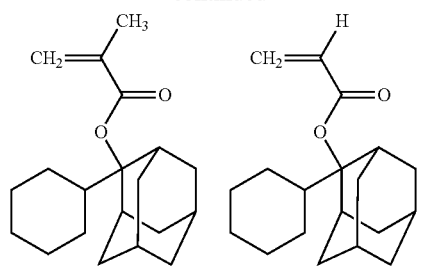
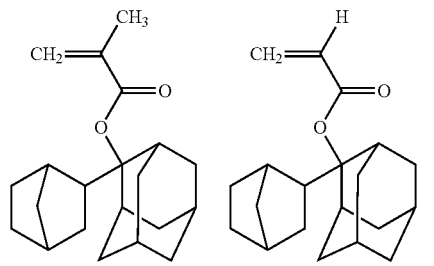
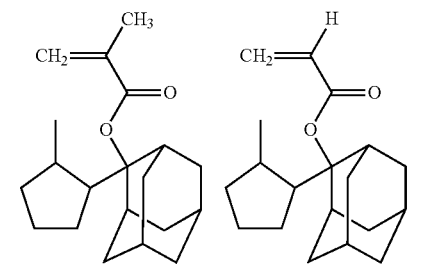
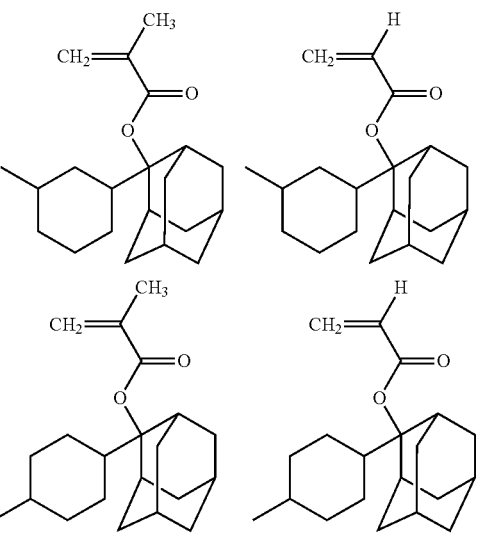
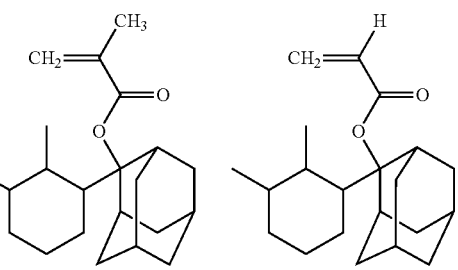
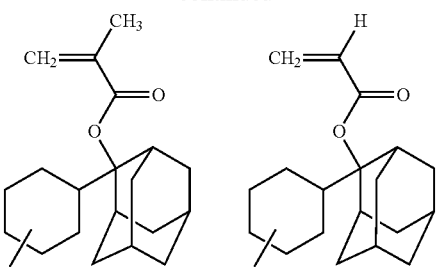
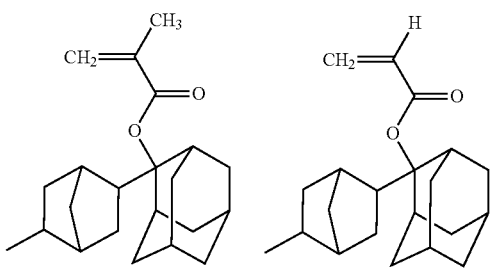
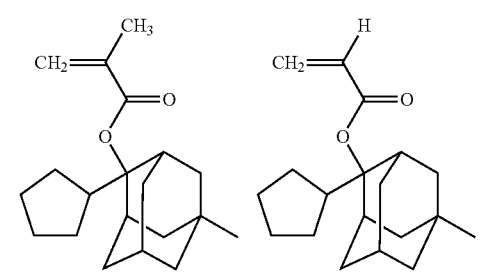
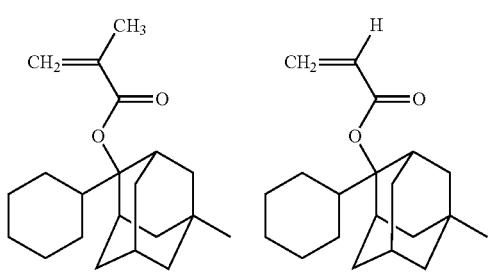
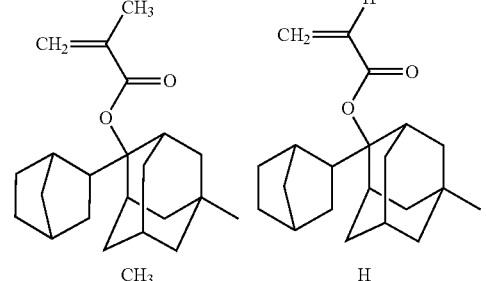
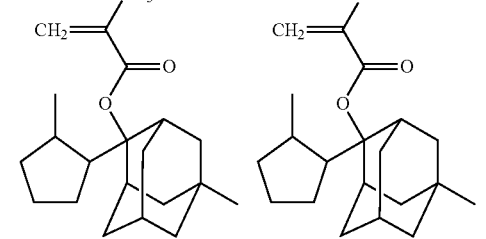

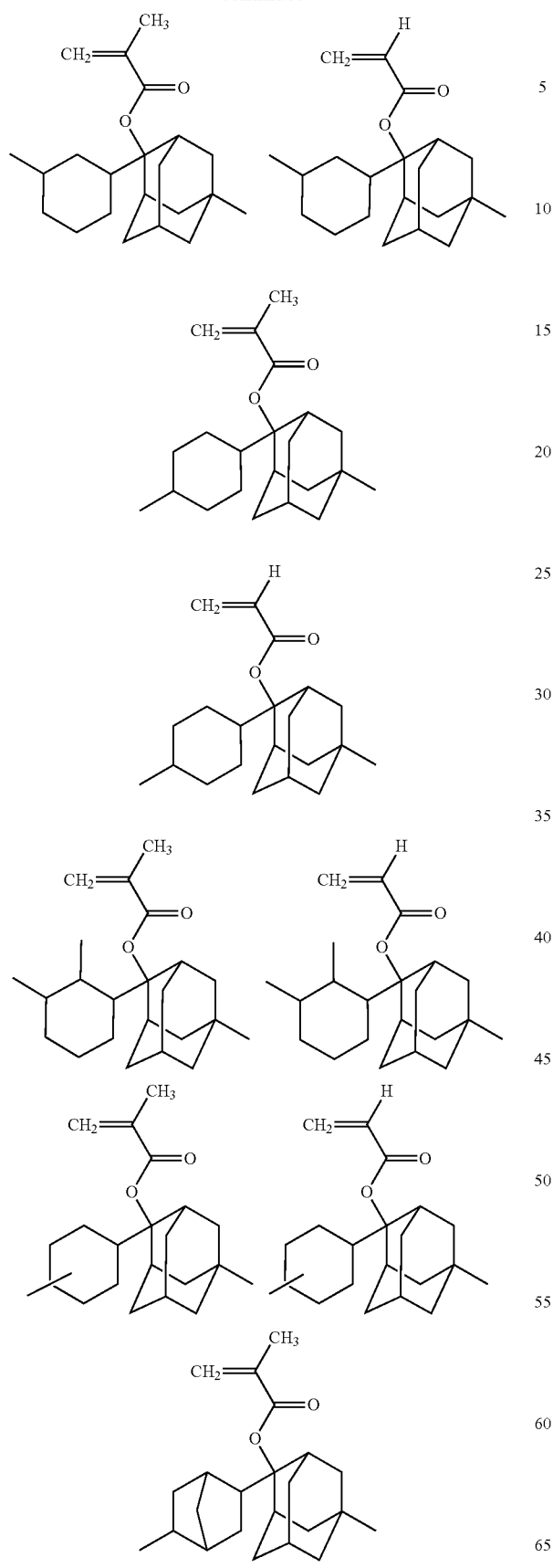
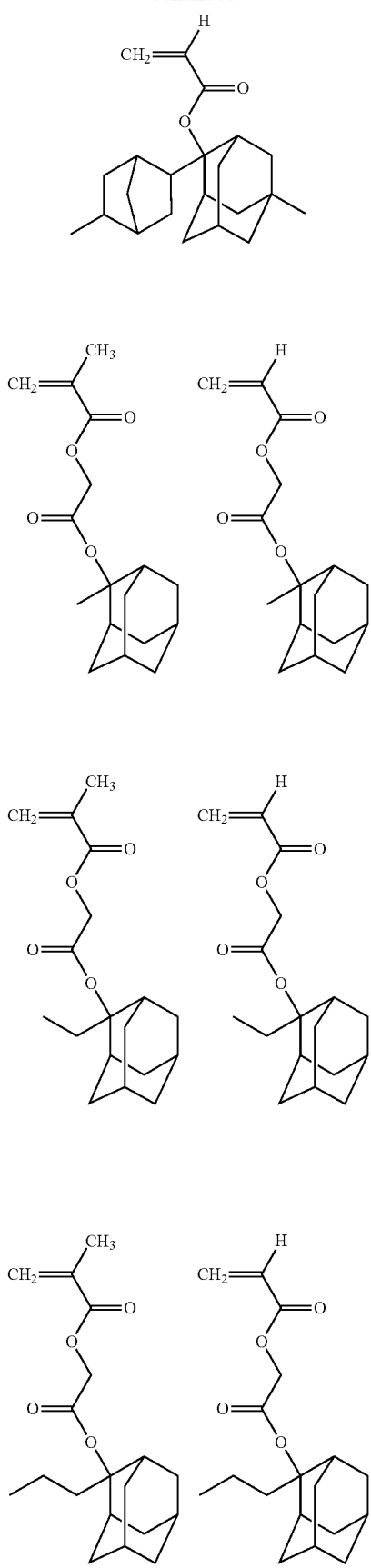

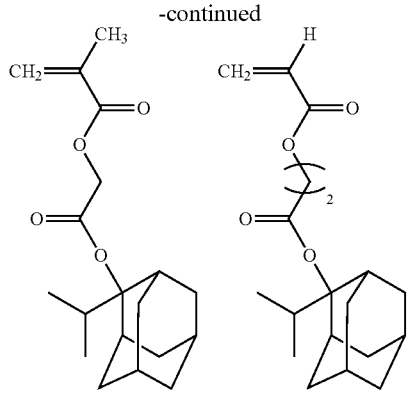
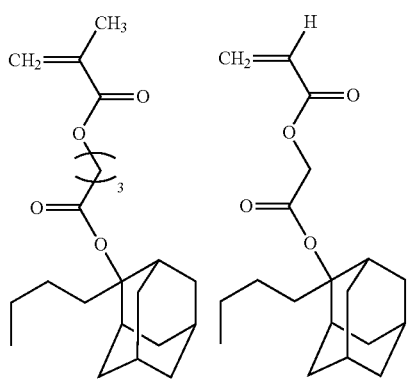
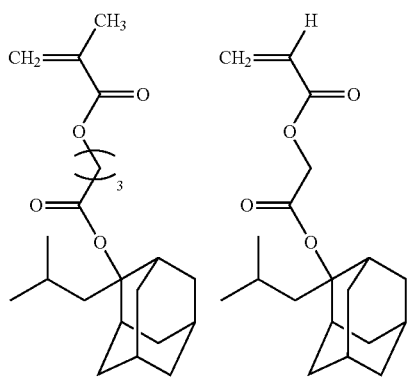
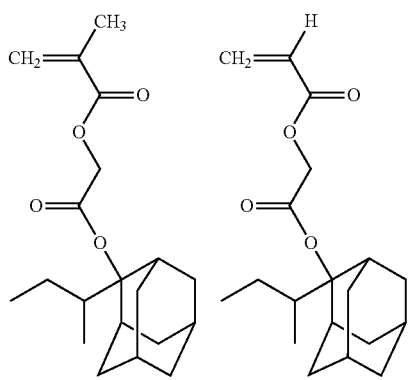
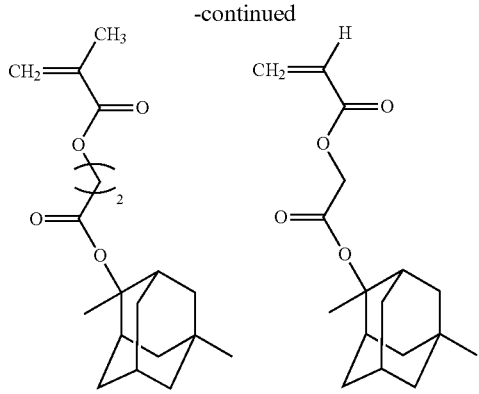
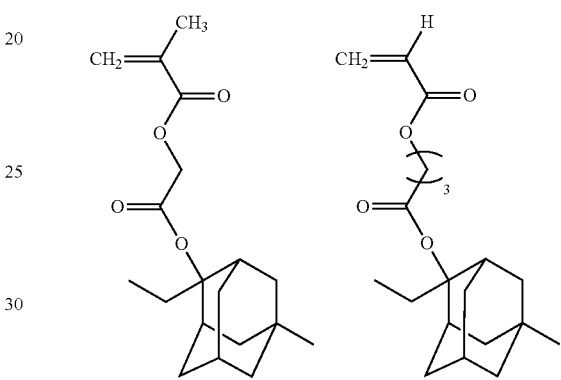
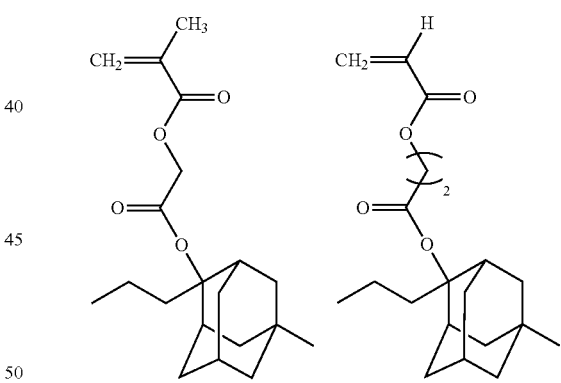
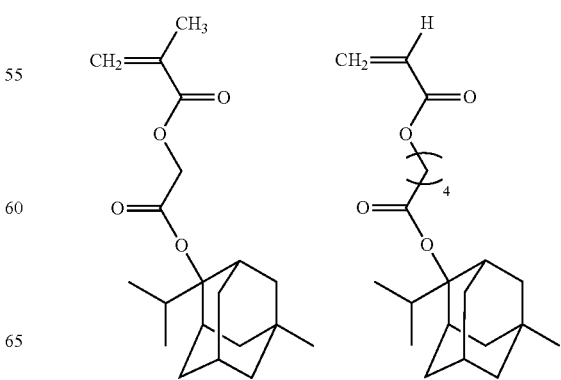

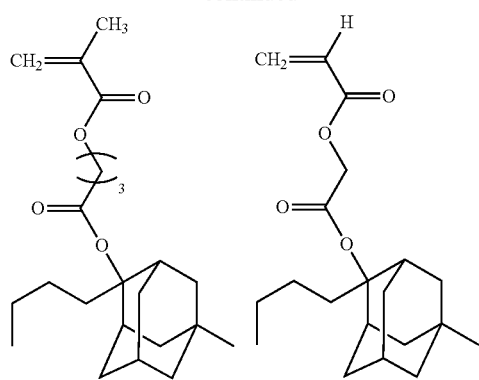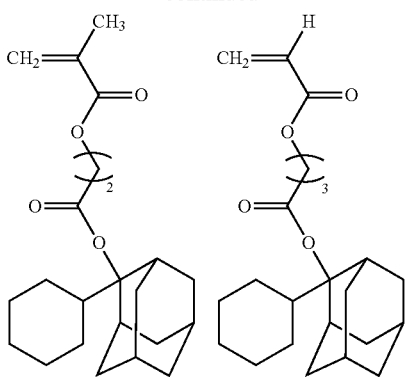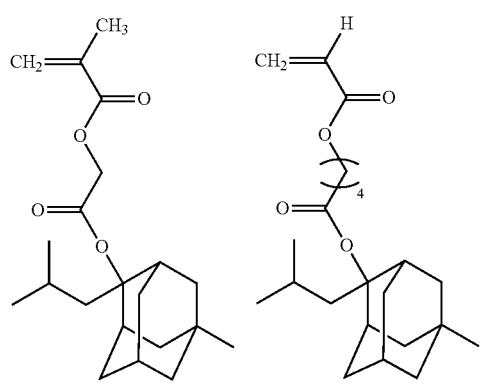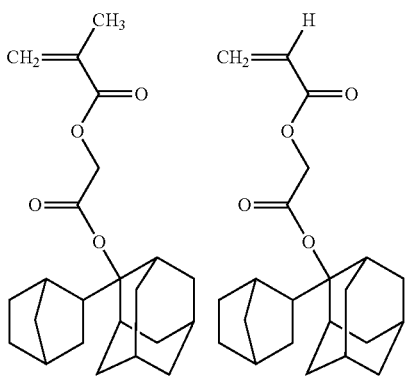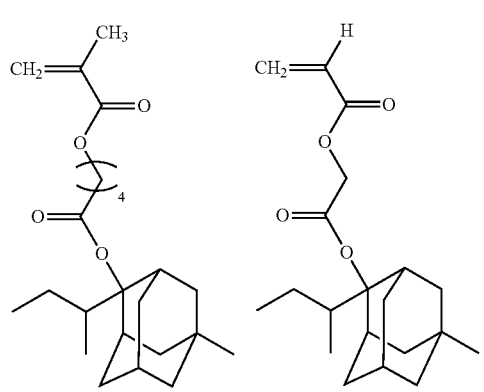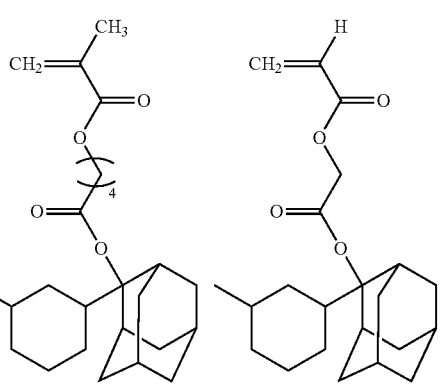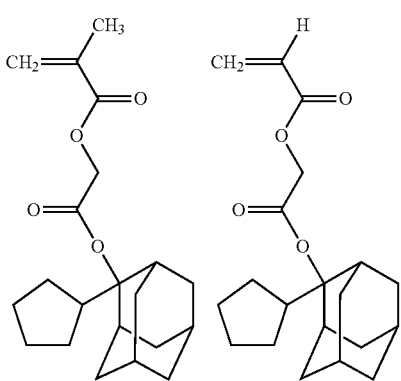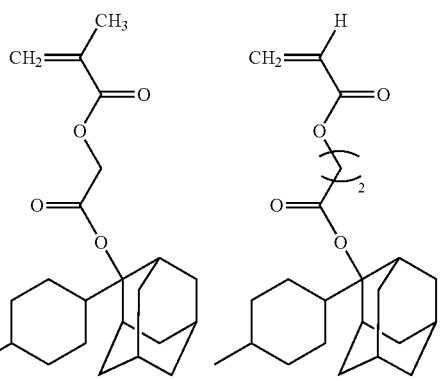

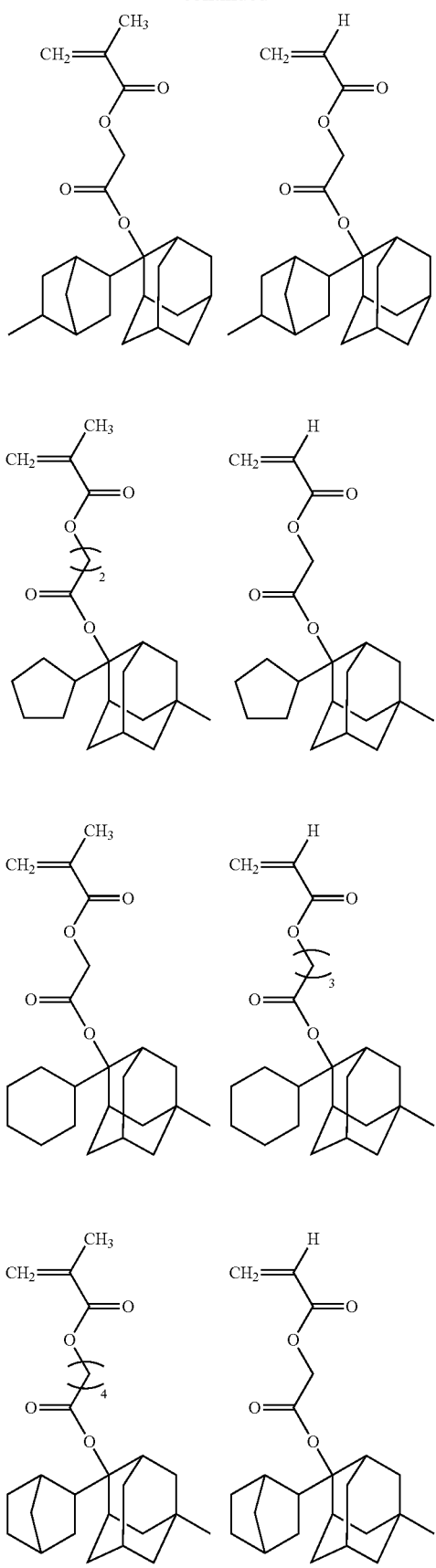
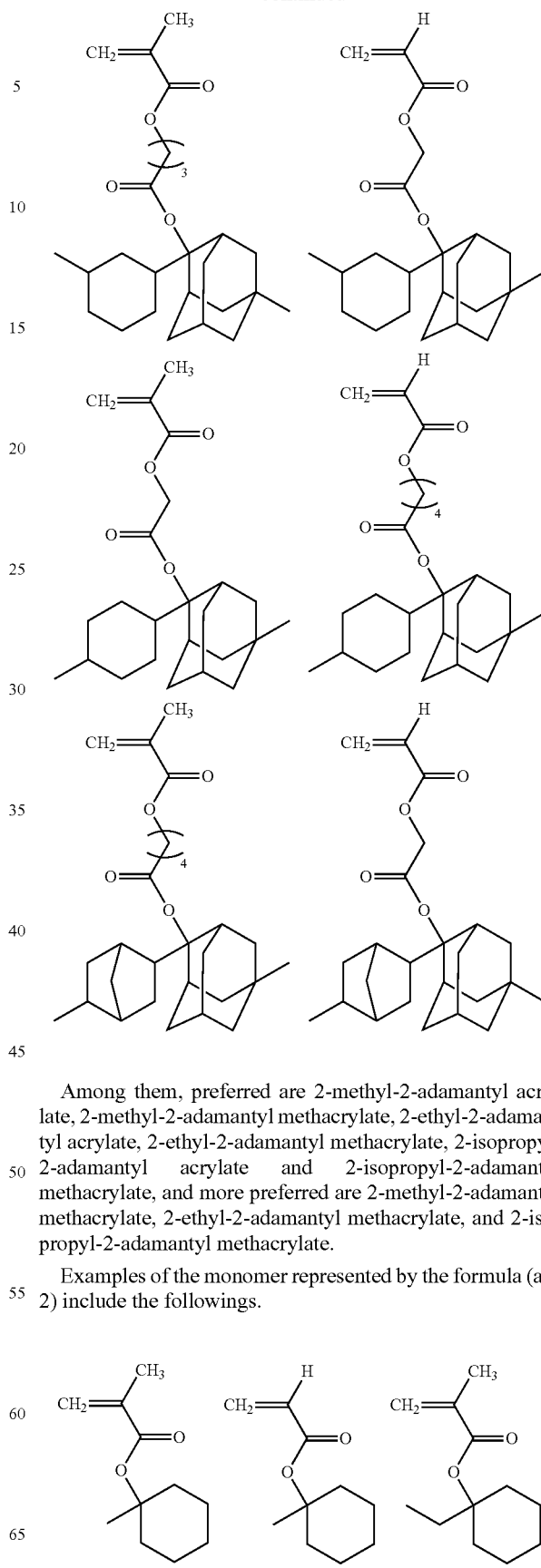

Among them, preferred are 2-methyl-2-adamantyl acrylate, 2-methyl-2-adamantyl methacrylate, 2-ethyl-2-adamantyl acrylate, 2-ethyl-2-adamantyl methacrylate, 2-isopropyl-2-adamantyl acrylate and 2-isopropyl-2-adamantyl methacrylate, and more preferred are 2-methyl-2-adamantyl methacrylate, 2-ethyl-2-adamantyl methacrylate, and 2-isopropyl-2-adamantyl methacrylate.

Examples of the monomer represented by the formula (a1-2) include the followings.

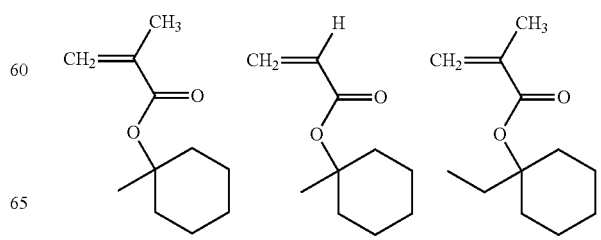

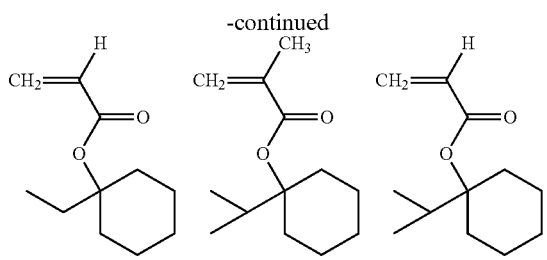

Among them, preferred are 1-ethyl-1-cyclohexyl acrylate and 1-ethyl-1-cyclohexyl methacrylate, and more preferred is 1-ethyl-1-cyclohexyl methacrylate.

The content of the structural unit derived from Monomer (a1) in POLYMER (II) is usually 10 to 95% by mole, preferably 15 to 90% by mole and more preferably 20 to 85% by mole based on 100% by mole of all the structural units of POLYMER (II).

POLYMER (II) preferably contains the structural unit derived from Monomer (a1) and a structural unit derived from the monomer having no acid-labile group. POLYMER (II) can have two or more kinds of structural units derived from the monomers having no acid-labile group. When POLYMER (II) contains the structural unit derived from Monomer (a1) and the structural unit derived from the monomer having no acid-labile group, the content of the structural unit derived from Monomer (a1) is usually 10 to 95% by mole and preferably 15 to 90% by mole and more preferably 20 to 85% by mole based on total molar of all the structural units of POLYMER (II). The content of the structural unit derived from a monomer having an adamantyl group, especially the monomer represented by the formula (a1-1) in the structural unit derived from Monomer (a1), is preferably 15% by mole or more from the viewpoint of dry-etching resistance of the photoresist composition.

The monomer having no acid-labile group preferably contains one or more hydroxyl groups or a lactone ring. Examples thereof include Monomer (a2) and Monomer (a3). When POLYMER (II) contains the structural unit derived from the monomer having no acid-labile group and having one or more hydroxyl groups or a lactone ring, a photoresist composition having good resolution and adhesiveness of photoresist to a substrate tends to be obtained.

Examples of Monomer (a2) include a monomer represented by the formula (a2-1):

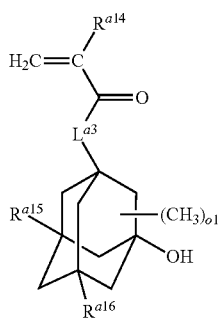

(a2-1)

wherein $R^{a14}$ represents a hydrogen atom or a methyl group, $R^{a15}$ and $R^{a16}$ each independently represent a hydrogen atom, a methyl group or a hydroxyl group, $L^{a3}$ represents *-O— or *-O—$(CH_2)_{k2}$—CO—O— in which * represents a binding position to —CO—, and k2 represents an integer of 1 to 7, and of represents an integer of 0 to 10.

When ArF excimer laser (wavelength: 193 nm) is used as an exposure system, the resin containing the structural unit derived from the monomer represented by the formula (a2-1) is preferable.

In the formula (a2-1), $R^{a14}$ preferably a methyl group, $R^{a15}$ is preferably a hydrogen atom, $R^{a16}$ is preferably a hydrogen atom or a hydroxyl group, $L^{a3}$ is preferably *-O— or *-O—$(CH_2)_{f2}$—CO—O— in which * represents a binding position to —CO—, and f2 represents an integer of 1 to 4, and is more preferably *-O—, and of is preferably 0, 1, 2 or 3 and is more preferably 0 or 1.

Examples of the monomer represented by the formula (a2-1) include the followings, and 3-hydroxy-1-adamantyl acrylate, 3-hydroxy-1-adamantyl methacrylate, 3,5-dihydroxy-1-adamantyl acrylate, 3,5-dihydroxy-1-adamantyl methacrylate, 1-(3,5-dihydroxy-1-adamantyloxycarbonyl)methyl acrylate and 1-(3,5-dihydroxy-1-adamantyloxycarbonyl)methyl methacrylate are preferable, and 3-hydroxy-1-adamantyl methacrylate and 3,5-dihydroxy-1-adaantyl methacrylate are more preferable.

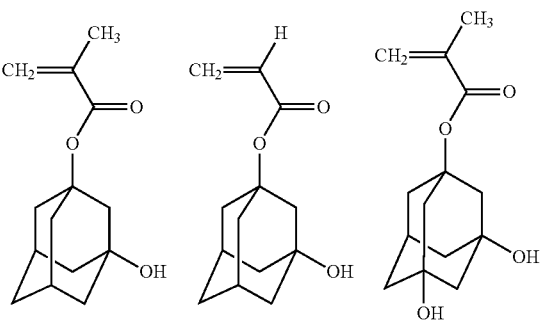

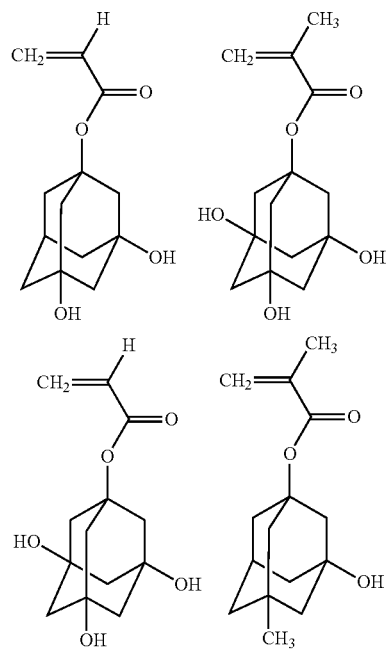

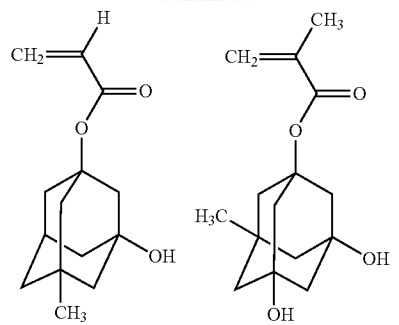
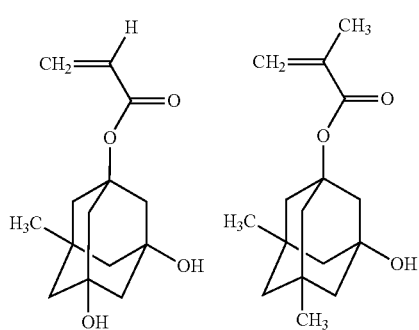
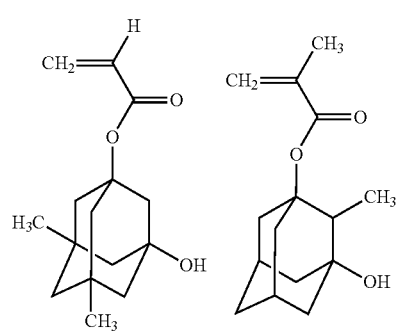
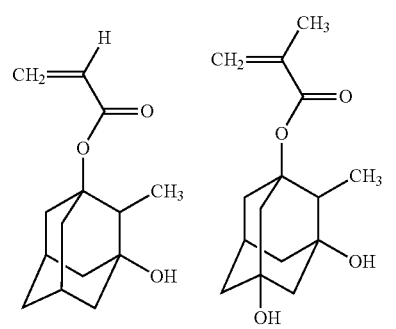
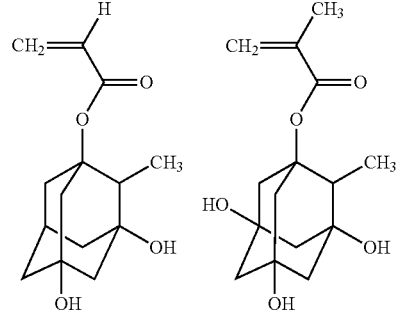
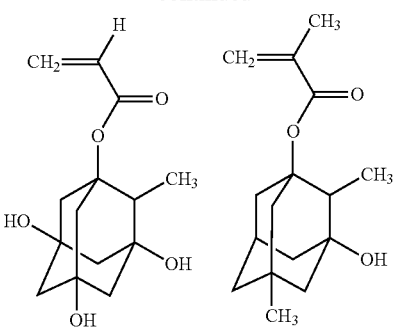
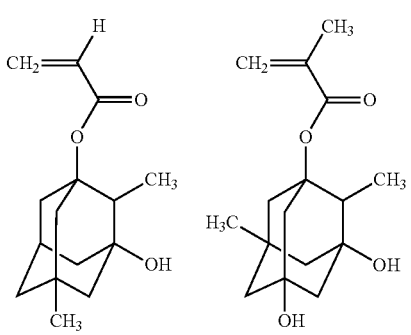
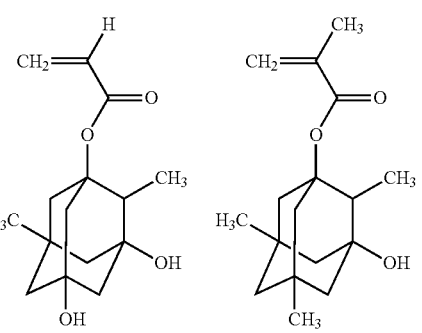
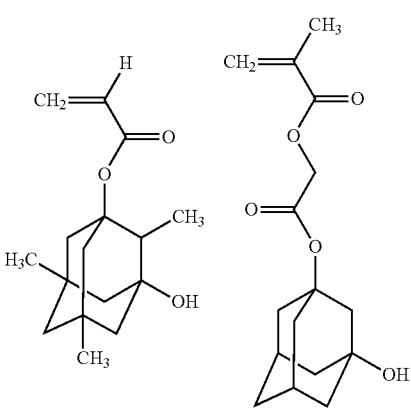

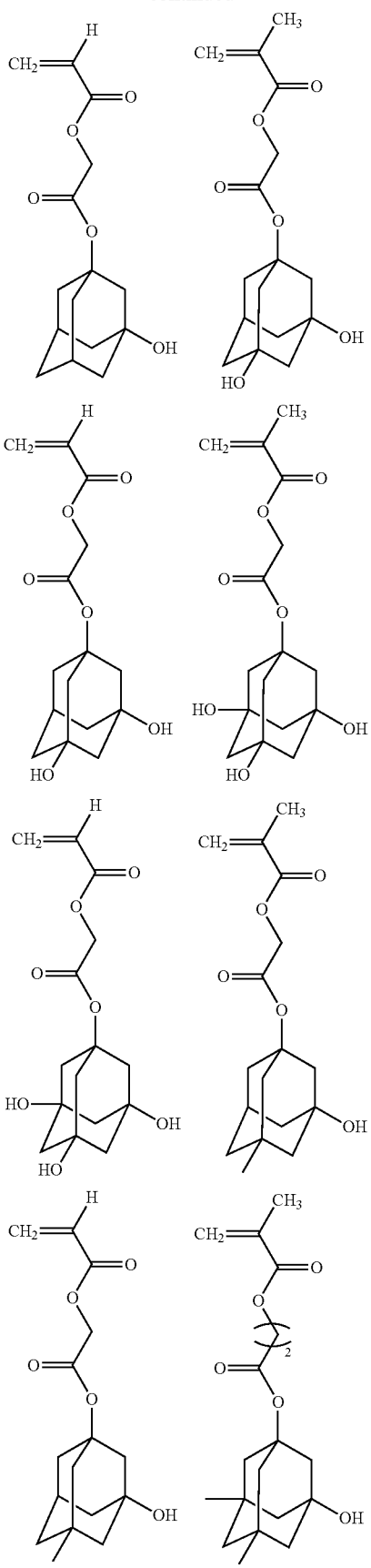
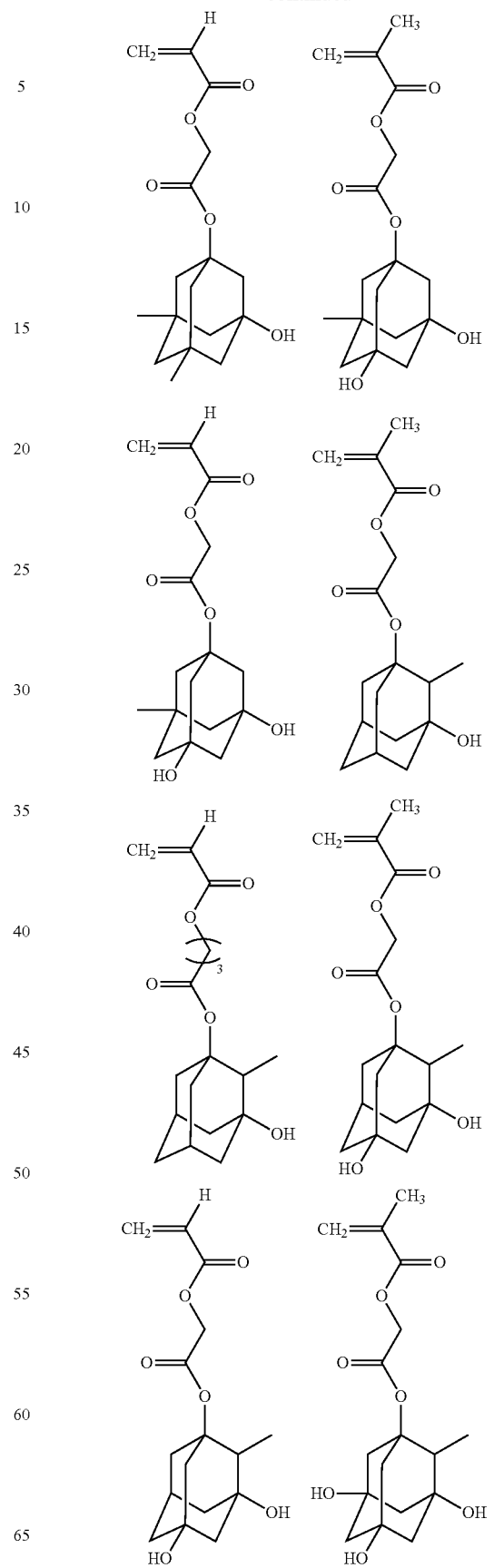

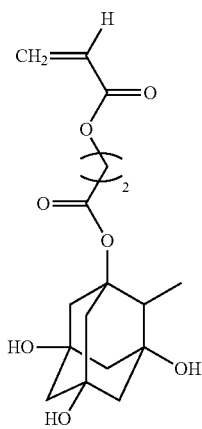

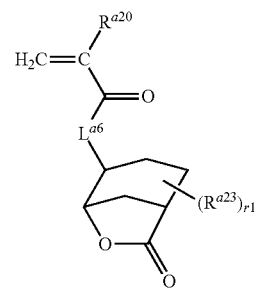

(a3-3)

wherein $L^{a4}$, $L^{a5}$ and $L^{a6}$ independently represent *-O— or *-O—$(CH_2)_{k3}$—CO—O— in which * represents a binding position to —CO— and k3 represents an integer of 1 to 7, $R^{a18}$, $R^{a19}$ and $R^{a20}$ independently represent a hydrogen atom or a methyl group, $R^{a21}$ represents a C1-C4 aliphatic hydrocarbon group, $R^{a22}$ and $R^{a23}$ are independently in each occurrence a carboxyl group, a cyano group or a C1-C4 aliphatic hydrocarbon group, and p1 represents an integer of 0 to 5, q1 and r1 independently each represent an integer of 0 to 3.

It is preferred that $L^{a4}$, $L^{a5}$ and $L^{a6}$ each independently represent *-O— or *-O—$(CH_2)_{d1}$—CO—O— in which * represents a binding position to —CO— and d1 represents an integer of 1 to 4, and it is more preferred that $L^{a4}$, $L^{a5}$ and $L^{a6}$ are *-O—. $R^{a18}$, $R^{a19}$ and $R^{a20}$ are preferably methyl groups. $R^{a21}$ is preferably a methyl group. It is preferred that $R^{a22}$ and $R^{a23}$ are independently in each occurrence a carboxyl group, a cyano group or a methyl group. It is preferred that p1 is an integer of 0 to 2, and it is more preferred that p1 is 0 or 1. It is preferred that q1 and r1 independently each represent an integer of 0 to 2, and it is more preferred that q1 and r1 independently each represent 0 or 1.

When POLYMER (II) contains the structural unit derived from Monomer (a2), the content of the structural unit derived from Monomer (a2) is usually 0.1 to 40% by mole and preferably 0.1 to 35% by mole and more preferably 1 to 20% by mole based on total molar of all the structural units of POLYMER (II).

Examples of the lactone ring of Monomer (a3) include a monocyclic lactone ring such as β-propiolactone ring, γ-butyrolactone ring and γ-valerolactone ring, and a condensed ring formed from a monocyclic lactone ring and the other ring. Among them, preferred are γ-butyrolactone ring and a condensed lactone ring formed from γ-butyrolactone ring and the other ring.

Preferable examples of Monomer (a3) include the monomers represented by the formulae (a3-1), (a3-2) and (a3-3):

Examples of the monomer represented by the formula (a3-1) include the followings.

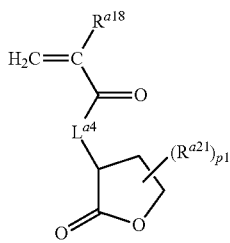

(a3-1)

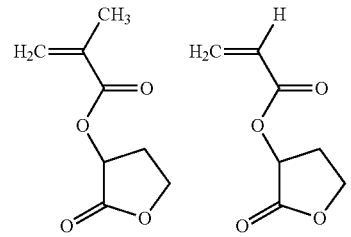

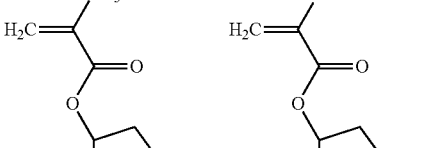

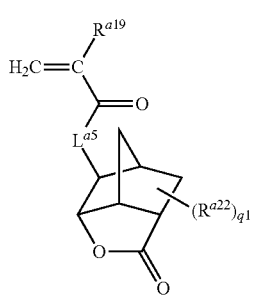

(a3-2)

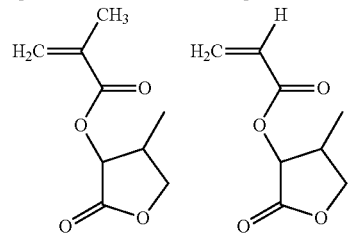

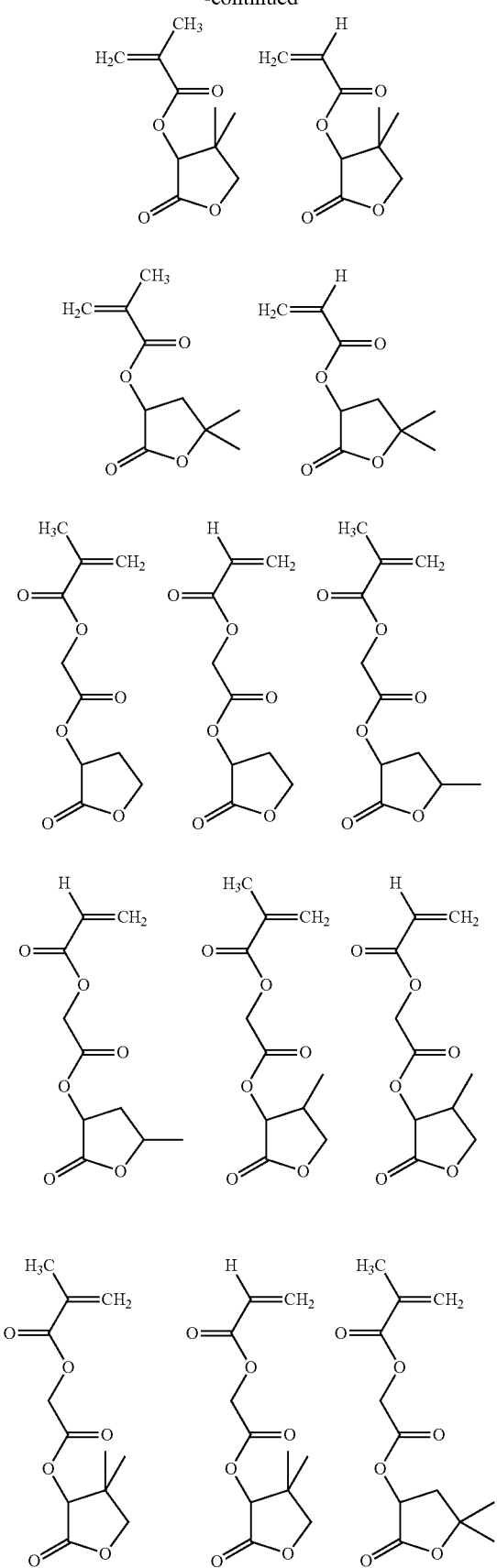
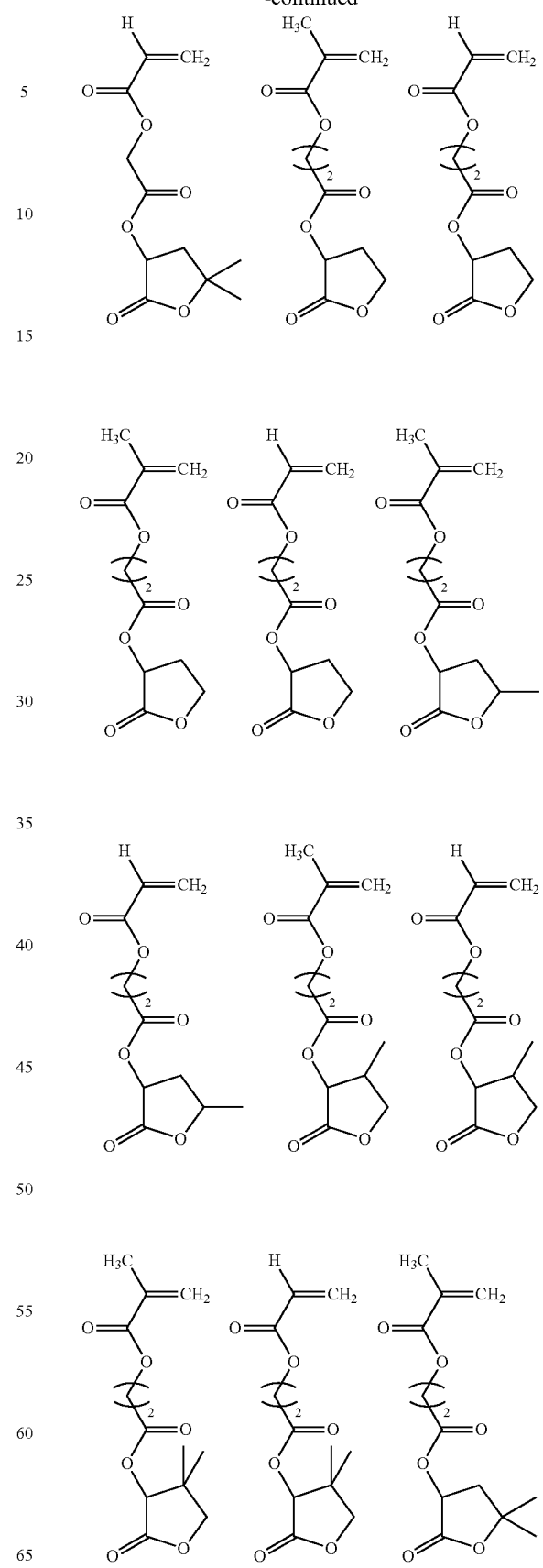

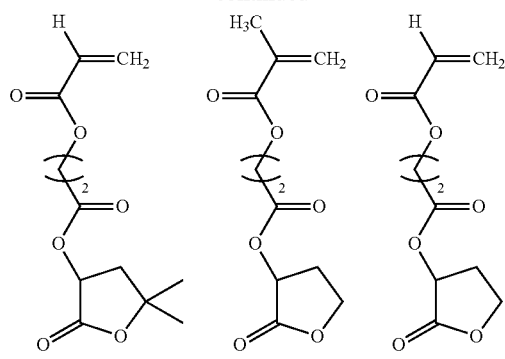
Examples of the monomer represented by the formula (a3-2) include the followings.
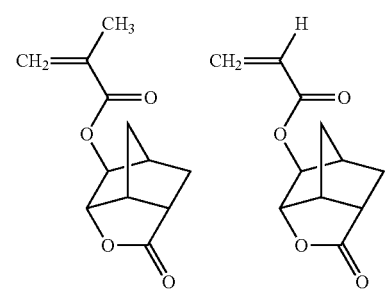
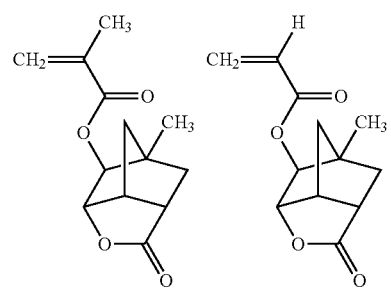
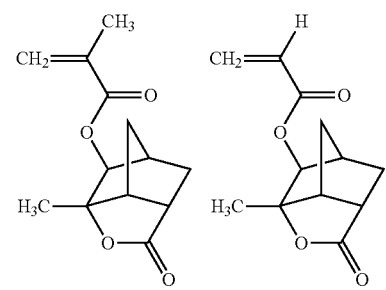
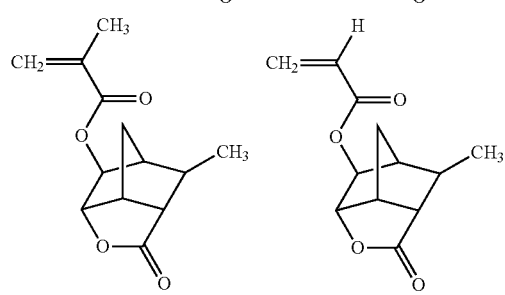
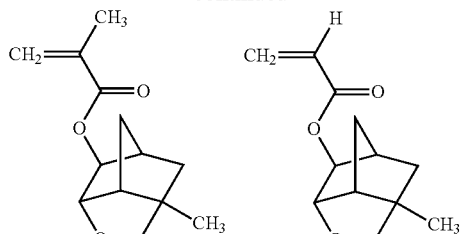
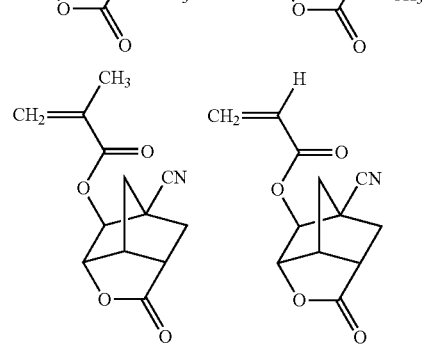
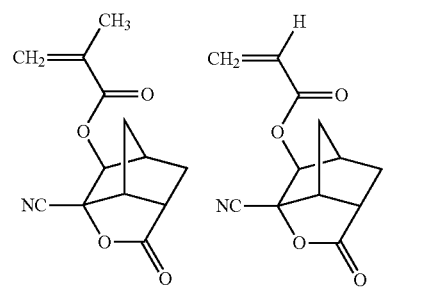
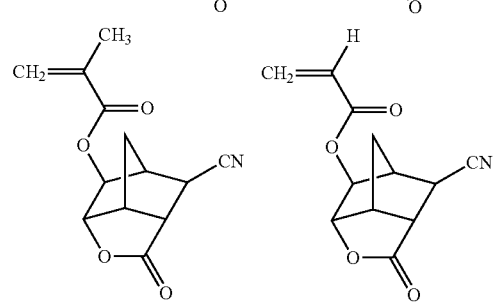
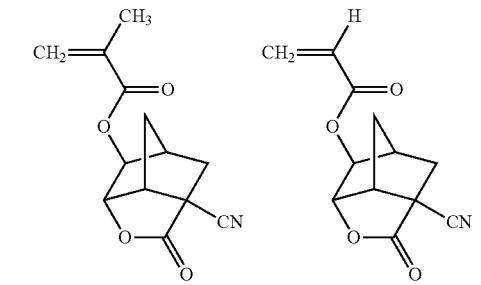
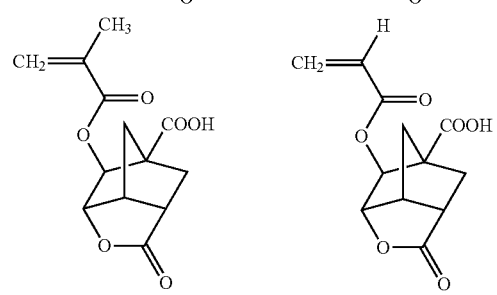

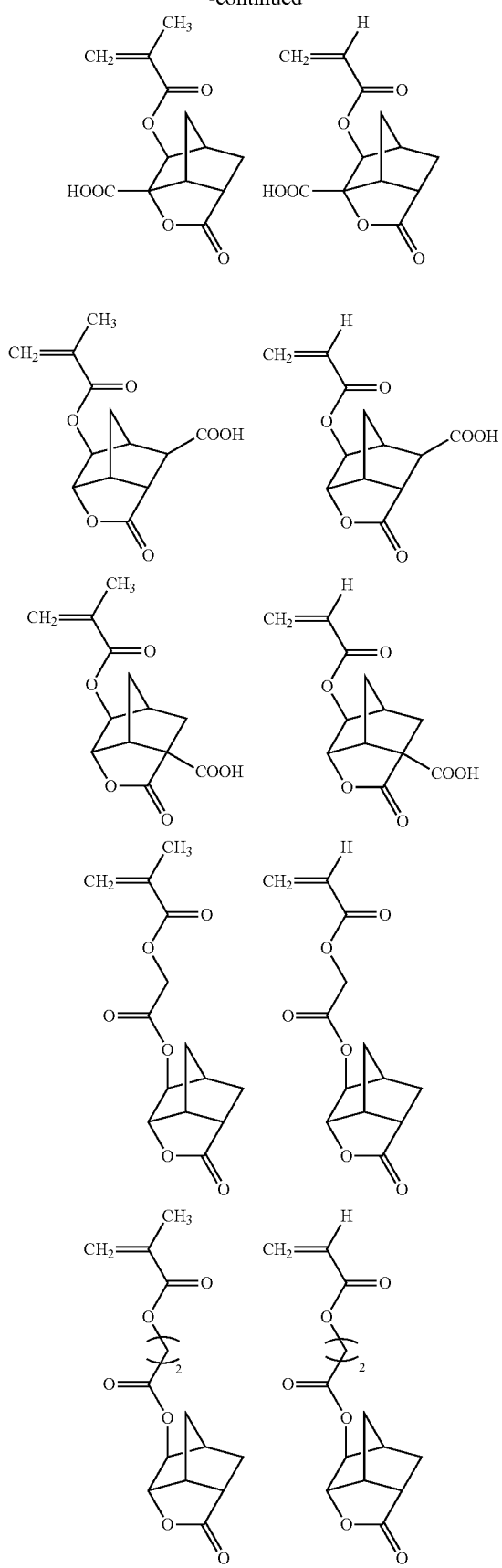
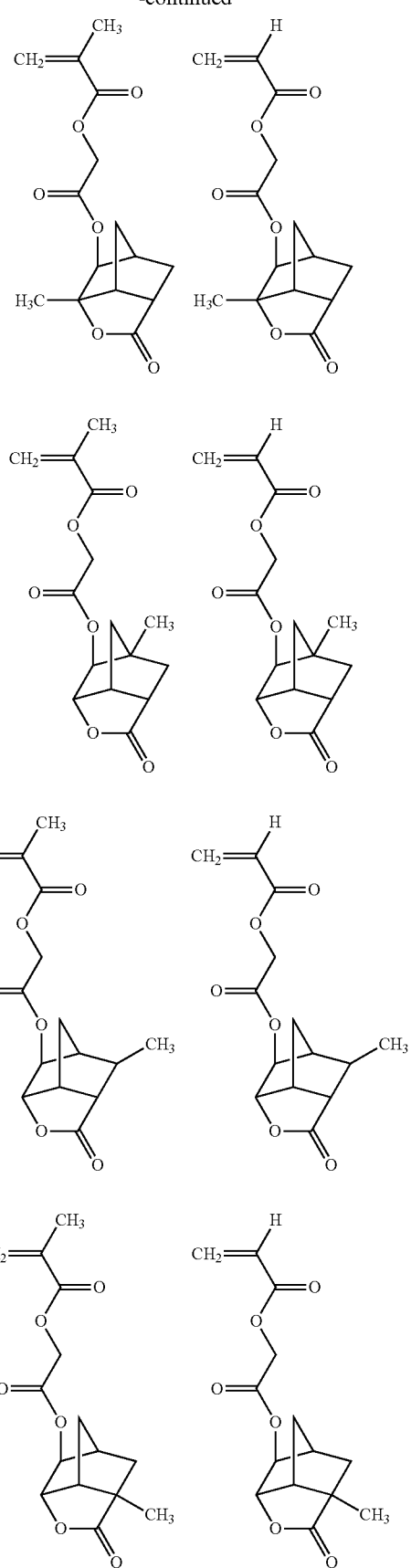

47
-continued
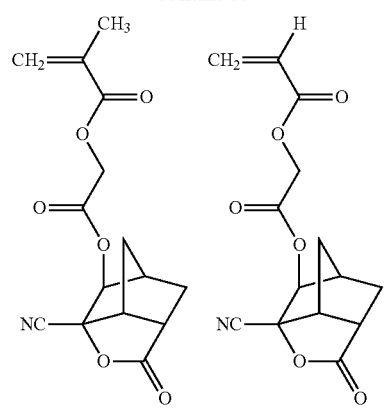
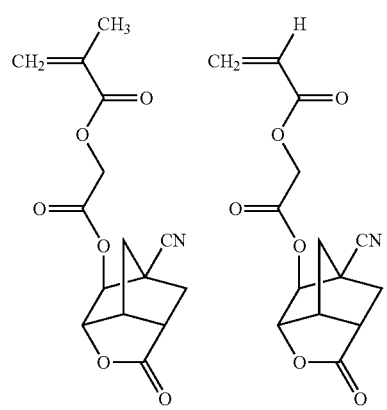
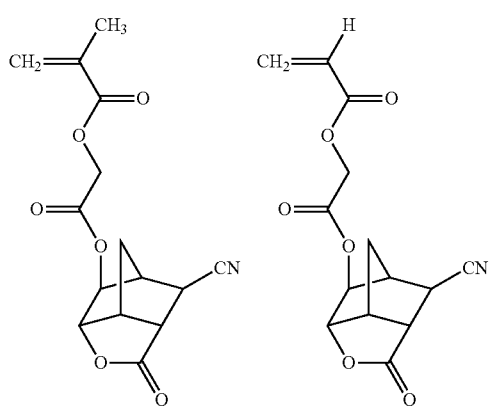
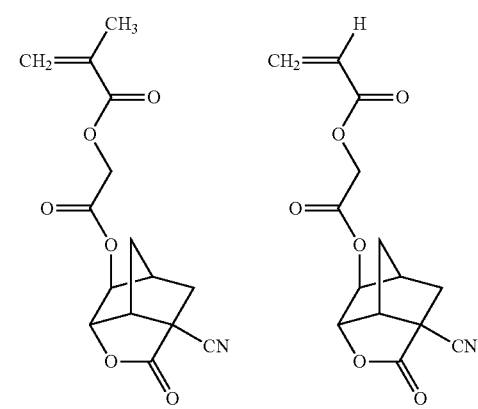
48
-continued
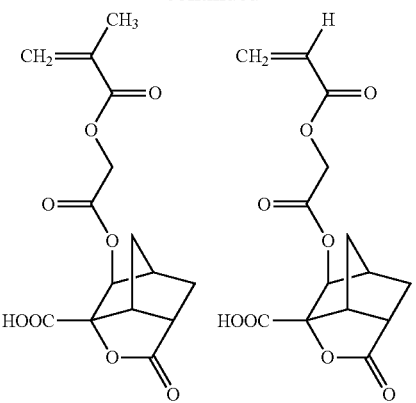
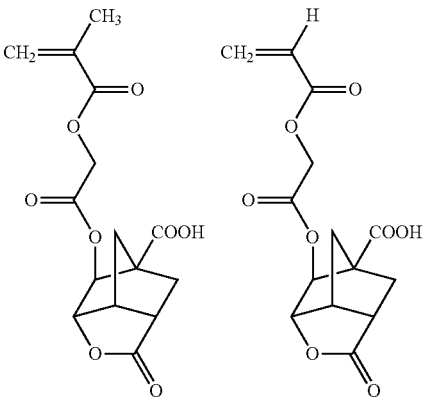
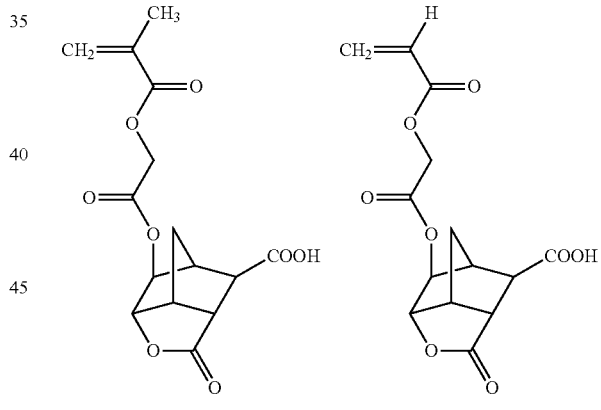
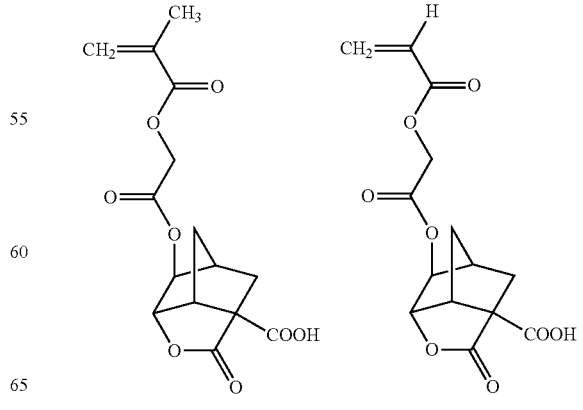

Examples of the monomer represented by the formula (a3-3) include the followings.
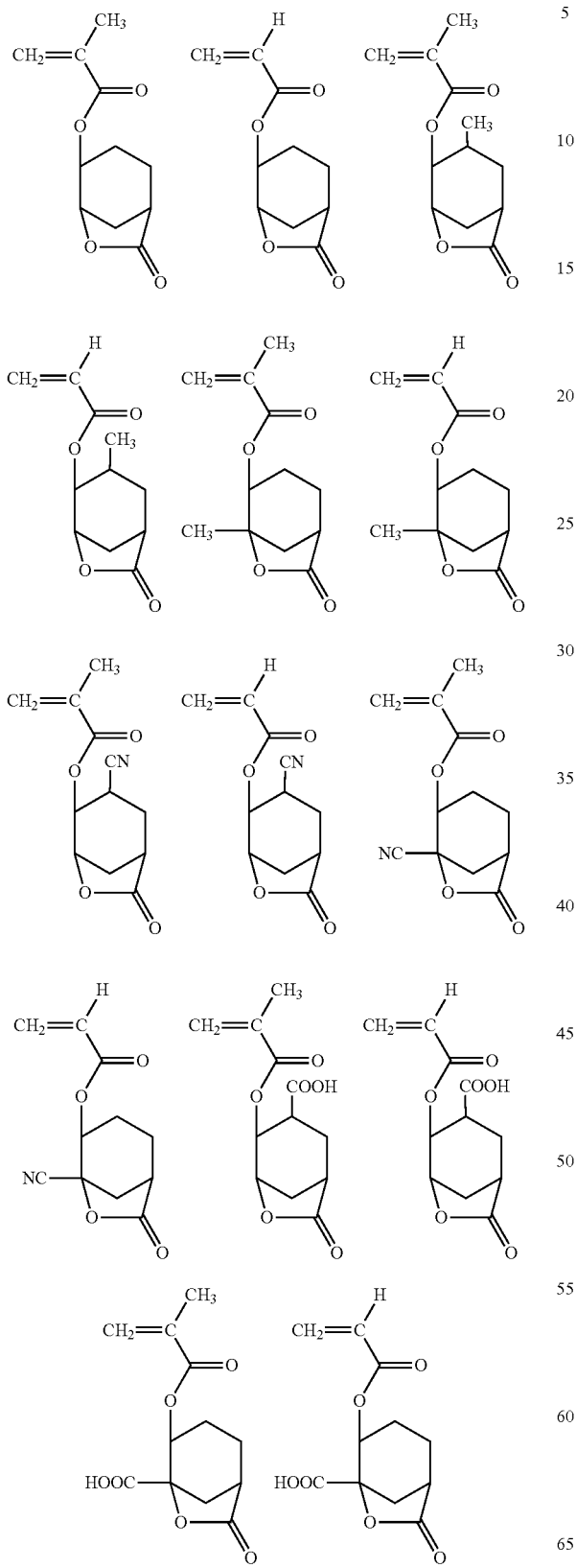
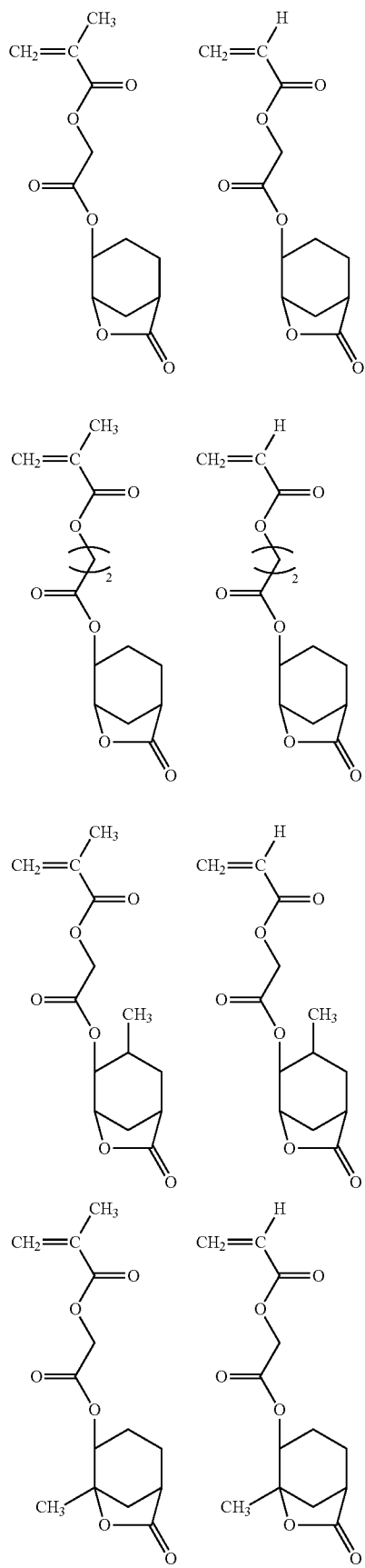
-continued

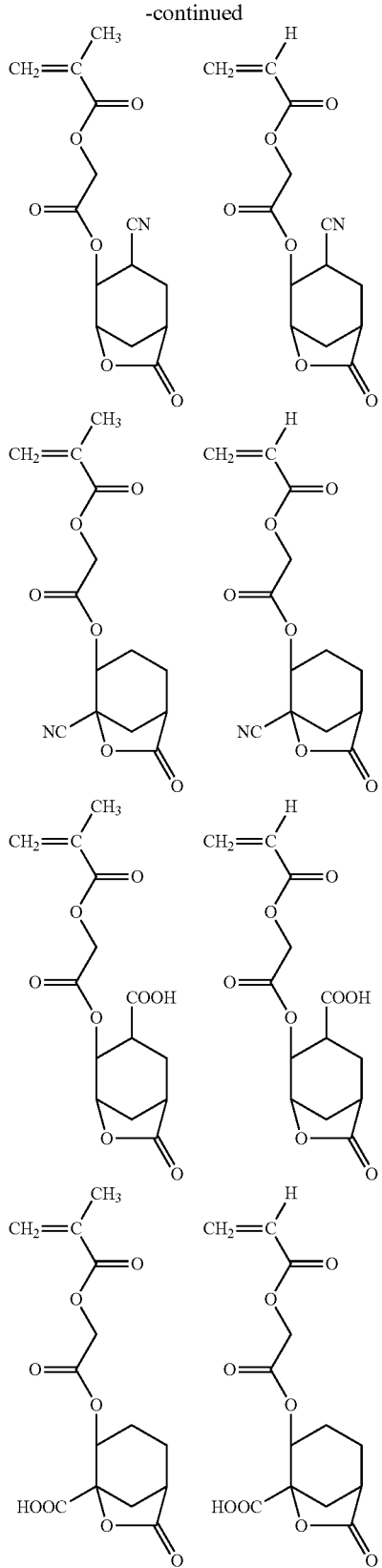

Among them, preferred are 5-oxo-4-oxatricyclo[4.2.1.0³,⁷]nonan-2-yl acrylate, 5-oxo-4-oxatricyclo[4.2.1.0³,⁷]nonan-2-yl methacrylate, tetrahydro-2-oxo-3-furyl acrylate, tetrahydro-2-oxo-3-furyl methacrylate, 2-(5-oxo-4-oxatricyclo[4.2.1.0³,⁷]nonan-2-yloxy)-2-oxoethyl acrylate and 2-(5-oxo-4-oxatricyclo[4.2.1.0³,⁷]nonan-2-yloxy)-2-oxoethyl methacrylate, and more preferred are 5-oxo-4-oxatricyclo[4.2.1.0³,⁷]nonan-2-yl methacrylate, tetrahydro-2-oxo-3-furyl methacrylate and 2-(5-oxo-4-oxatricyclo[4.2.1.0³,⁷]nonan-2-yloxy)-2-oxoethyl methacrylate.

When POLYMER (II) contains the structural unit derived from Monomer (a3), the content thereof is usually 1 to 80% by mole and preferably 10 to 80% by mole and more preferably 30 to 70% by mole based on total molar of all the structural units of POLYMER (II).

POLYMER (II) can contain a structural unit derived from a monomer having an acid-labile group containing a lactone ring. Examples of the monomer having an acid-labile group containing a lactone ring include the followings.

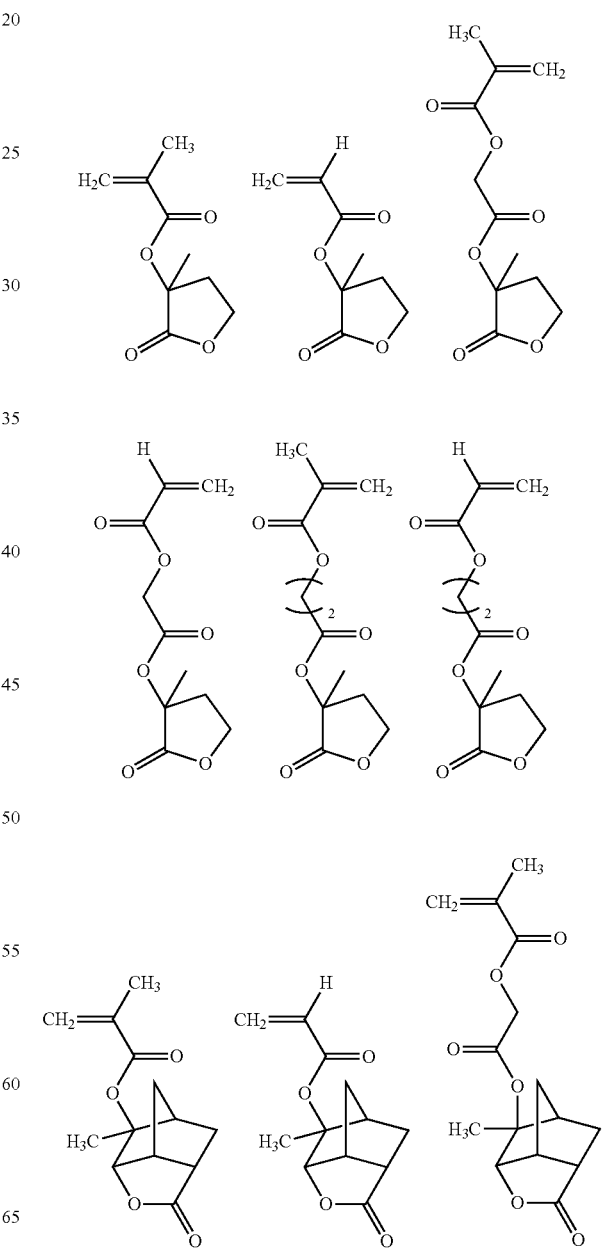

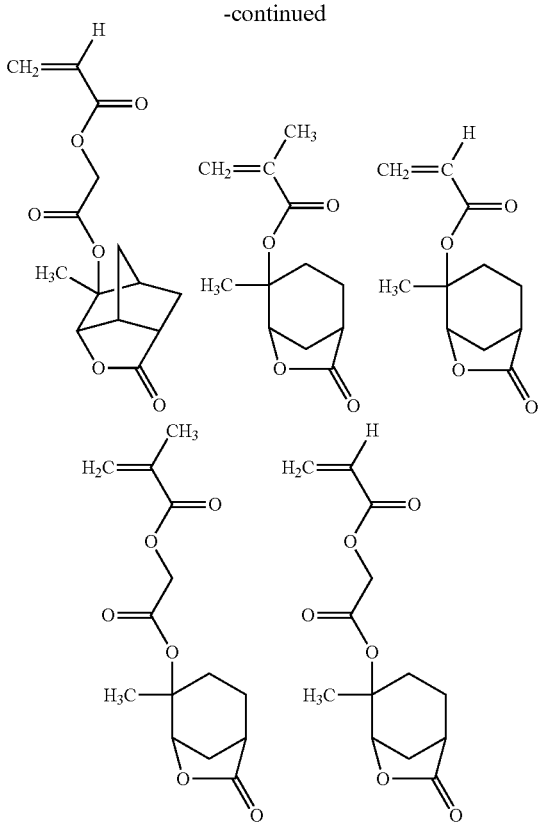

Preferable POLYMER (II) is a polymer consisting of the structural units derived from Monomer (a1) and the structural units derived from Monomer (a2) and/or Monomer (a3). Monomer (a1) is preferably the monomer represented by the formula (a1-1) or the monomer represented by the formula (a1-2), and is more preferably the monomer represented by the formula (a1-1). Monomer (a2) is preferably the monomer represented by the formula (a2-1), and Monomer (a3) is preferably the monomer represented by the formula (a3-1) or (a3-2).

POLYMER (II) can be produced according to known polymerization methods such as radical polymerization.

POLYMER (II) usually has 2,500 or more of the weight-average molecular weight, and preferably 3,000 or more of the weight-average molecular weight. POLYMER (II) usually has 50,000 or less of the weight-average molecular weight, and preferably has 30,000 or less of the weight-average molecular weight.

The content of POLYMER (II) in the photoresist composition of the present invention is usually 0.1 to 5% by weight based on 100% by weight of the solid component.

The content of Component (A) in the photoresist composition of the present invention is usually 0.1 to 5% by weight based on 100% by weight of the solid component.

Next, Component (B) will be illustrated.

Component (B) is a resin being insoluble or poorly soluble in an alkali aqueous solution but becoming soluble in an alkali aqueous solution by the action of an acid. The resin has a structural unit derived from Monomer (a1) as described above, and can be produced by polymerizing one or more Monomer (a1).

The content of the structural unit derived from Monomer (a1) is usually 10 to 95% by mole and preferably 15 to 90% by mole and more preferably 20 to 85% by mole based on total molar of all the structural units of the resin.

The resin preferably has one or more structural units derived from Monomer (a2) or Monomer (a3). When the resin has the structural unit derived from Monomer (a2), the content thereof is usually 0.1 to 40% by mole, preferably 0.1 to 35% by mole and more preferably 1 to 20% by mole based on 100% by mole of all the structural units of the resin. When the resin has the structural unit derived from Monomer (a3), the content thereof is usually 1 to 80% by mole, preferably 10 to 80% by mole and more preferably 30 to 70% by mole based on 100% by mole of all the structural units of the resin.

Preferable resin is a resin comprising the structural units derived from Monomer (a1) and the structural units derived from Monomer (a2) and/or Monomer (a3). Monomer (a1) is preferably the monomer represented by the formula (a1-1) or the monomer represented by the formula (a1-2), and is more preferably the monomer represented by the formula (a1-1). Monomer (a2) is preferably the monomer represented by the formula (a2-1), and Monomer (a3) is preferably the monomer represented by the formula (a3-1) or (a3-2).

The resin can be produced according to known polymerization methods such as radical polymerization.

The resin usually has 2,500 or more of the weight-average molecular weight, and preferably 3,000 or more of the weight-average molecular weight. The resin usually has 50,000 or less of the weight-average molecular weight, and preferably has 30,000 or less of the weight-average molecular weight.

The content of the resin in the photoresist composition of the present invention is preferably 80% by weight or more based on 100% by weight of the solid component.

Next, Component (c) will be illustrated.

Component (C) is an acid generator. Component (C) can contain two or more kinds of the acid generators. Component (C) is preferably a photoacid generator.

The acid generator is a substance which is decomposed to generate an acid by applying a radiation such as a light, an electron beam or the like on the substance itself or on a photoresist composition containing the substance. The acid generated from the acid generator acts on the resin and/or POLYMER (II) resulting in cleavage of the acid-labile group existing therein.

The photoacid generator that may be used include nonionic photoacid generators and ionic photoacid generators. Examples of the nonionic photoacid generator include organic halides, sulfonate esters such as 2-nitrobenzyl ester, aromatic sulfonate, oxime sulfonate, N-sulfonyloxyimide, sulfonyloxyketone and DNQ 4-sulfonate, and sulfones such as disulfone, ketosulfone and sulfonyldiazomethane. Examples of the ionic photoacid generator include onium salts such as a diazonium salt, a phosphonium salt, a sulfonium salt and an iodonium salt, and examples of the anion of the onium salt include sulfonic acid anion, sulfonylimide anion and sulfonylmethide anion.

Other examples of the photoacid generator include photoacid generators described in JP 63-26653 A, JP 55-164824 A, JP 62-69263 A, JP 63-146038 A, JP 63-163452 A, JP 62-153853 A, JP 63-146029 A, U.S. Pat. No. 3,779,778, U.S. Pat. No. 3,849,137, DE Patent No. 3914407 and EP Patent No. 126,712.

A fluorine-containing photoacid generator is preferable.

Preferable examples of the acid generator include a salt represented by the formula (B1):

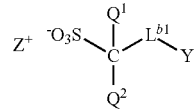

(B1)

wherein $Q^1$ and $Q^2$ independently represent a fluorine atom or a C1-C6 perfluoroalkyl group, $L^{b1}$ represents a single bond or a C1-C17 saturated divalent hydrocarbon group which can have one or more substituents, and one or more —CH$_2$— in the saturated divalent hydrocarbon group can be replaced by —O— or —CO—, Y represents a C1-C36 aliphatic hydrocarbon group or a C3-C36 saturated cyclic hydrocarbon group, and the aliphatic hydrocarbon group and the saturated cyclic hydrocarbon group can have one or more substituents, and one or more —CH$_2$— in the aliphatic hydrocarbon group and the saturated cyclic hydrocarbon group can be replaced by —O—, —CO— or —SO$_2$—, and $Z^+$ represents an organic cation.

Examples of the C1-C6 perfluoroalkyl group include a trifluoromethyl group, a pentafluoroethyl group, a heptafluoropropyl group, a nonafluorobutyl group, an undecafluoropentyl group and a tridecafluorohexyl group, and a trifluoromethyl group is preferable. $Q^1$ and $Q^2$ independently preferably represent a fluorine atom or a trifluoromethyl group, and $Q^1$ and $Q^2$ are more preferably fluorine atoms.

Examples of the C1-C17 saturated divalent hydrocarbon group include a C1-C17 alkylene group and a divalent group having an alicyclic divalent hydrocarbon group. Examples of the alkylene group include a linear alkanediyl group such as a methylene group, an ethylene group, a propane-1,3-diyl group, a butane-1,4-diyl group, a pentane-1,5-diyl, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group, a branched chain alkanediyl group formed by replacing one or more hydrogen atom of the above-mentioned linear alkanediyl group by a C1-C4 alkyl group, and a divalent group having an alicyclic divalent hydrocarbon group such as the following groups represented by the formulae (X$^1$-A) to (X$^1$—C):

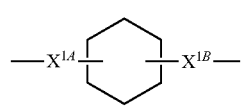

(X$^1$-A)

(X$^1$-B)

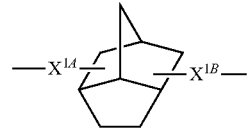

(X$^1$-C)

wherein $X^{1A}$ and $X^{1B}$ independently each represent a C1-C6 alkylene group which can have one or more substituents, with the proviso that total carbon number of the group represented by the formula (X$^1$-A), (X$^1$—B) or (X$^1$—C) is 1 to 17.

One or more —CH$_2$— in the C1-C6 alkylene group can be replaced by —O— or —CO—.

Examples of the C1-C17 saturated hydrocarbon group in which one or more —CH$_2$— are replaced by —O— or —CO— include *-CO—O-L$^{b2}$-, *-CO—O-L$^{b4}$-CO—O-L$^{b3}$, *-L$^{b5}$-O—CO—, *-L$^{b7}$-O-L$^{b6}$-, *-CO—O-L$^{b8}$-O—, and *-CO—O-L$^{b10}$-O-L$^{b9}$-CO—O—, wherein $L^{b2}$ represents a single bond or a C1-C15 alkanediyl group, $L^{b3}$ represents a single bond or a C1-C12 alkanediyl group, $L^{b4}$ represents a single bond or a C1-C13 alkanediyl group, with proviso that total carbon number of $L^{b3}$ and $L^{b4}$ is 1 to 13, $L^{b5}$ represents a C1-C15 alkanediyl group, $L^{b6}$ represents a C1-C15 alkanediyl group, $L^{b7}$ represents a C1-C15 alkanediyl group, with proviso that total carbon number of $L^{b6}$ and $L^{b7}$ is 1 to 16, $L^{b8}$ represents a C1-C14 alkanediyl group, $L^{b9}$ represents a C1-C11 alkanediyl group, $L^{b10}$ represents a C1-C11 alkanediyl group, with proviso that total carbon number of $L^{b9}$ and $L^{b10}$ is 1 to 12, and * represents a binding position to —C(Q$^1$) (Q$^2$)-. Among them, preferred are *-CO—O-L$^{b2}$-, *-CO—O-L$^{b4}$-CO—O-L$^{b3}$-, *-L$^{b5}$-O—CO— and *-L$^{b7}$-O-L$^{b6}$-, and more preferred are *-CO—O-L$^{b2}$-, and *-CO—O-L$^{b4}$-CO—O-L$^{b3}$-, and much more preferred is *-CO—O-L$^{b2}$-, and especially preferred is *-CO—O-L$^{b2}$- in which $L^{b2}$ is a single bond or —CH$_2$—.

Examples of *-CO—O-L$^{b2}$- include *-CO—O— and *-CO—O—CH$_2$—. Examples of *-CO—O-L$^{b4}$-CO—O-L$^{b3}$- include *-CO—O—CH$_2$—CO—O—, *-CO—O—(CH$_2$)$_2$—CO—O—, *-CO—O—(CH$_2$)$_3$—CO—O—, *-CO—O—(CH$_2$)$_4$—CO—O—, *-CO—O—(CH$_2$)$_6$—CO—O—, *-CO—O—(CH$_2$)$_8$—CO—O—, *-CO—O—CH$_2$—CH(CH$_3$)—CO—O— and *-CO—O—CH$_2$—C(CH$_3$)$_2$—CO—O—. Examples of *-L$^{b5}$-O—CO— include *-CH$_2$—O—CO—, *-(CH$_2$)$_2$—O—CO—, *-(CH$_2$)$_3$—O—CO—, *-(CH$_2$)$_4$—O—CO—, *-(CH$_2$)$_6$—O—CO— and *-(CH$_2$)$_8$—O—CO—. Examples of *-L$^{b7}$-O-L$^{b6}$- include *-CH$_2$—O—CH$_2$—. Examples of *-CO—O-L$^{b8}$-O— include *-CO—O—CH$_2$—O—, *-CO—O—(CH$_2$)$_2$—O—, *-CO—O—(CH$_2$)$_3$—O—, *-CO—O—(CH$_2$)$_4$—O— and *-CO—O—(CH$_2$)$_6$—O—. Examples of *-CO—O-L$^{b10}$-O-L$^{b9}$-CO—O— include the followings.

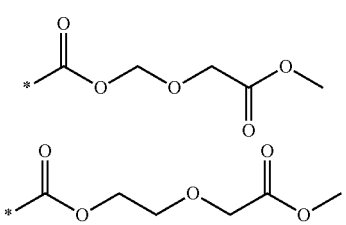

Examples of the substituent in Y include a halogen atom, a hydroxyl group, an oxo group, a glycidyloxy group, a C2-C4 acyl group, a C1-C12 alkoxy group, a C2-C7 alkoxycarbonyl group, a C1-C12 aliphatic hydrocarbon group, a C1-C12 hydroxy-containing aliphatic hydrocarbon group, a C3-C16 saturated cyclic hydrocarbon group, a C6-C18 aromatic hydrocarbon group, a C7-C21 aralkyl group and —(CH$_2$)$_{j2}$—O—CO—R$^{b1}$— in which R$^{b1}$ represents a C1-C16 aliphatic hydrocarbon group, a C3-C16 saturated cyclic hydrocarbon group or a C6-C18 aromatic hydrocarbon group and j2 represents an integer of 0 to 4. Examples of the halogen atom include a fluorine atom, a chlorine atom, a bromine atom and an iodine atom. Examples of the acyl group include an acetyl group and a propionyl group, and examples of the alkoxy group include a methoxy group, an ethoxy group, a propoxy group, an isopropoxy group and a butoxy group. Examples of the alkoxycarbonyl group include a methoxycarbonyl group, an ethoxycarbonyl group, a propoxycarbonyl group, an isopropoxycarbonyl group and a butoxycarbonyl group. Examples of the aliphatic hydrocarbon group include the same as described above.

Examples of the hydroxyl-containing aliphatic hydrocarbon group include a hydroxymethyl group. Examples of the C3-C16 saturated cyclic hydrocarbon group include the same as described above, and examples of the aromatic hydrocarbon group include a phenyl group, a naphthyl group, an anthryl group, a p-methylphenyl group, a p-tert-butylphenyl group and a p-adamantylphenyl group. Examples of the aralkyl group include a benzyl group, a phenethyl group, a phenylpropyl group, a trityl group, a naphthylmethyl group and a naphthylethyl group.

Examples of the C1-C36 aliphatic hydrocarbon group represented by Y include a methyl group, an ethyl group, a propyl group, an isopropyl group, a butyl group, an isobutyl group, a sec-butyl group, a tert-butyl group, a pentyl group, a neopentyl group, a 1-methylbutyl group, a 2-methylbutyl group, a 1,2-dimethylpropyl group, a 1-ethylpropyl group, a hexyl group, a 1-methylpentyl group, a heptyl group, an octyl group, a 2-ethylhexyl group, a nonyl group, a decyl group, an undecyl group and a dodecyl group, and a C1-C6 alkyl group is preferable. Examples of the C3-C36 saturated cyclic hydrocarbon group represented by Y include the groups represented by the formulae (Y1) to (Y26):

(Y14) 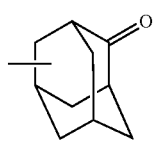

(Y15) 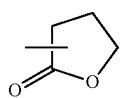

(Y16) 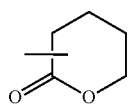

(Y17) 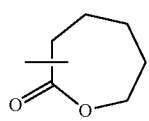

(Y18) 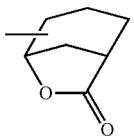

(Y19) 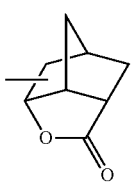

(Y20) 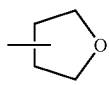

(Y21) 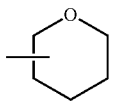

(Y22) 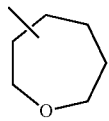

(Y23) 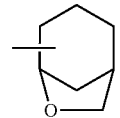

(Y24) 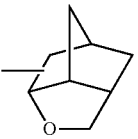

(Y25) 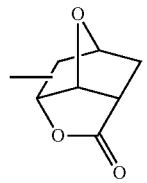

(Y26) 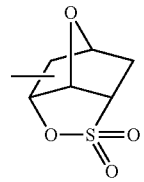

Among them, preferred are the groups represented by the formulae (Y1) to (Y19), and more preferred are the groups represented by the formulae (Y11), (Y14), (Y15) and (Y19). The groups represented by the formulae (Y11) and (Y14) are especially preferable.

Examples of Y having one or more substituents include the followings:

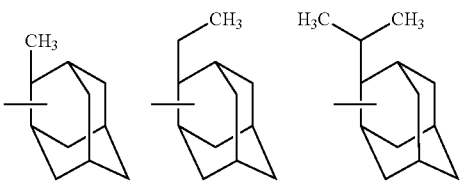

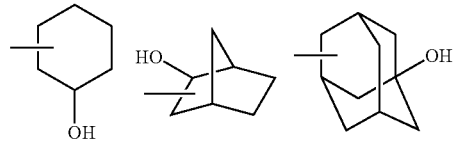

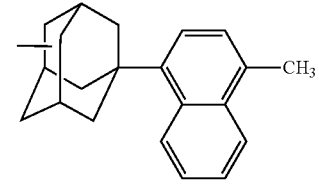

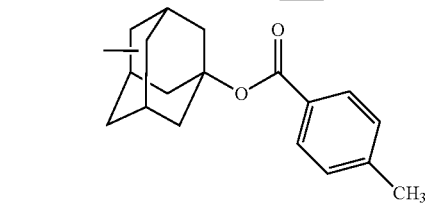

Y is preferably an adamantyl group which can have one or more substituents, and is more preferably an adamantyl group or an oxoadamantyl group.

Among the sulfonic acid anions of the salt represented by the formula (B1), preferred is a sulfonic acid anion in which $L^{b1}$ is *-CO—O-$L^{b2}$- and more preferred are anions represented by the formulae (b1-1-1) to (b1-1-9).

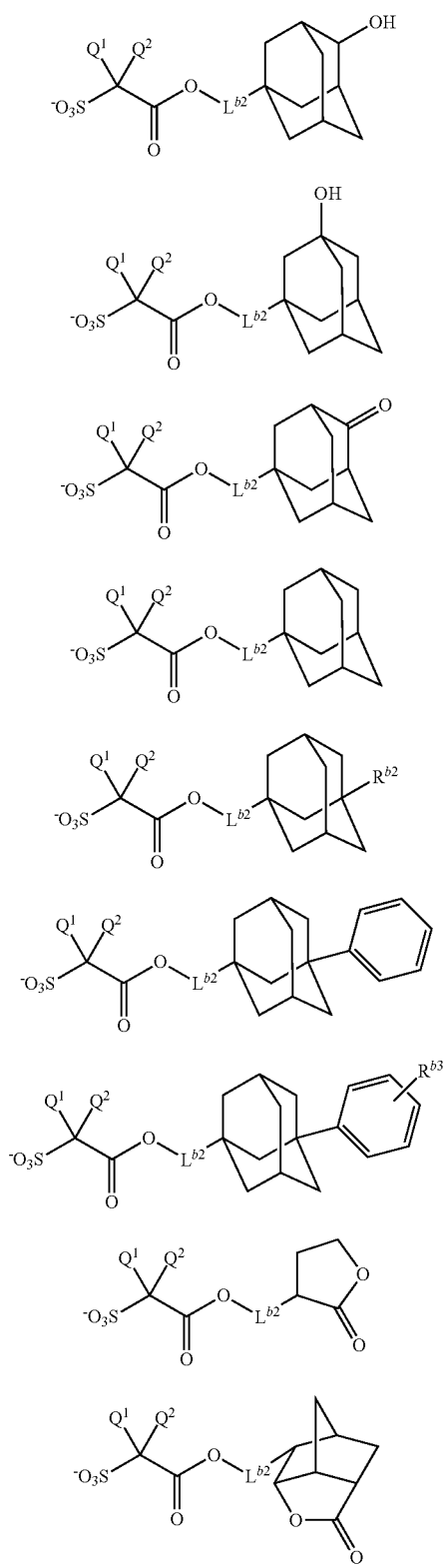
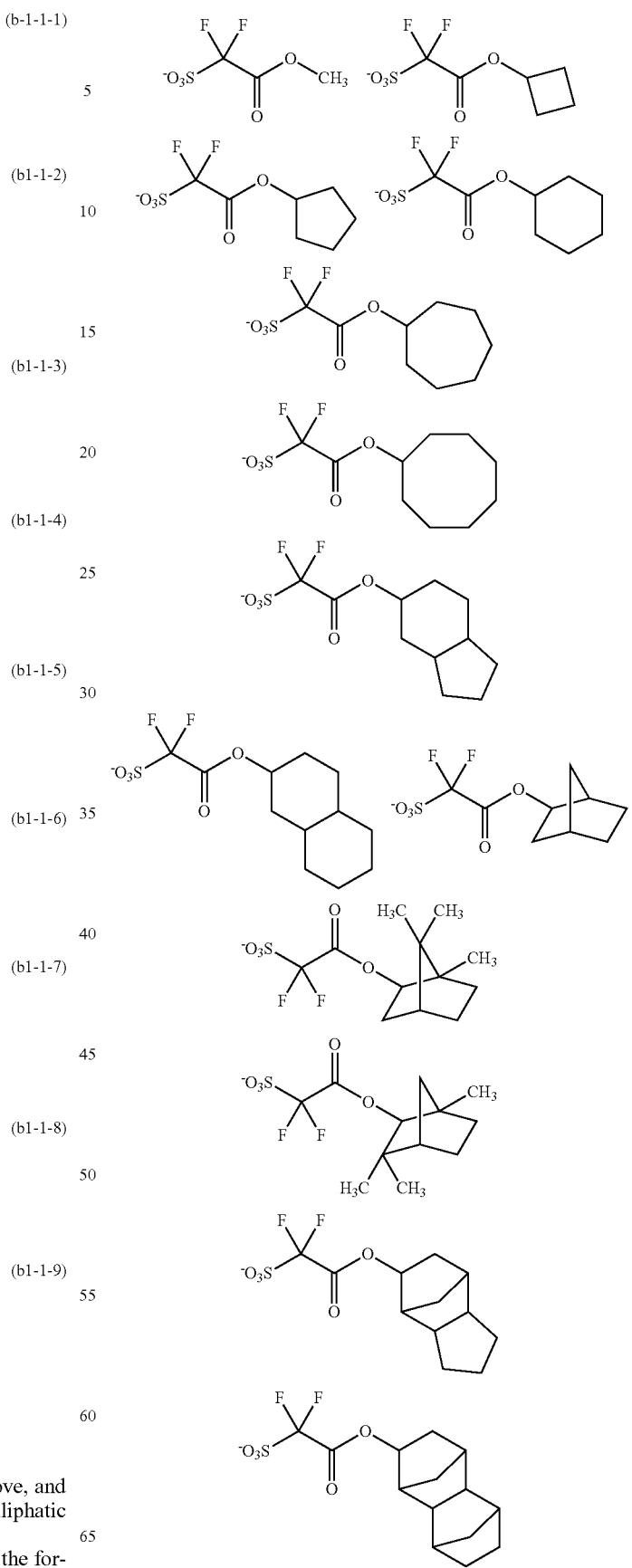
wherein $Q^1$, $Q^2$ and $L^{b2}$ are the same as defined above, and $R^{b2}$ and $R^{b3}$ each independently represent a C1-C4 aliphatic hydrocarbon group, preferably a methyl group.
Examples of the anions of the salt represented by the formula (B1) include the followings.

-continued
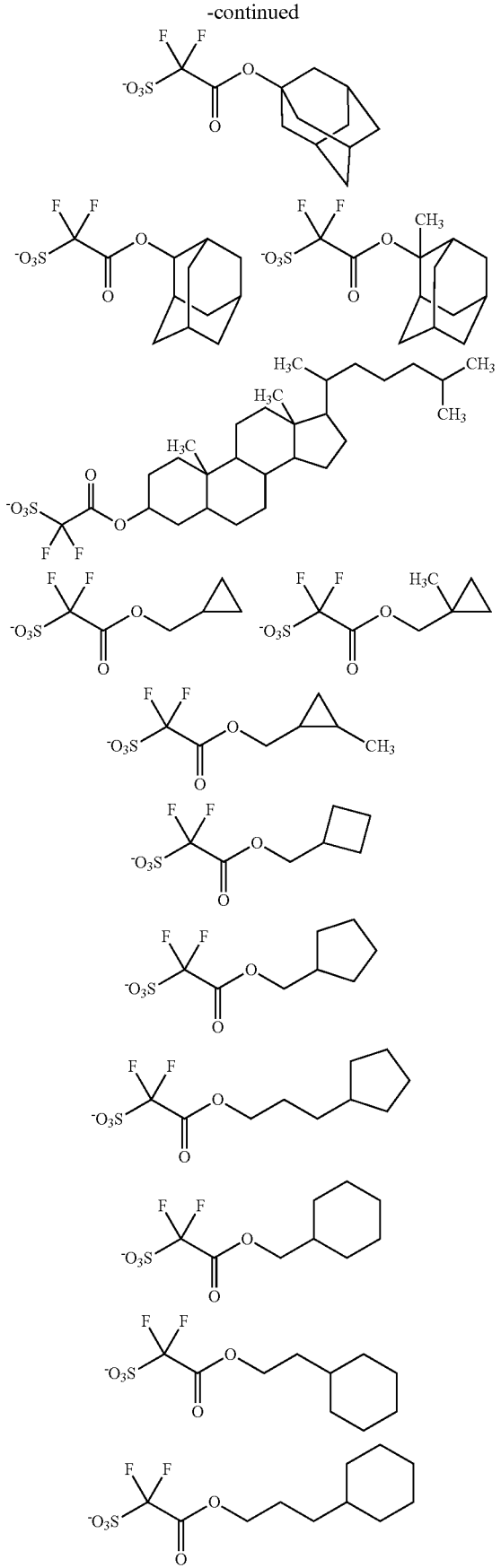
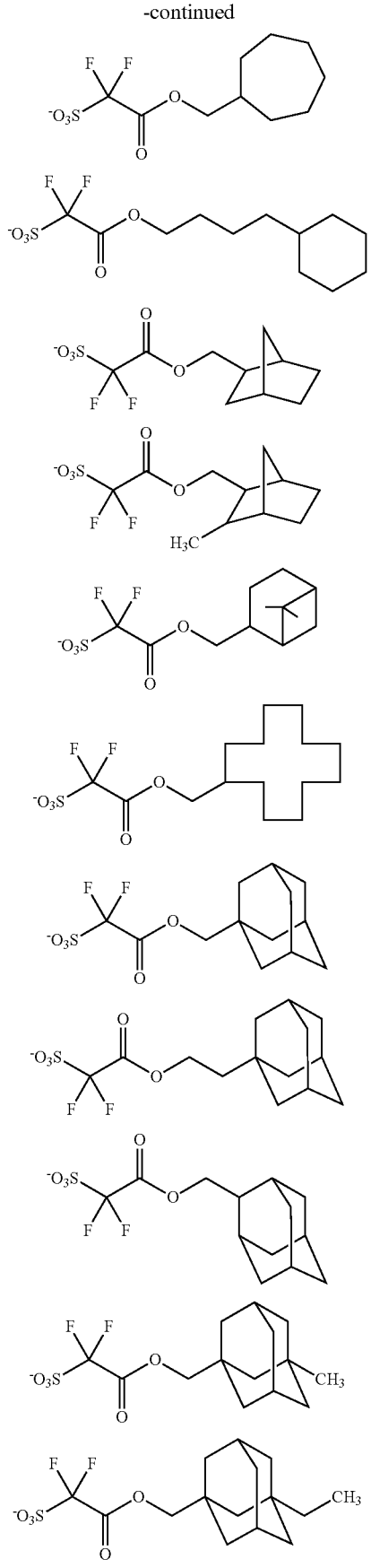

-continued
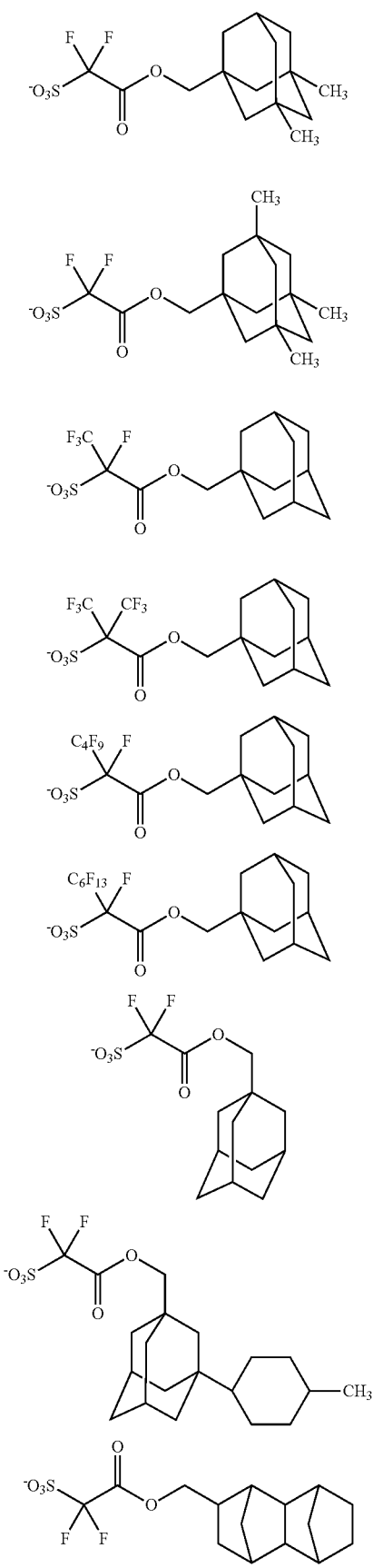
-continued
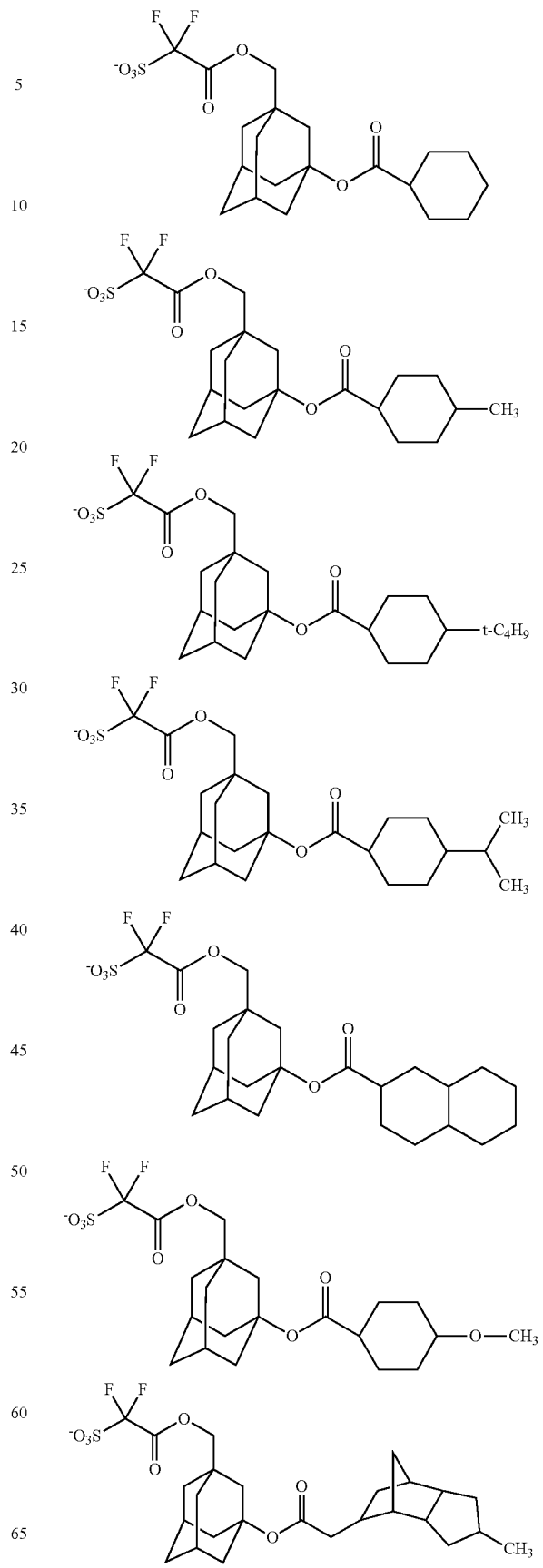

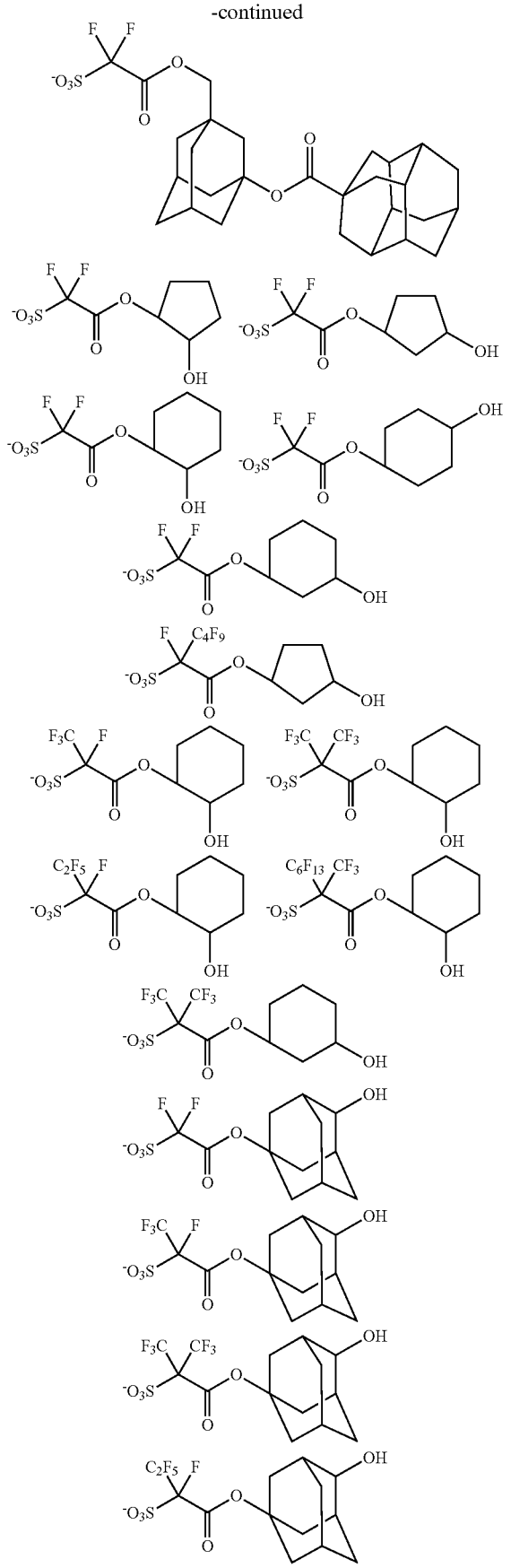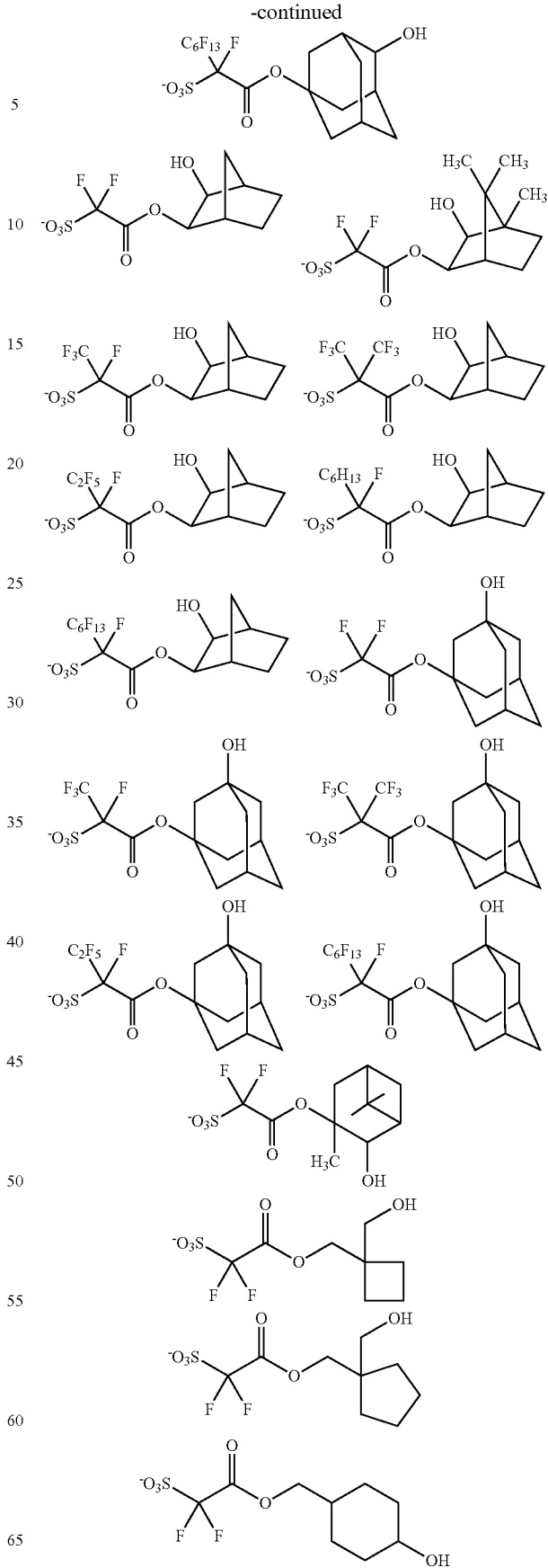

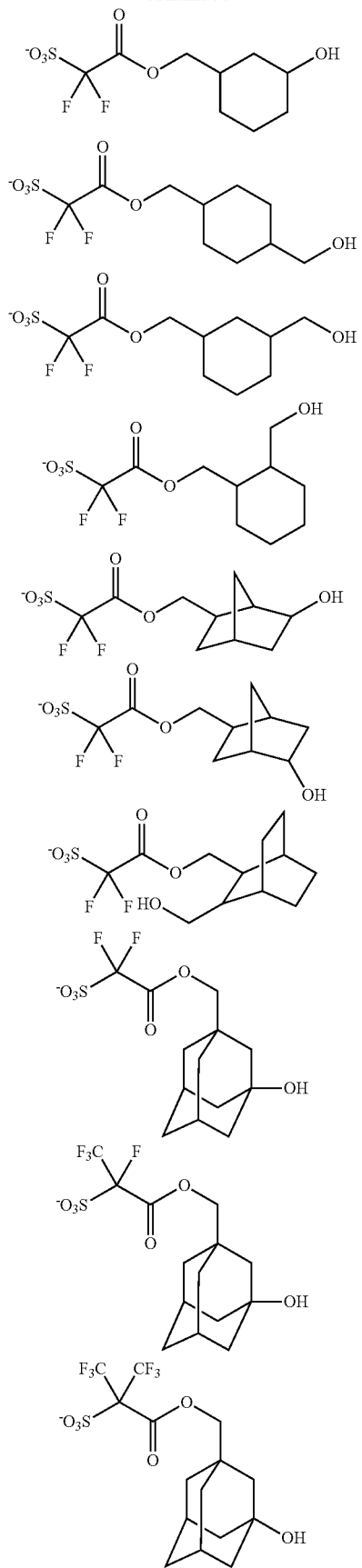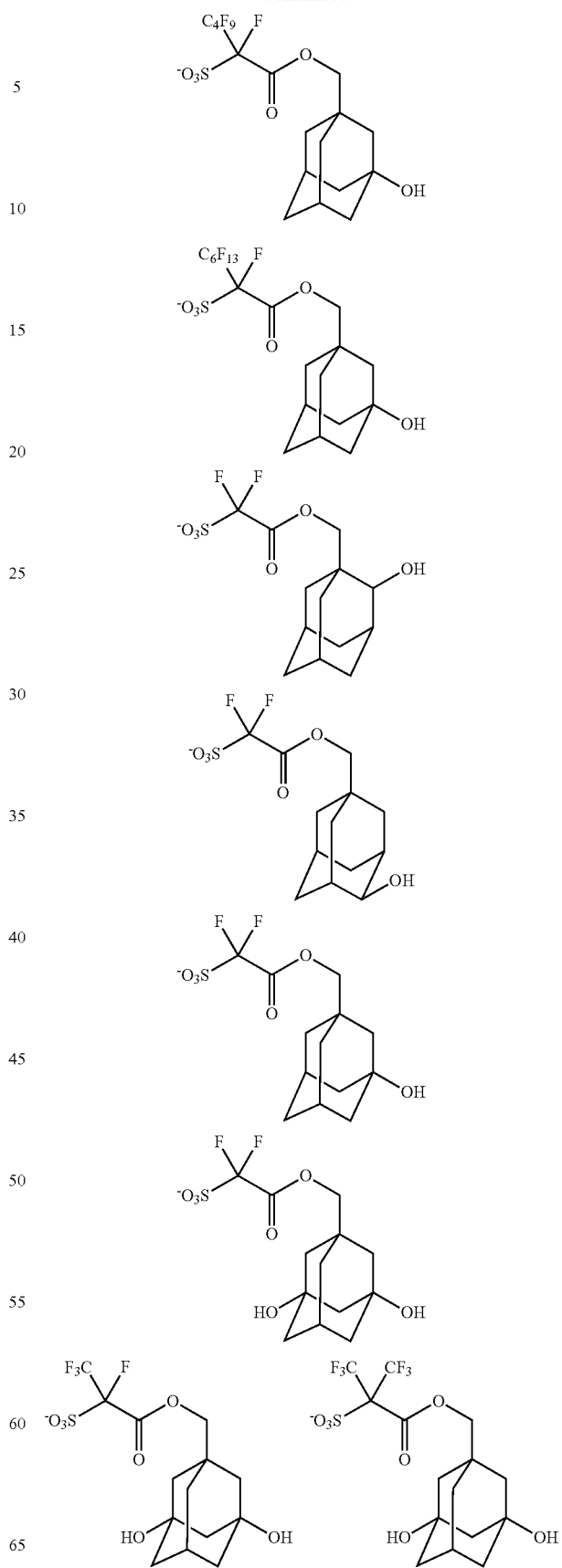

71
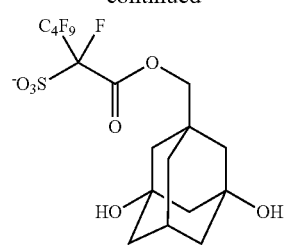
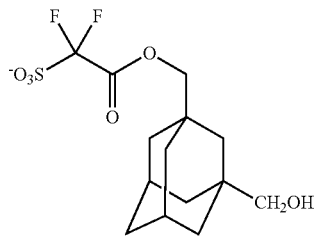
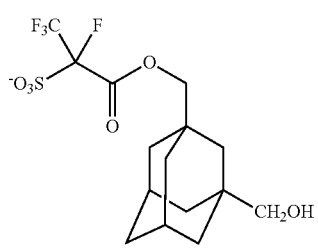
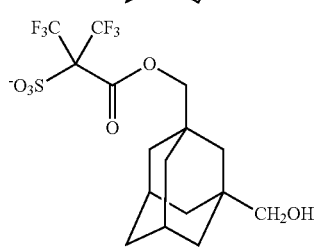
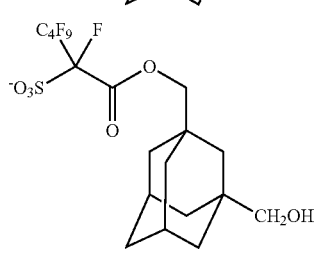
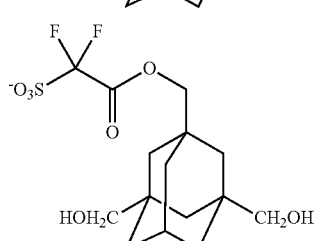
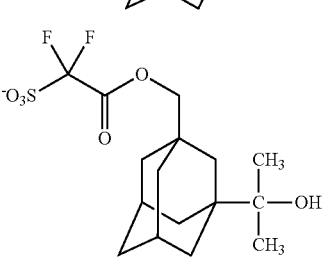
72
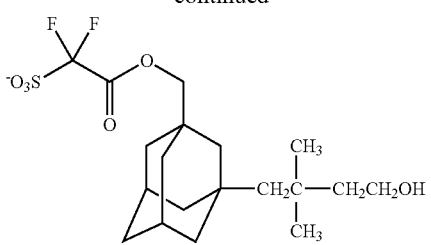
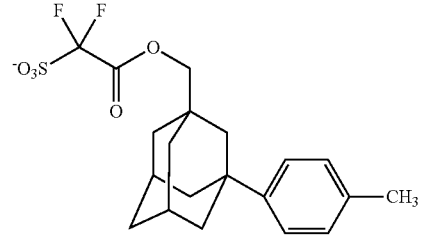
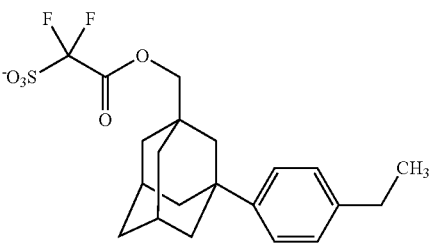
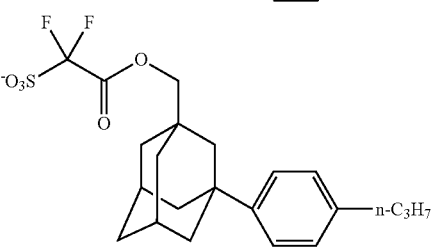
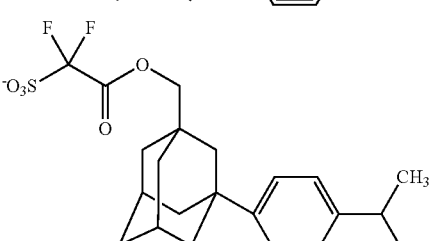
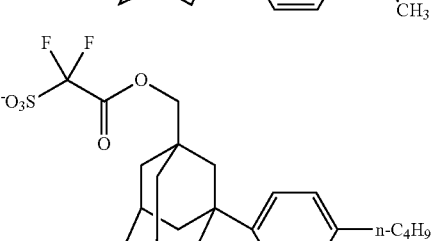
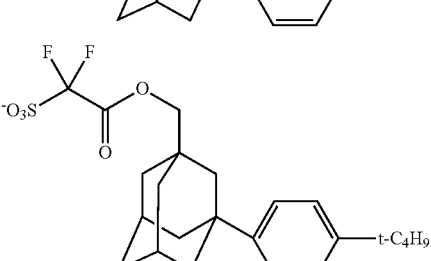

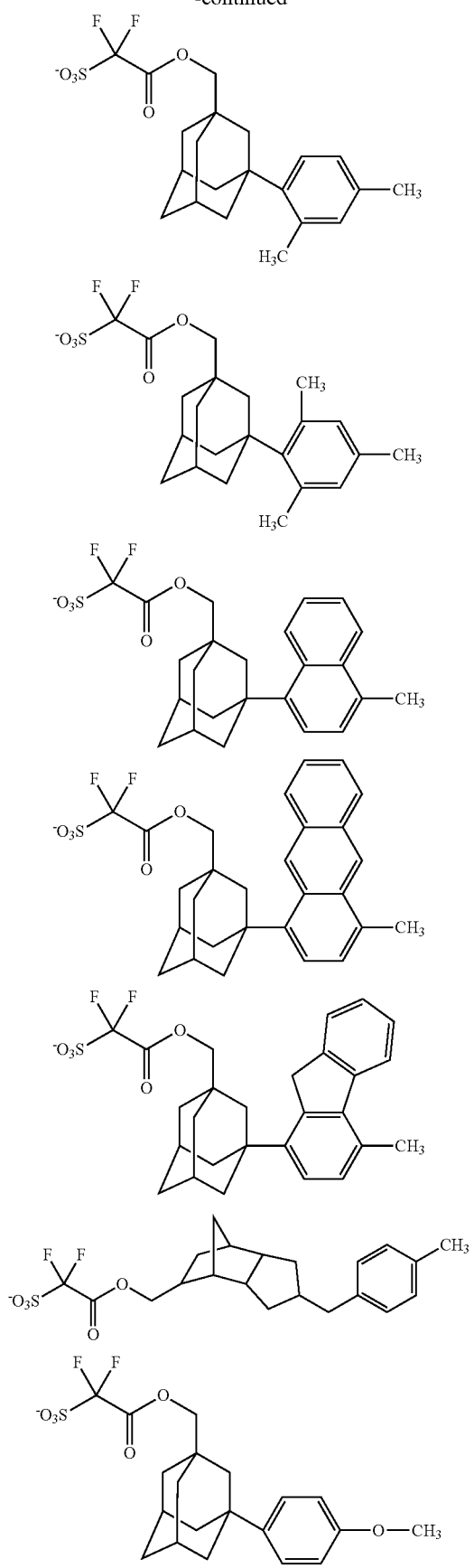
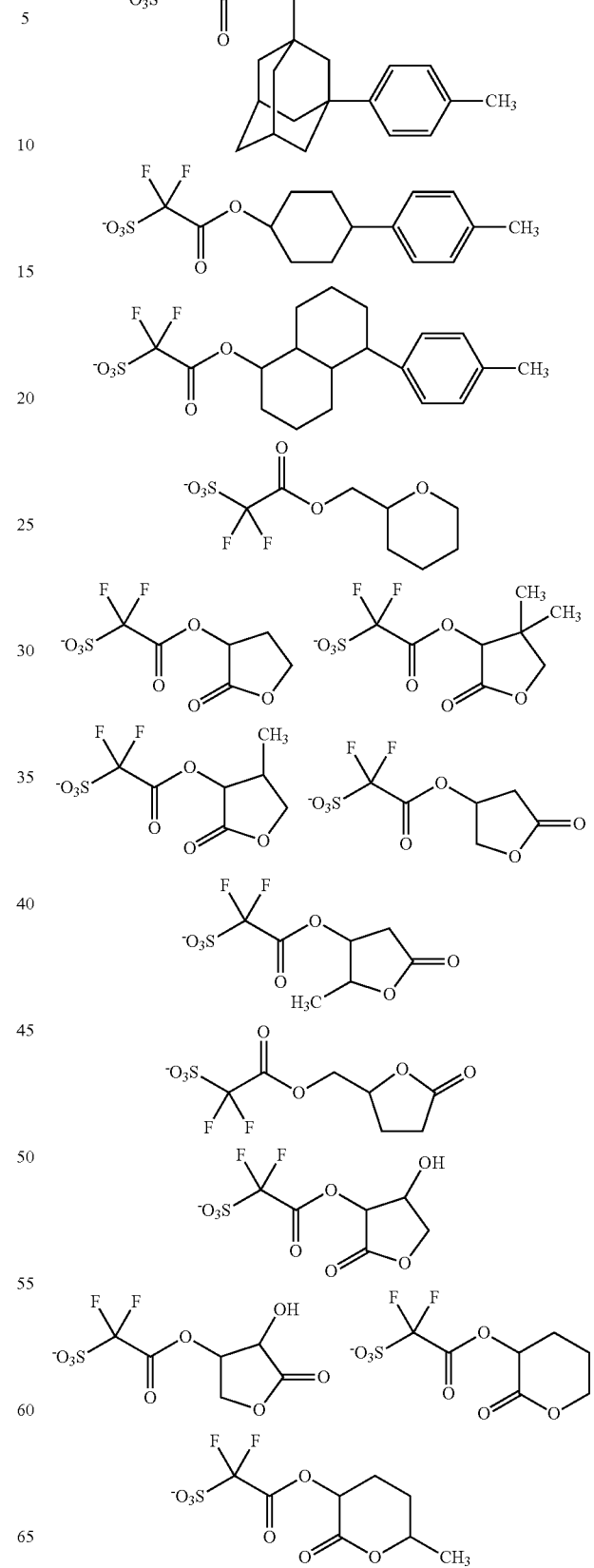

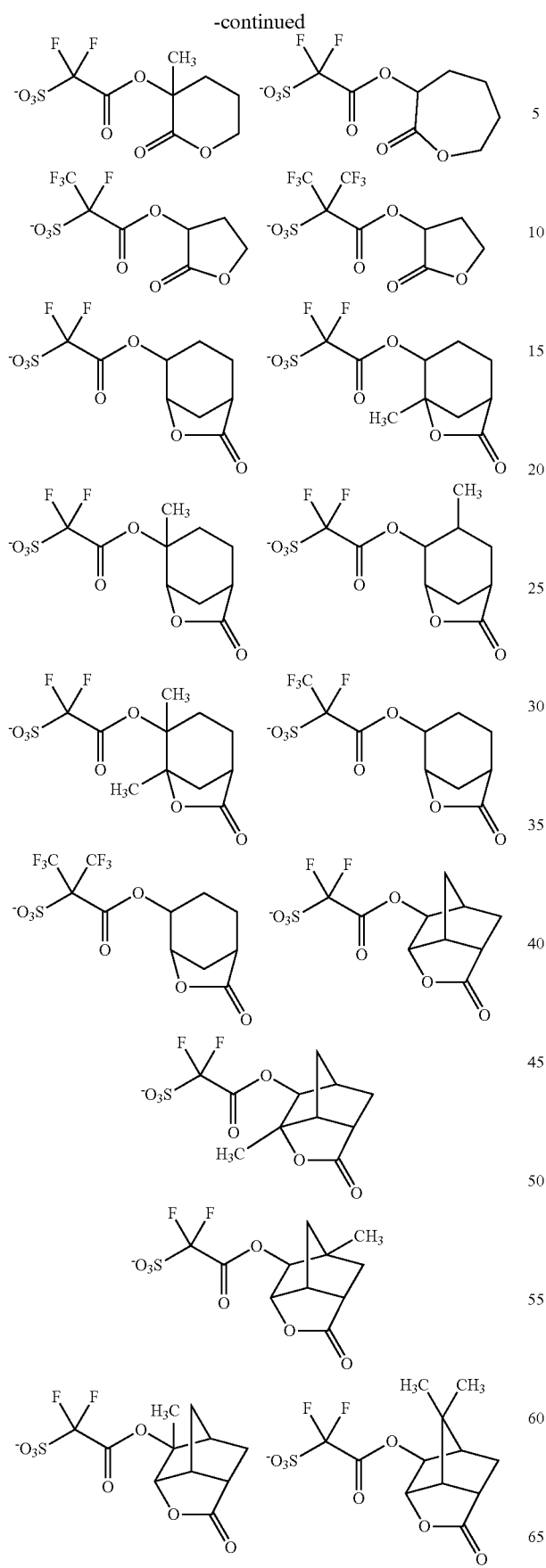
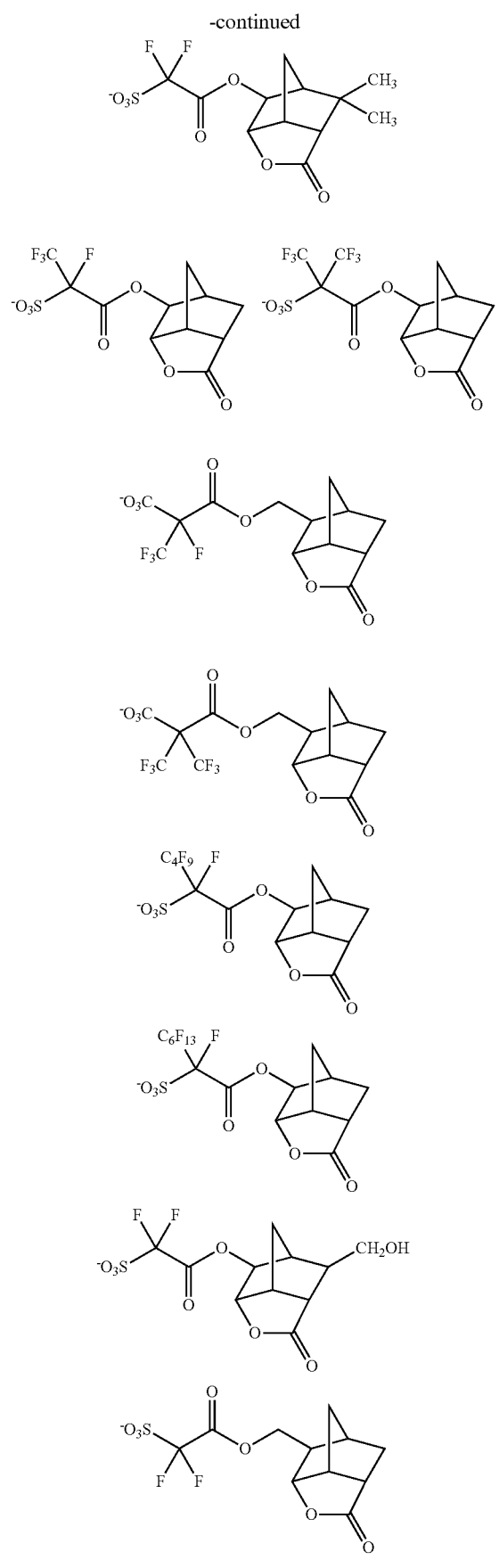

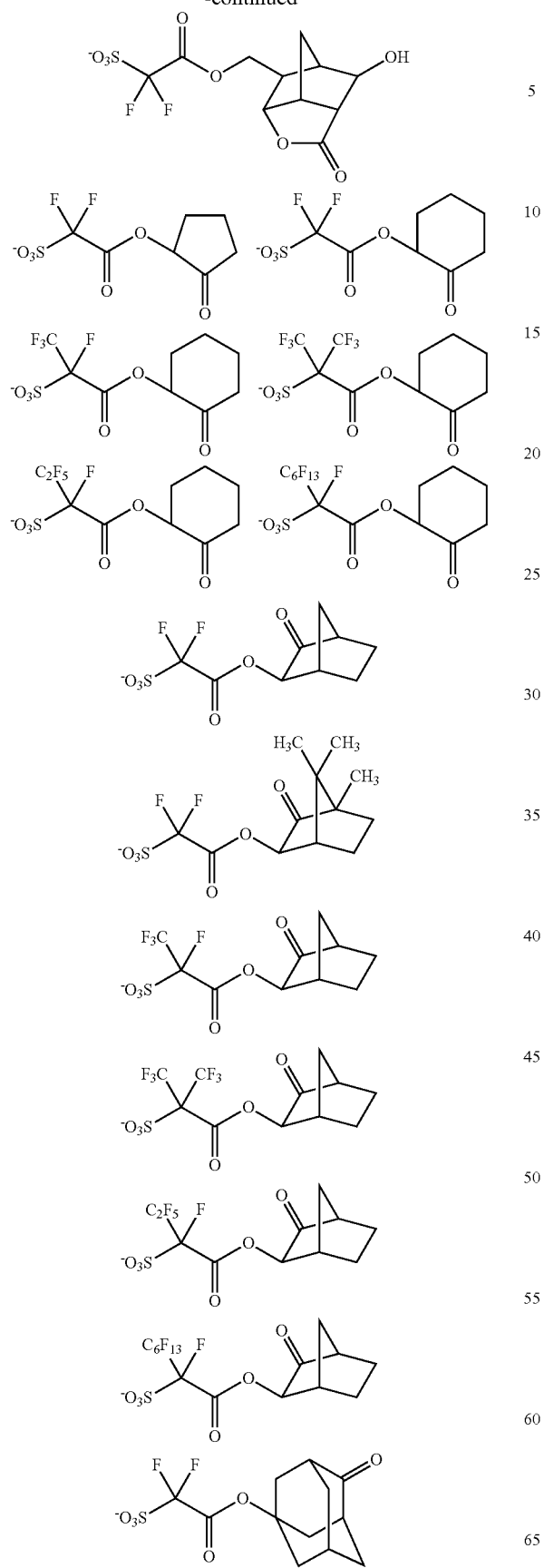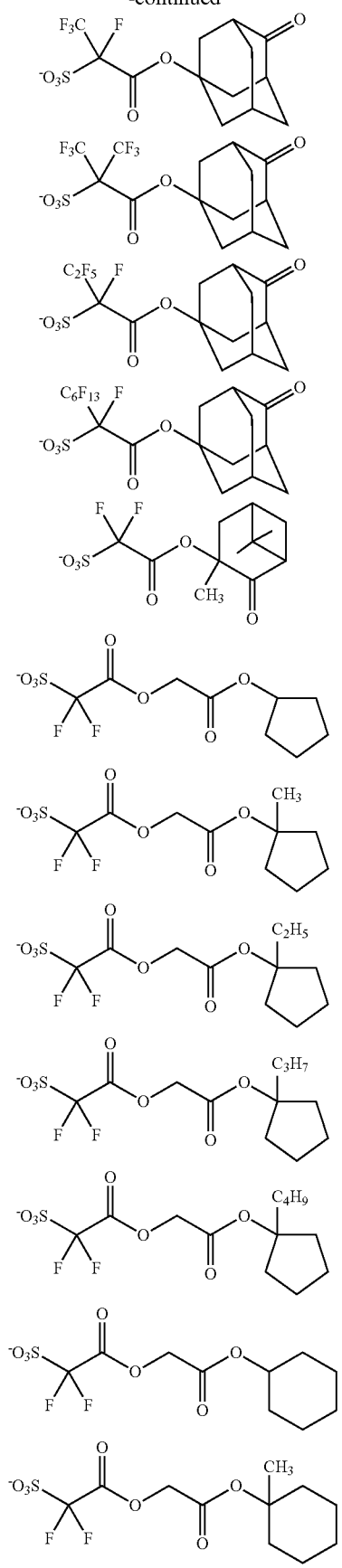

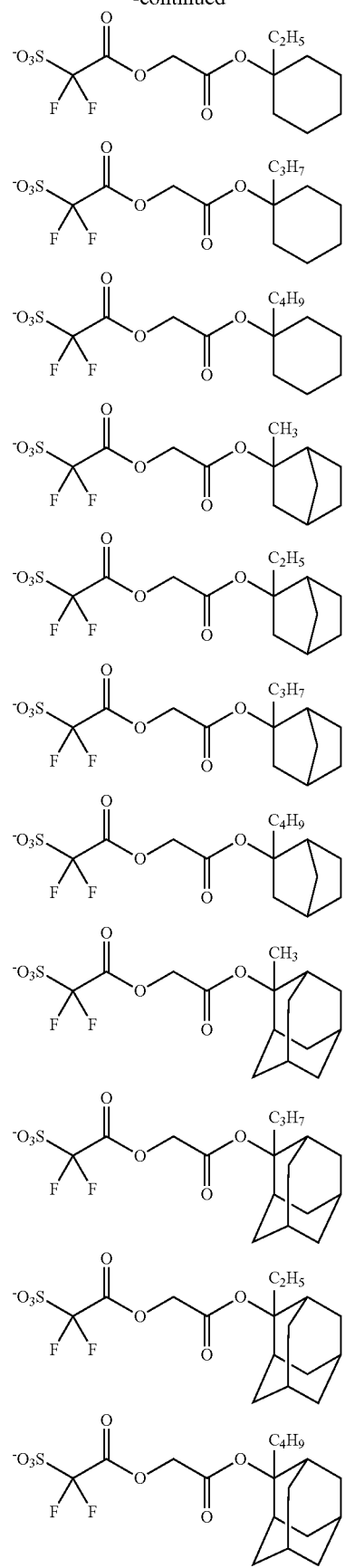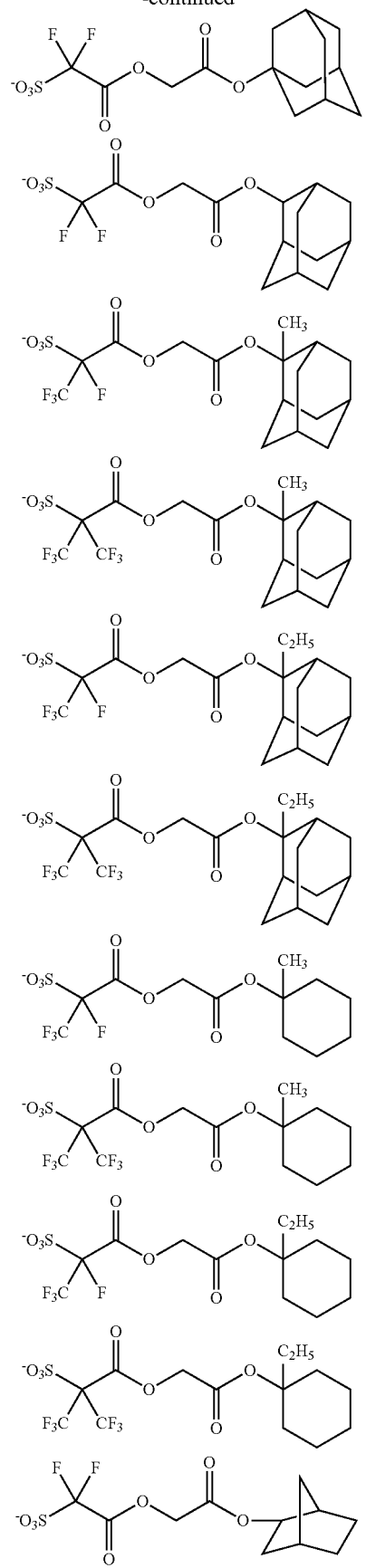

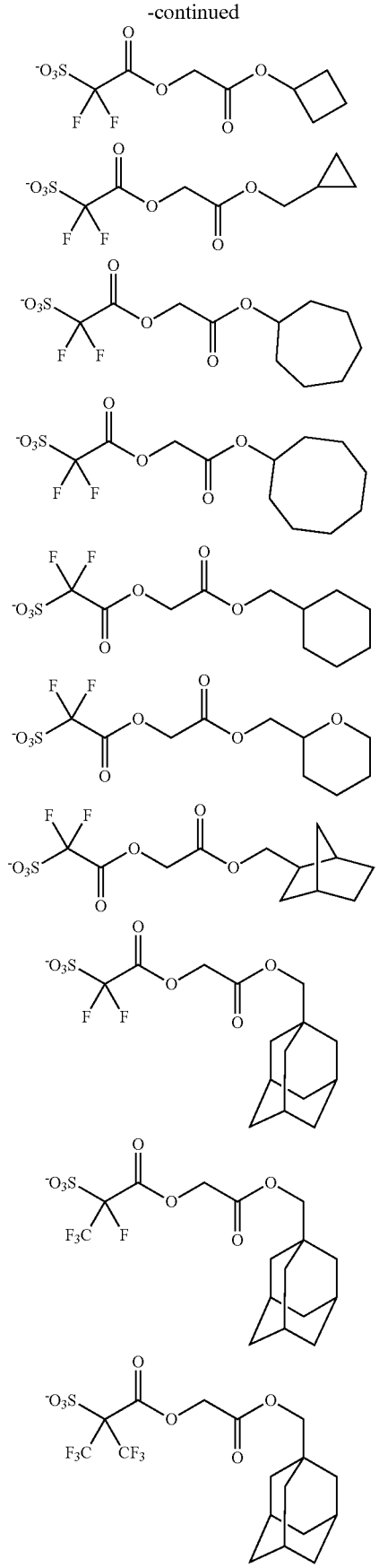
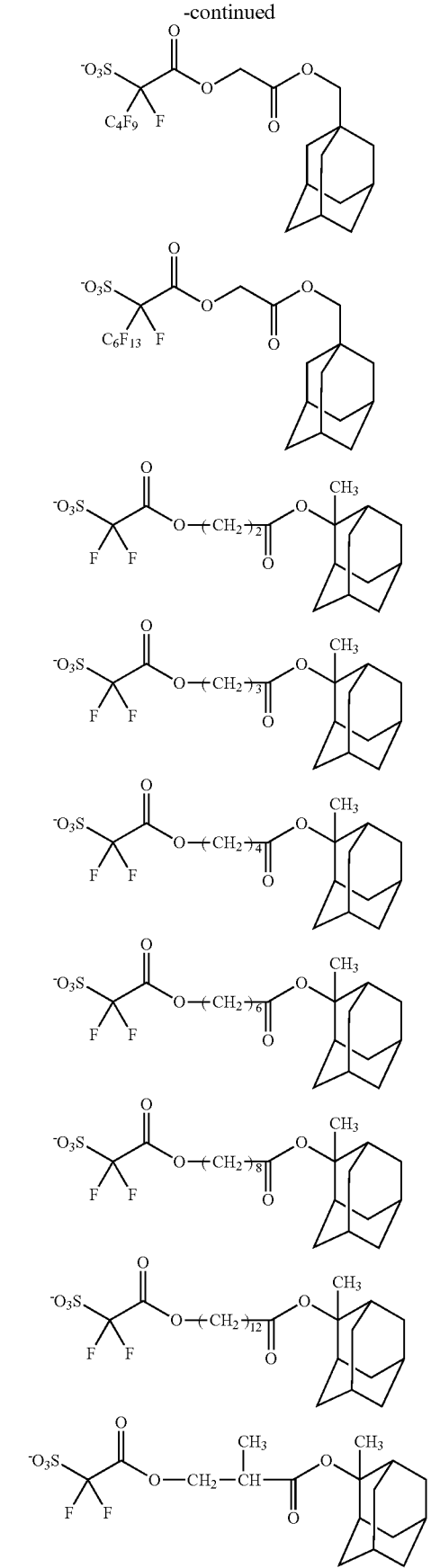

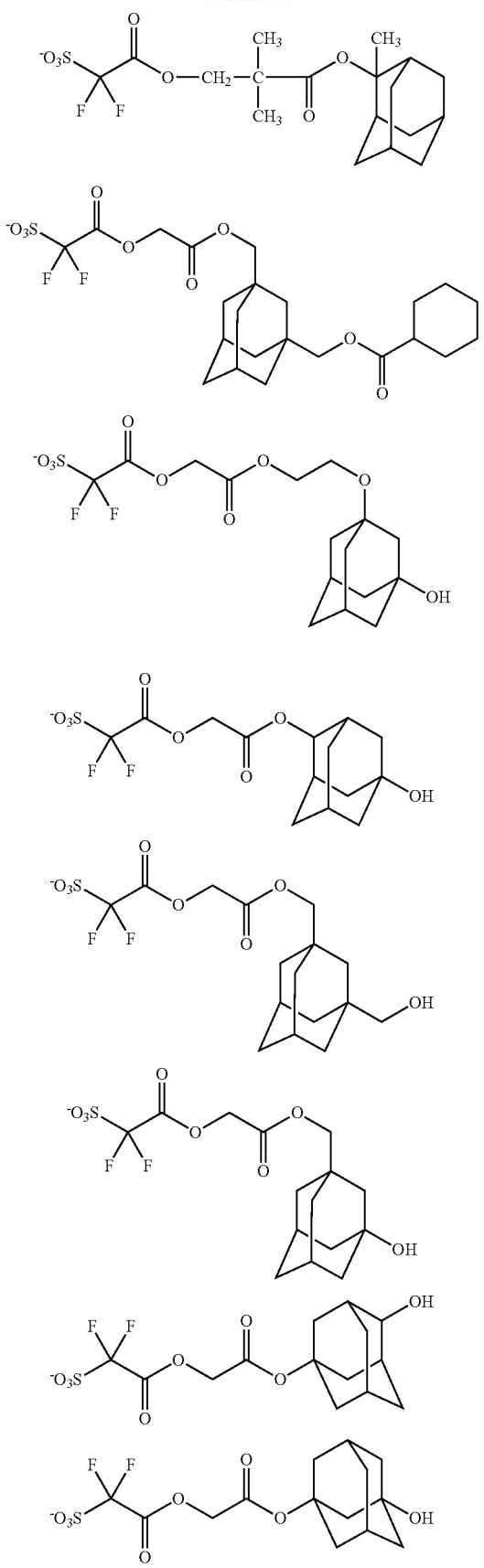
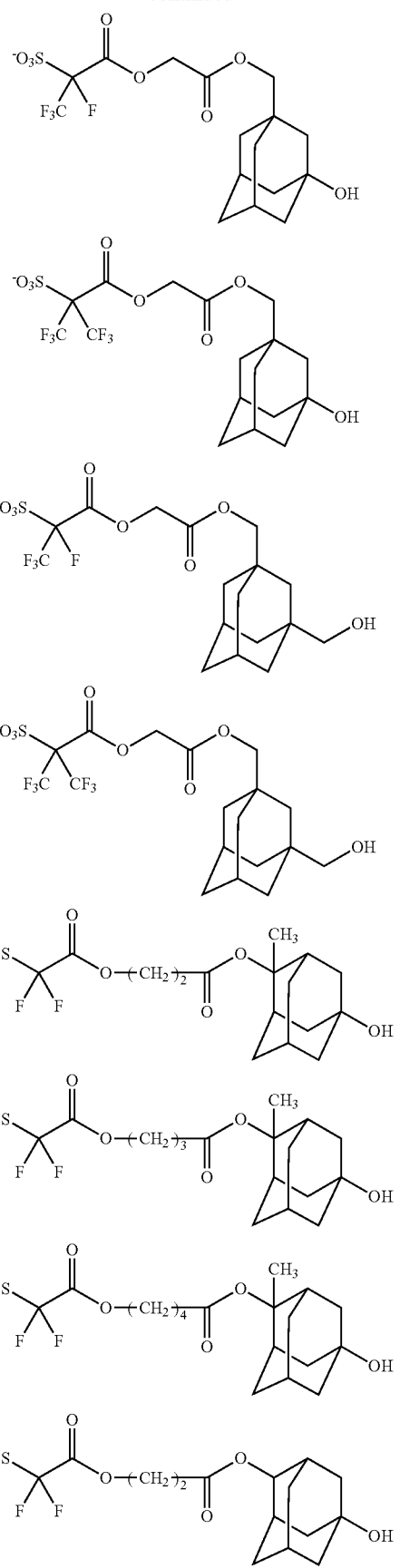

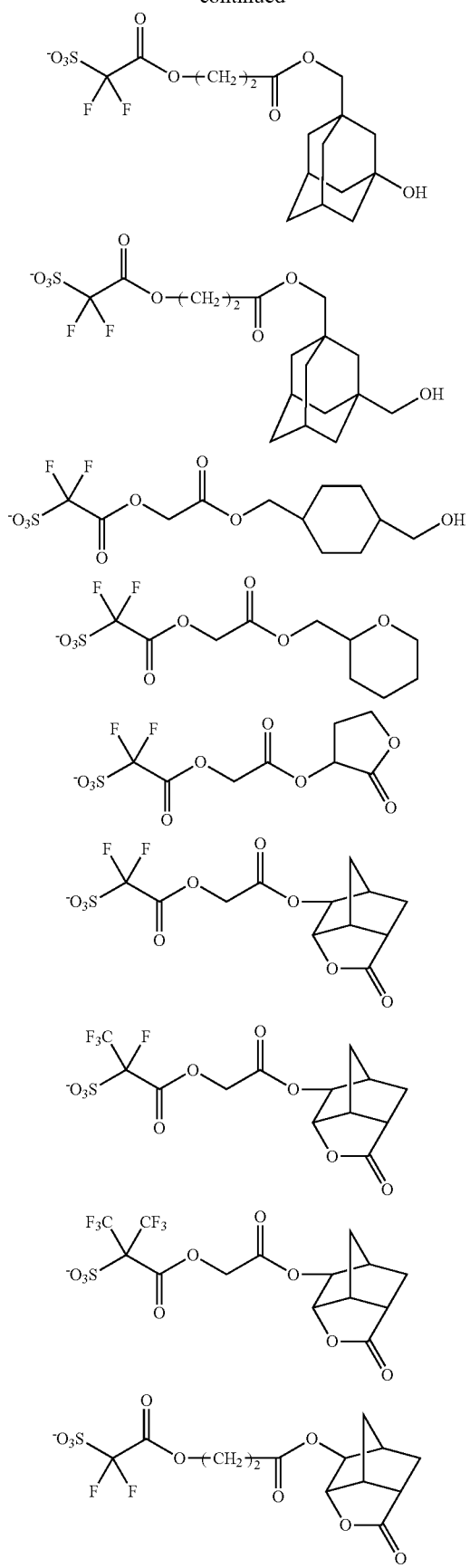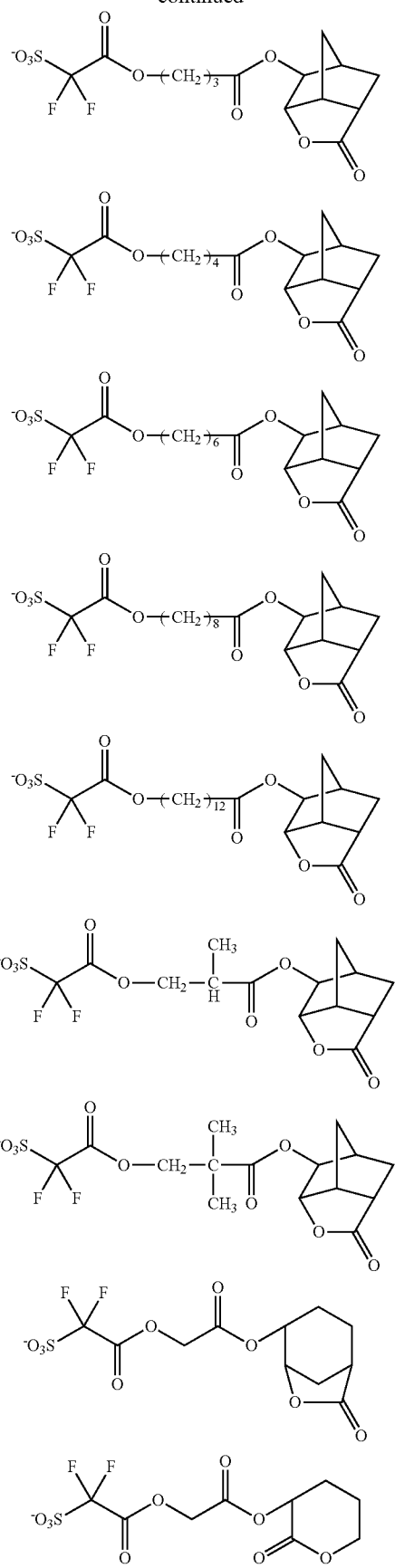

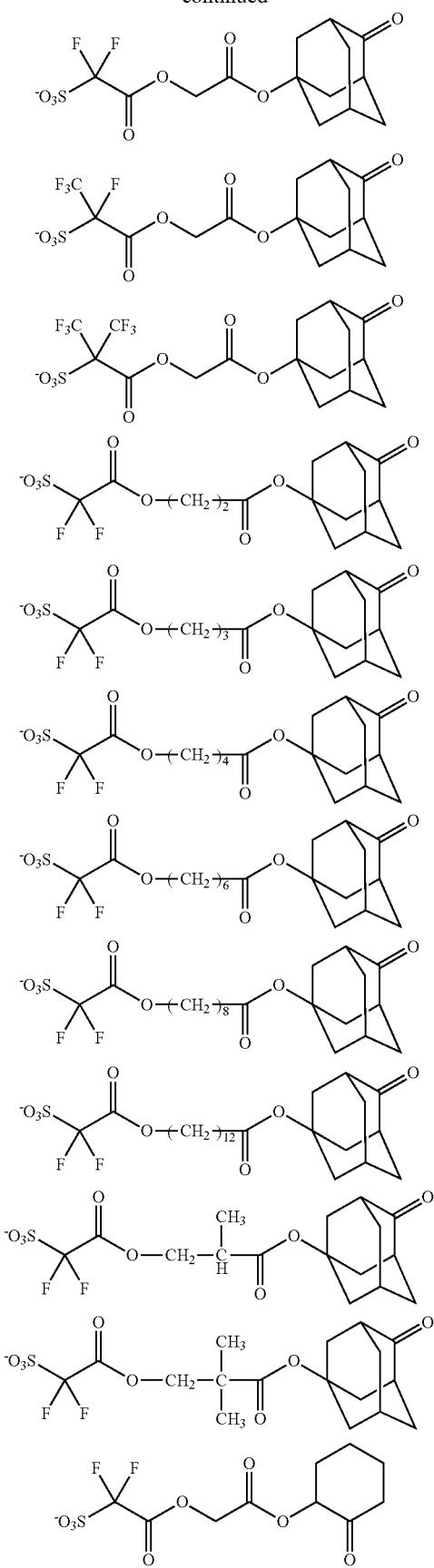
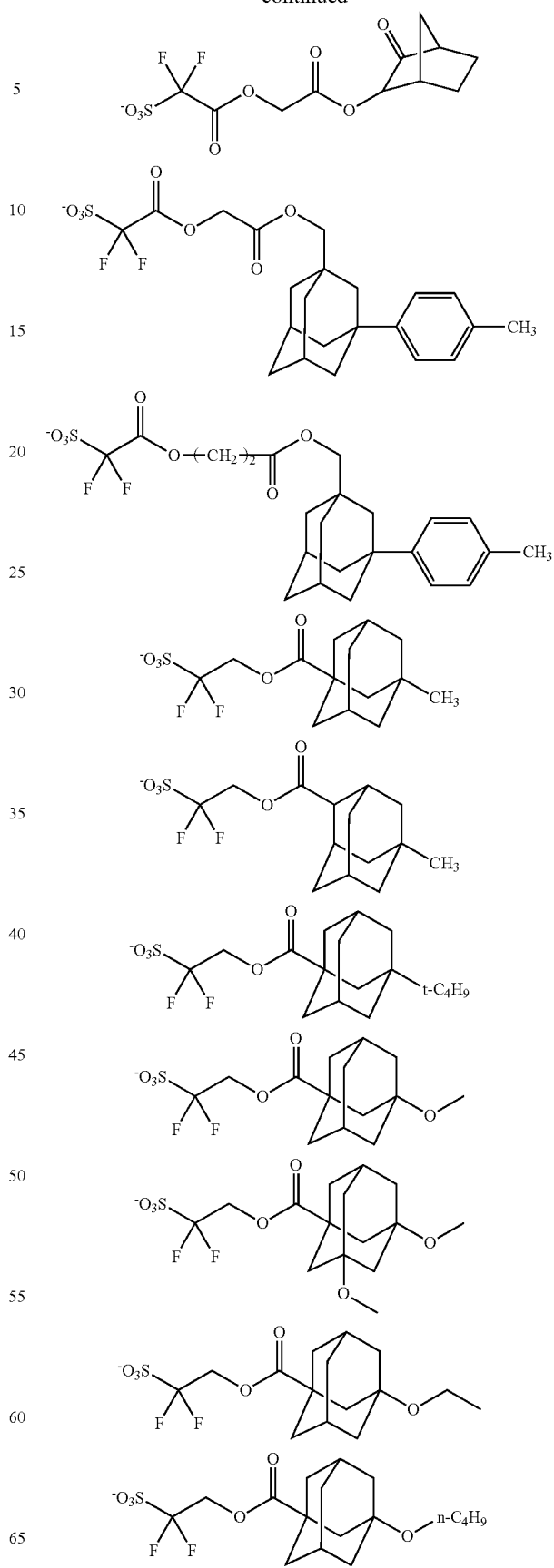

89
-continued
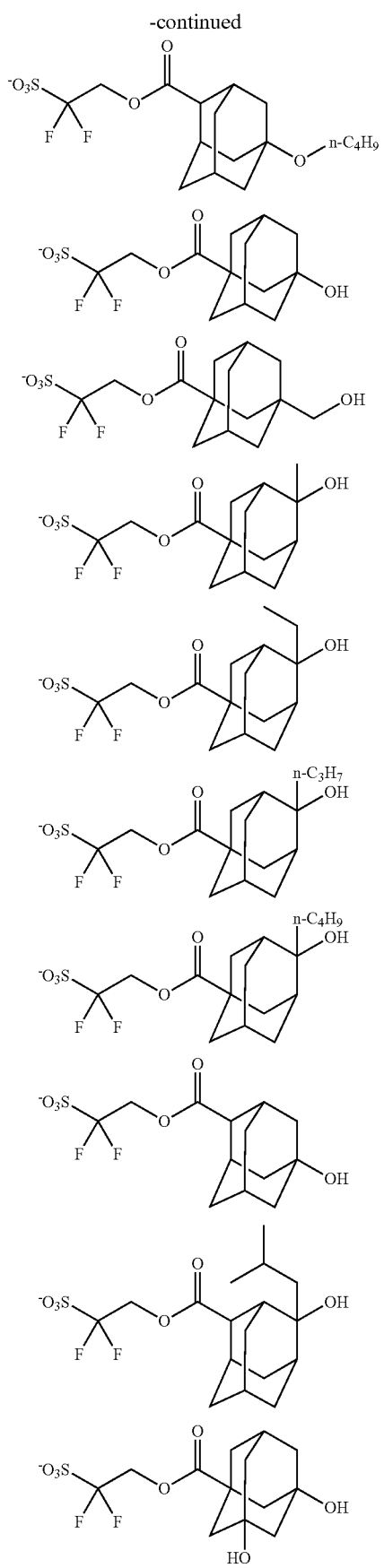
90
-continued
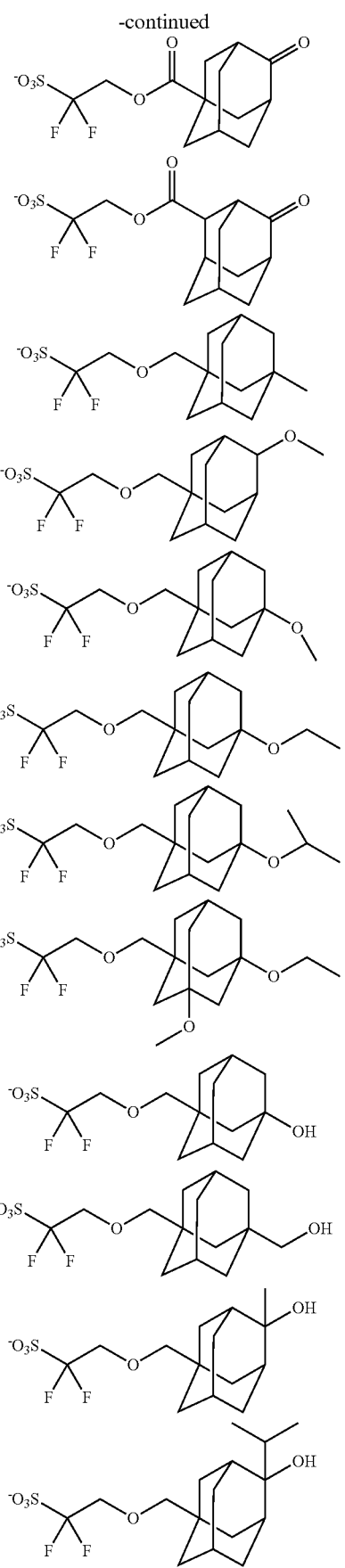

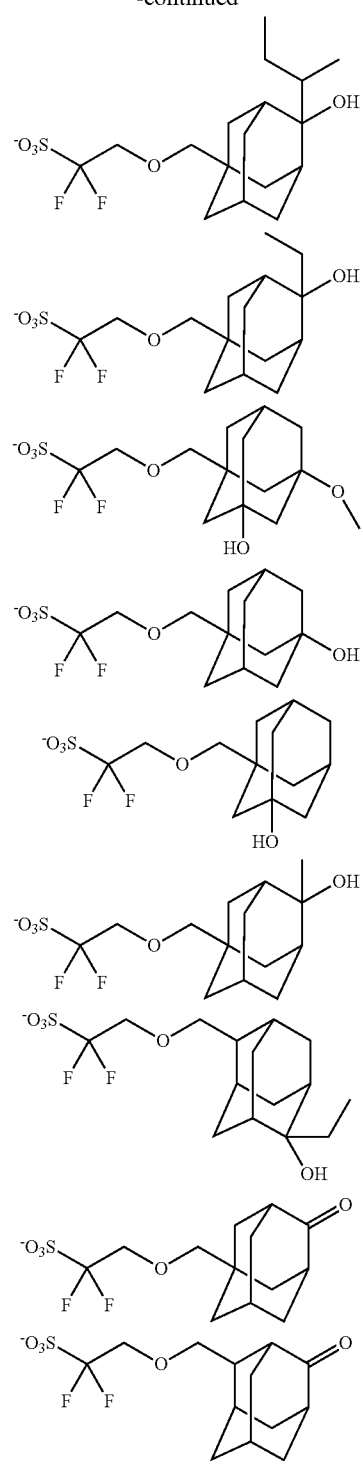

Among them, preferred are the following sulfonic anions.

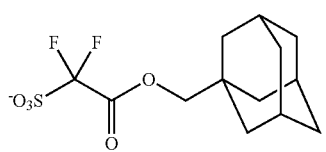

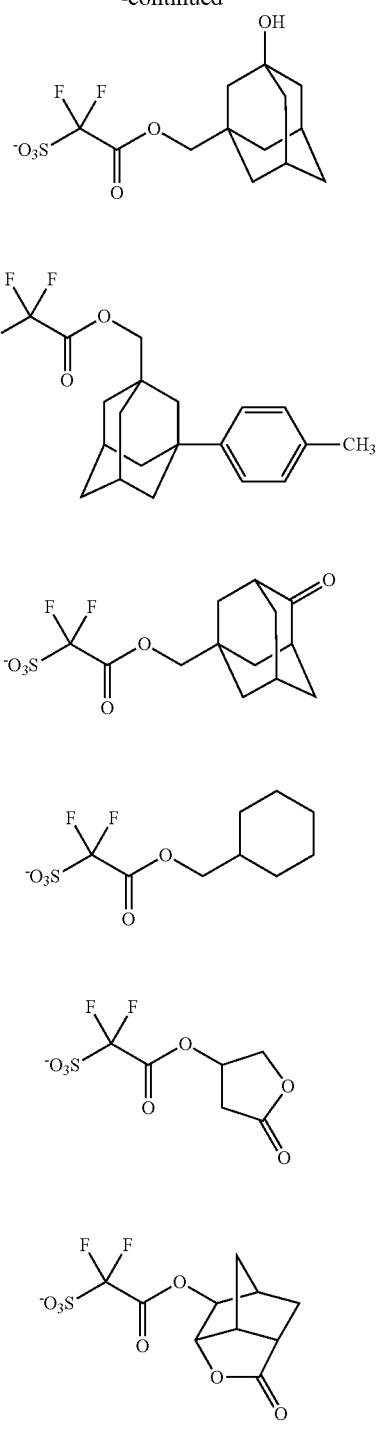

Examples of the organic counter ion represented by $Z^+$ in the salt represented by the formula (B1) include an onium cation such as a sulfonium cation, an iodonium cation, an ammonium cation, a benzothiazolium cation and a phosphonium cation, and a sulfonium cation and an iodonium cation are preferable, and an arylsulfonium cation is more preferable.

Preferable examples of the cation part represented by $Z^+$ include the cations represented by the formulae (b2-1) to (b2-4):

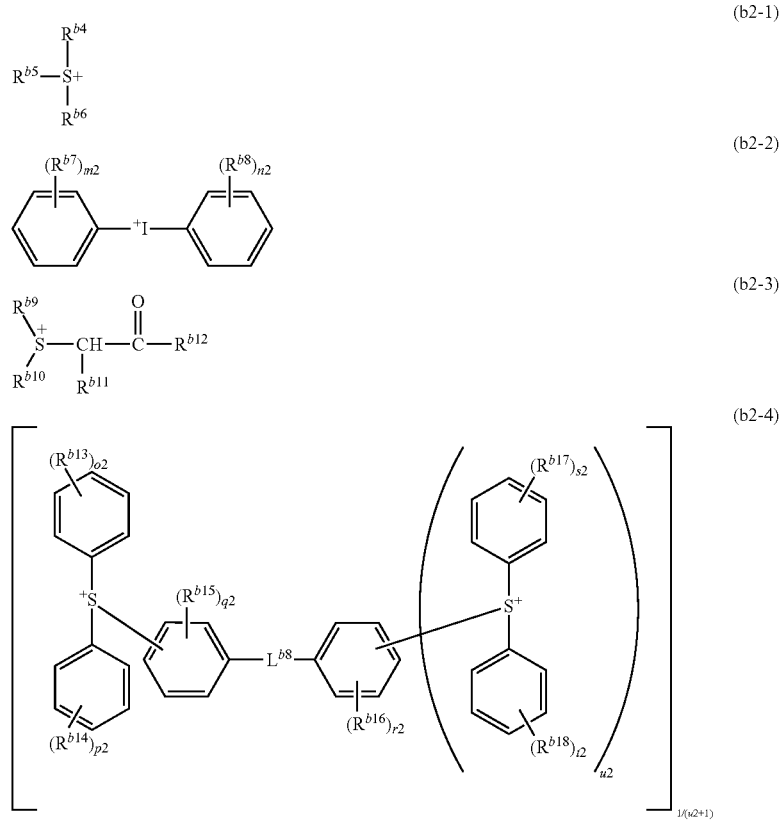

(b2-1)

(b2-2)

(b2-3)

(b2-4)

wherein $R^{b4}$, $R^{b5}$ and $R^{b6}$ independently represent a C1-C30 aliphatic hydrocarbon group which can have one or more substituents selected from the group consisting of a hydroxyl group, a C1-C12 alkoxy group and a C6-C18 aromatic hydrocarbon group, a C3-C36 saturated cyclic hydrocarbon group which can have one or more substituents selected from the group consisting of a halogen atom, a C2-C4 acyl group and a glycidyloxy group, or a C6-C18 aromatic hydrocarbon group which can have one or more substituents selected from the group consisting of a halogen atom, a hydroxyl group, a C1-C36 aliphatic hydrocarbon group, a C3-C36 saturated cyclic hydrocarbon group or a C1-C12 alkoxy group, $R^{b7}$ and $R^{b8}$ are independently in each occurrence a hydroxyl group, a C1-C12 aliphatic hydrocarbon group or a C1-C12 alkoxy group, m2 and n2 independently represents an integer of 0 to 5, $R^{b9}$ and $R^{b10}$ independently represent a C1-C36 aliphatic hydrocarbon group or a C3-C36 saturated cyclic hydrocarbon group, or $R^{b9}$ and $R^{b10}$ are bonded to form a C2-C11 divalent acyclic hydrocarbon group which forms a ring together with the adjacent $S^+$, and one or more —$CH_2$— in the divalent acyclic hydrocarbon group may be replaced by —CO—, —O— or —S—, and $R^{b11}$ represents a hydrogen atom, a C1-C36 aliphatic hydrocarbon group, a C3-C36 saturated cyclic hydrocarbon group or a C6-C18 aromatic hydrocarbon group, $R^{b12}$ represents a C1-C12 aliphatic hydrocarbon group, a C3-C18 saturated cyclic hydrocarbon group or a C6-C18 aromatic hydrocarbon group and the aromatic hydrocarbon group can have one or more substituents selected from the group consisting of a C1-C12 aliphatic hydrocarbon group, a C1-C12 alkoxy group, a C3-C18 saturated cyclic hydrocarbon group and an acyloxy group, or $R^{b11}$ and $R^{b12}$ are bonded each other to form a C1-C10 divalent acyclic hydrocarbon group which forms a 2-oxocycloalkyl group together with the adjacent —CHCO—, and one or more —$CH_2$— in the divalent acyclic hydrocarbon group may be replaced by —CO—, —O— or —S—, and $R^{b13}$, $R^{b14}$, $R^{b15}$, $R^{b16}$, $R^{b17}$ and $R^{b18}$ independently represent a hydroxyl group, a C1-C12 aliphatic hydrocarbon group or a C1-C12 alkoxy group, $L^{b11}$ represents —S— or —O— and o2, p2, s2 and t2 each independently represents an integer of 0 to 5, q2 and r2 each independently represents an integer of 0 to 4, and u2 represents 0 or 1.

The aliphatic hydrocarbon group represented by $R^{b9}$ to $R^{b11}$ has preferably 1 to 12 carbon atoms. The saturated cyclic hydrocarbon group represented by $R^{b9}$ to $R^{b11}$ has preferably 3 to 36 carbon atoms and more preferably 4 to 12 carbon atoms.

Examples of the aliphatic hydrocarbon group and the aromatic hydrocarbon group include the same as described above. Preferable examples of the aliphatic hydrocarbon group include a methyl group, an ethyl group, a propyl group, an isopropyl group, a butyl group, a sec-butyl group, a tert-butyl group, a pentyl group, a hexyl group, an octyl group and a 2-ethylhexyl group. A C4-C12 cyclic aliphatic hydrocarbon group is preferable. Preferable examples of the cyclic aliphatic hydrocarbon group include a cyclopropyl group, a cyclobutyl group, a cyclopentyl group, a cyclohexyl group, a cycloheptyl group, a cyclodecyl group, a 2-alkyl-a-adamantyl group, a 1-(1-adamantyl)-1-alkyl group and an isobornyl group. Preferable examples of the aromatic group include a phenyl group, a 4-methylphenyl group, a 4-ethylphenyl group, a 4-tert-butylphenyl group, a 4-cyclohexylphenyl group, a 4-methoxyphenyl group, a biphenyl group and a naphthyl group. Examples of the aliphatic hydrocarbon group having an aromatic hydrocarbon group include a benzyl group. Examples of the alkoxy group include a methoxy group, an ethoxy group, a propoxy group, an isopropoxy group, a butoxy group, a sec-butoxy group, a tert-butoxy group, a pentyloxy group, a hexyloxy group, a heptyloxy group, an octyloxy group, a 2-ethylhexyloxy group, a nonyloxy group, a decyloxy group, an undecyloxy group and a dodecyloxy group.

Examples of the C3-C12 divalent acyclic hydrocarbon group formed by bonding $R^{b9}$ and $R^{b10}$ include a trimethylene group, a tetramethylene group and a pentamethylene group. Examples of the ring group formed together with the adjacent $S^+$ and the divalent acyclic hydrocarbon group include a thiolan-1-ium ring (tetrahydrothiphenium ring), a thian-1-ium ring and a 1,4-oxathian-4-ium ring. A C3-C7 divalent acyclic hydrocarbon group is preferable.

Examples of the C1-C10 divalent acyclic hydrocarbon group formed by bonding $R^{b11}$ and $R^{b12}$ include a methylene group, an ethylene group, a trimethylene group, a tetramethylene group and a pentamethylene group and examples of the ring group include the followings.

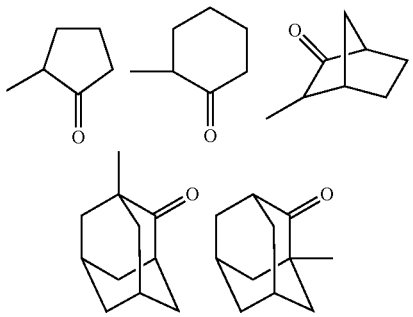

A C1-C5 divalent acyclic hydrocarbon group is preferable.

Among the above-mentioned cations, preferred is the cation represented by the formula (b2-1), and more preferred is the cation represented by the formula (b2-1-1). A triphenylsulfonium cation is especially preferable.

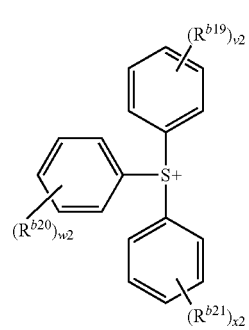

(b2-1-1)

wherein $R^{b19}$, $R^{b20}$ and $R^{b21}$ are independently in each occurrence a halogen atom, a hydroxyl group, a C1-C36 aliphatic hydrocarbon group, a C3-C36 saturated cyclic hydrocarbon group or a C1-C12 alkoxy group, and one or more hydrogen atoms of the aliphatic hydrocarbon group can be replaced by a hydroxyl group, a C1-C12 alkoxy group or a C6-C18 aromatic hydrocarbon group, and one or more hydrogen atoms of the saturated cyclic hydrocarbon group can be replaced by a halogen atom, a glycidyloxy group or a C2-C4 acyl group, and v2, w2 and x2 independently each represent an integer of 0 to 5.

The aliphatic hydrocarbon group has preferably 1 to 12 carbon atoms, and the saturated cyclic hydrocarbon group has preferably 4 to 36 carbon atoms, and v2, w2 and x2 independently each preferably represent 0 or 1.

It is preferred that $R^{b19}$, $R^{b20}$ and $R^{b21}$ are independently in each occurrence a halogen atom, a hydroxyl group, a C1-C12 alkyl group or a C1-C12 alkoxy group and v2, w2 and x2 independently each represent an integer of 0 to 5, and it is more preferred that $R^{b19}$, $R^{b20}$ and $R^{b21}$ are independently in each occurrence a fluorine atom, a hydroxyl group, a C1-C12 alkyl group or a C1-C12 alkoxy group, and v2, w2 and x2 independently each preferably represent 0 or 1.

Examples of the cation represented by the formula (b2-1) include the followings.

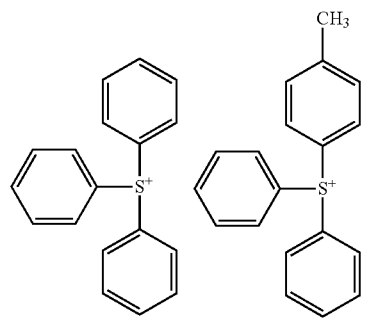

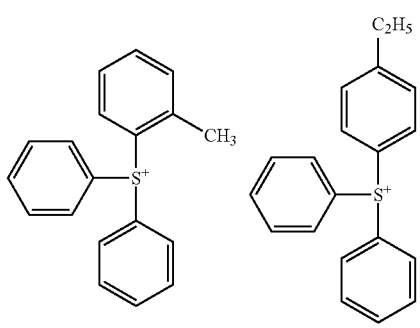

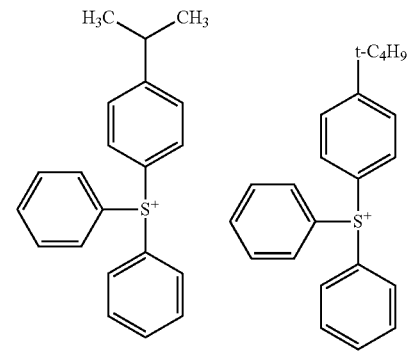

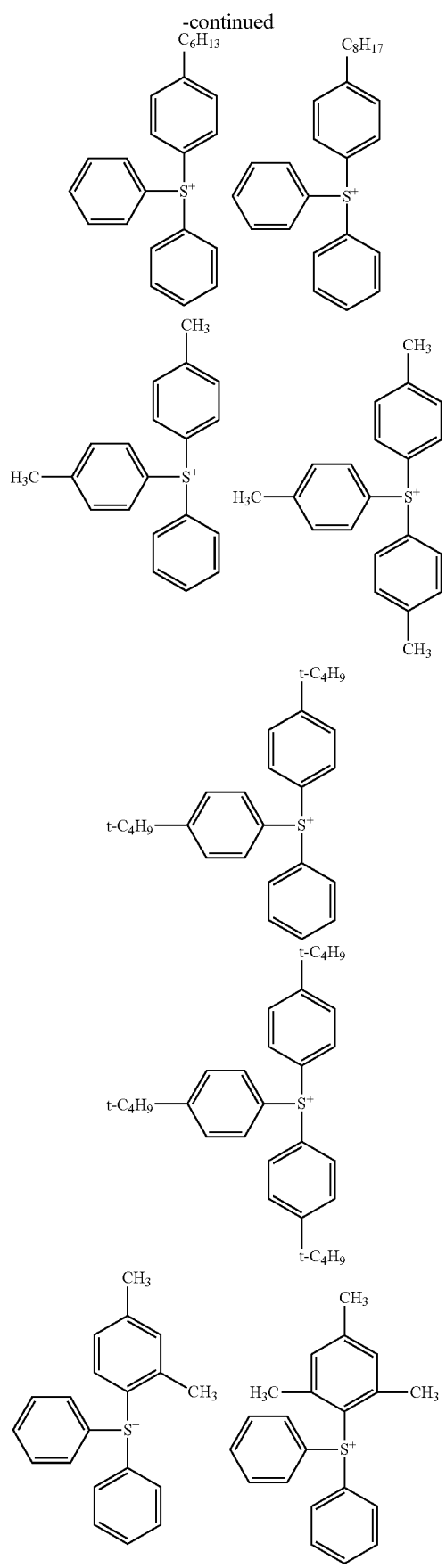
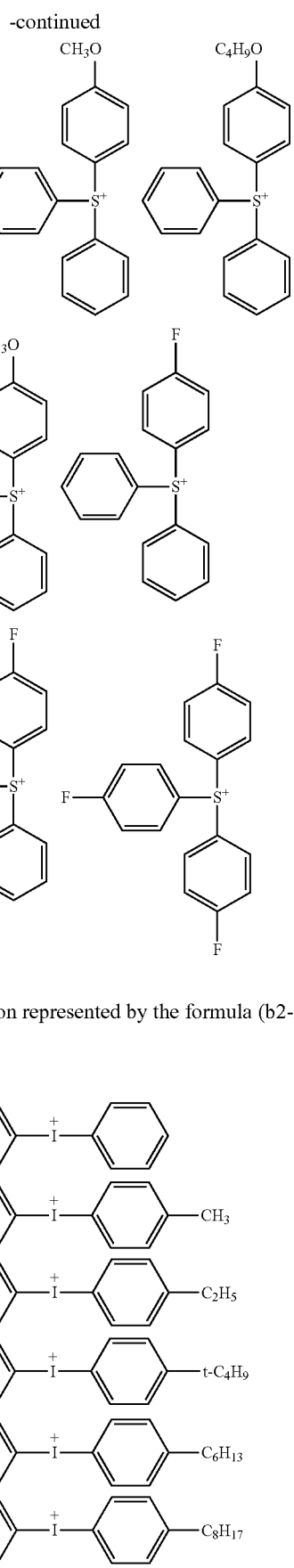
Examples of the cation represented by the formula (b2-2) include the followings.
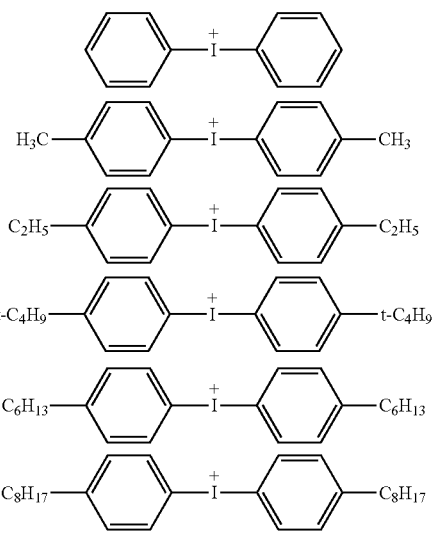

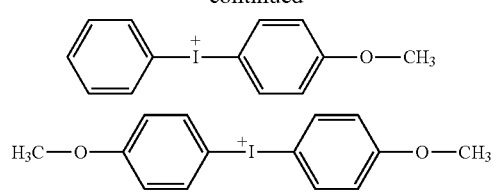
Examples of the cation represented by the formula (b2-3) include the followings.
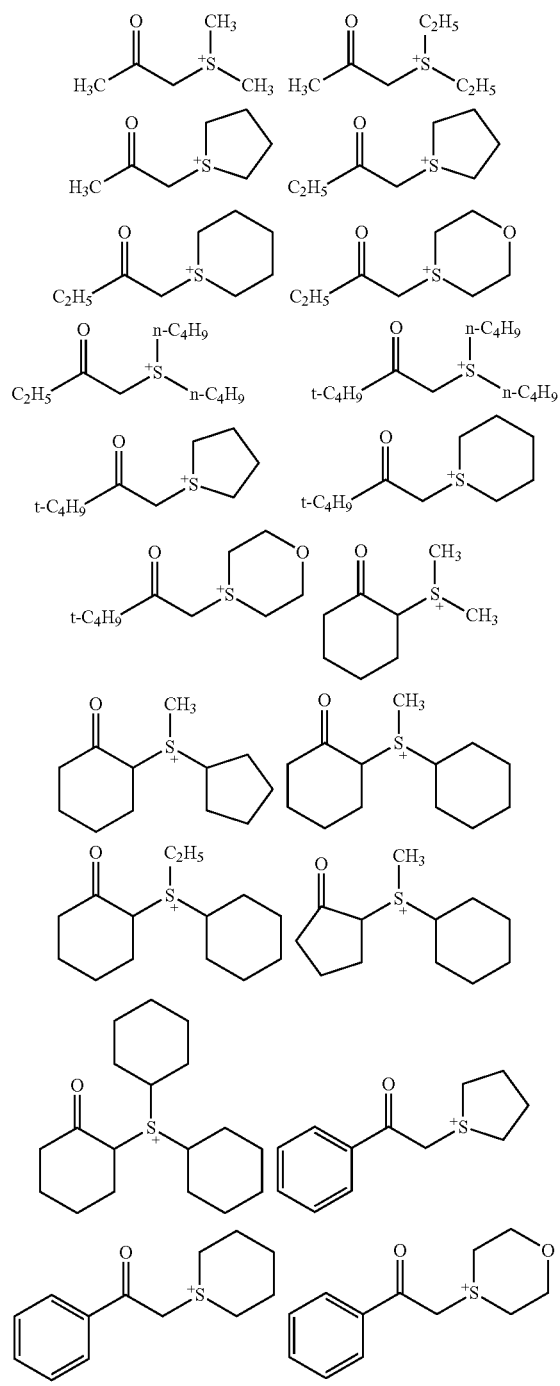
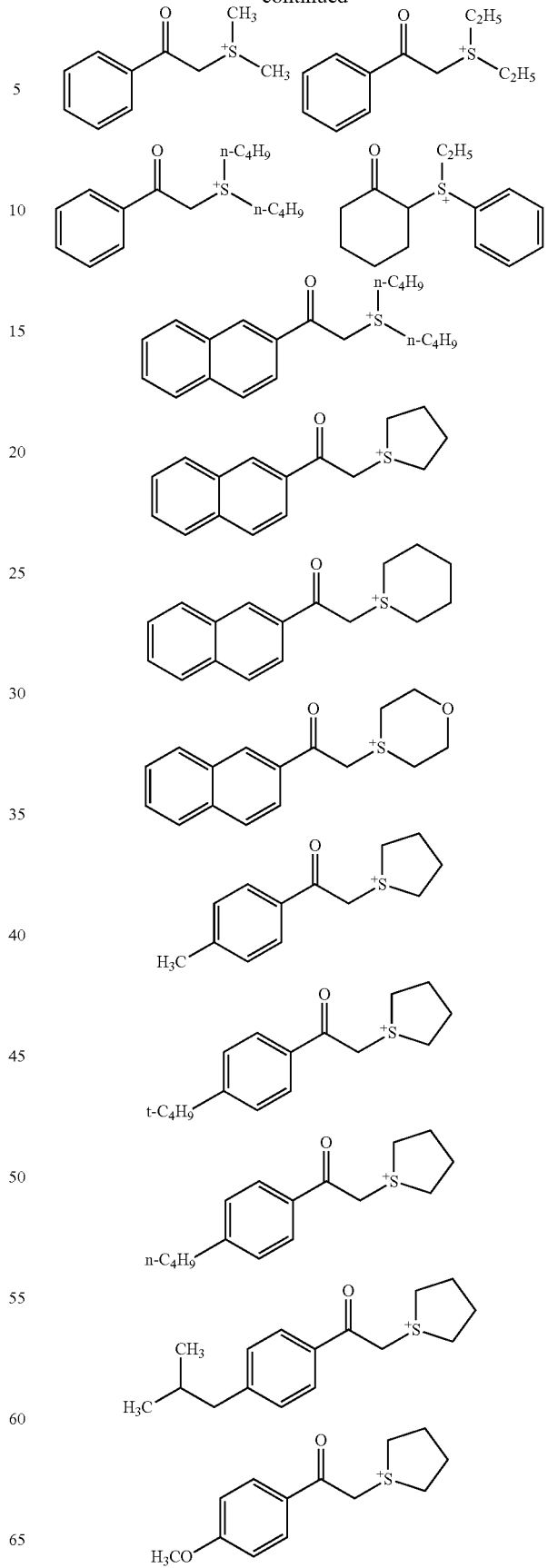

-continued
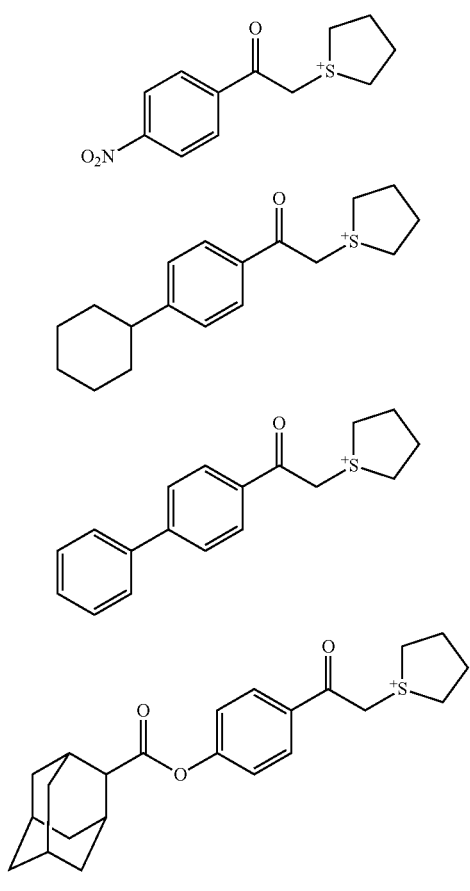
Examples of the cation represented by the formula (b2-4) include the followings.
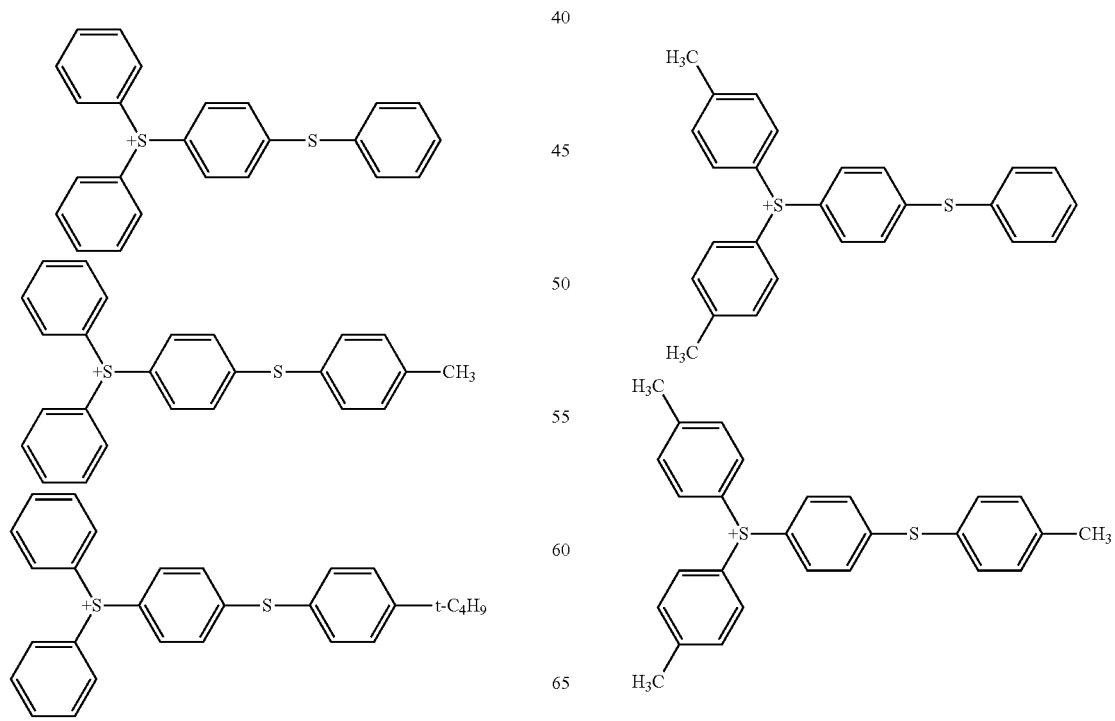
-continued
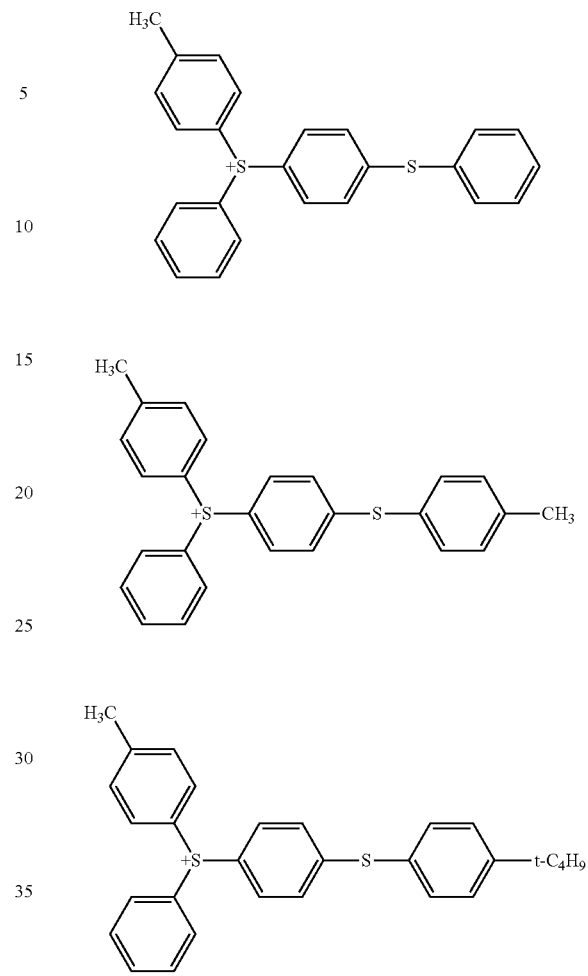

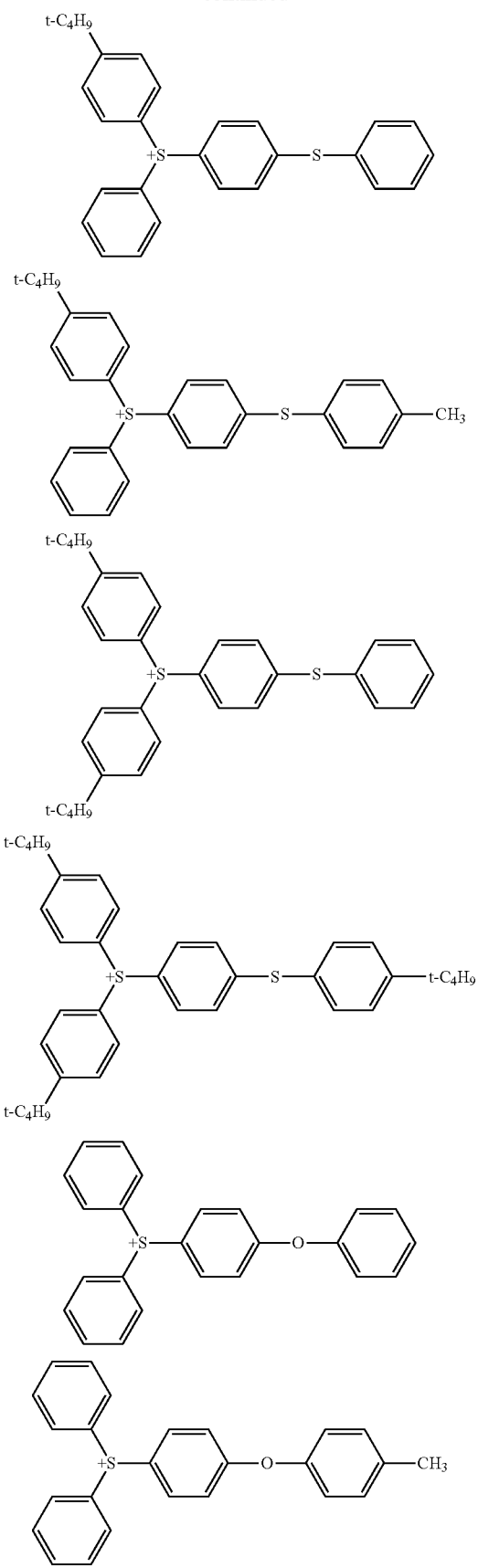
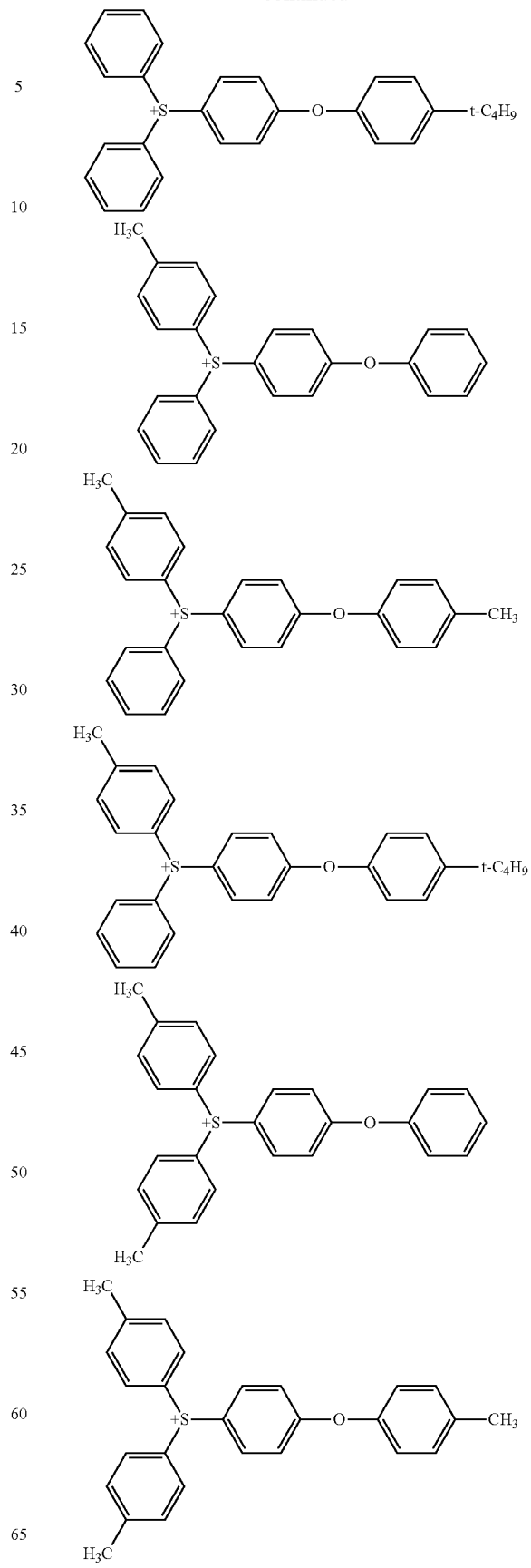

105
-continued
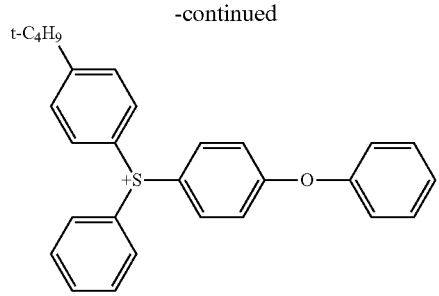
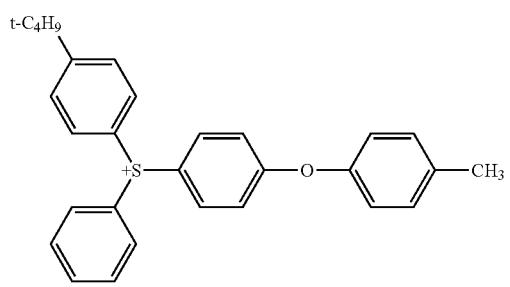
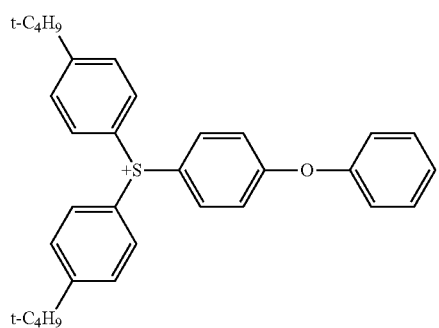
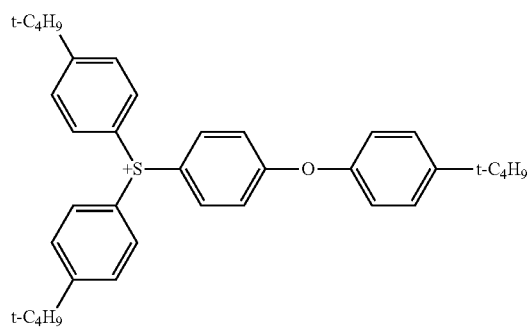
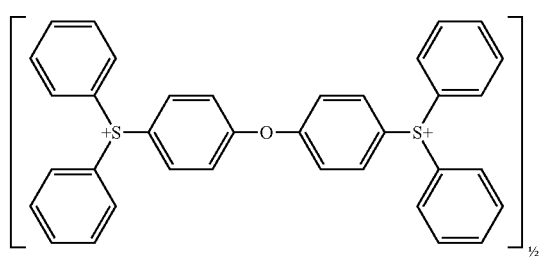
106
-continued
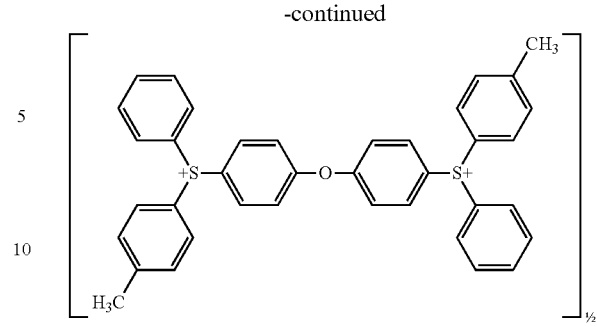
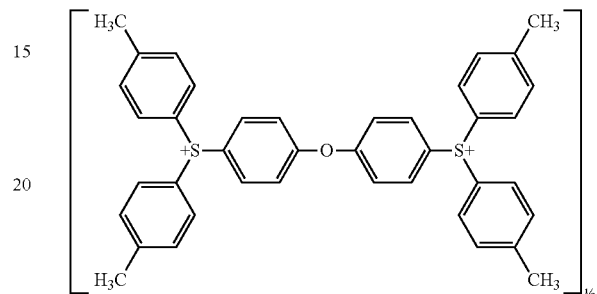
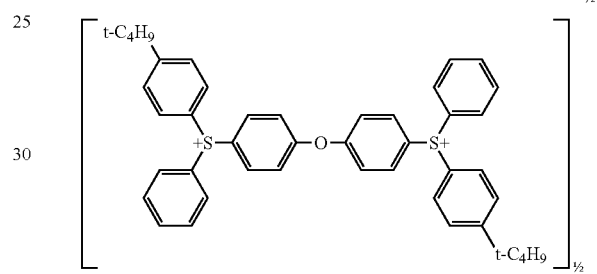
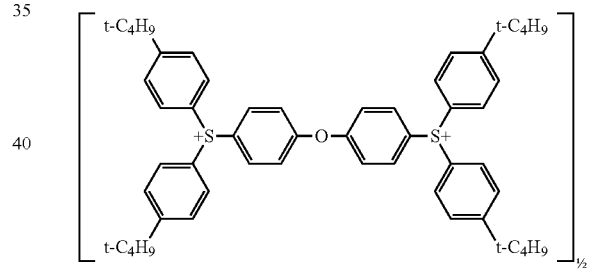
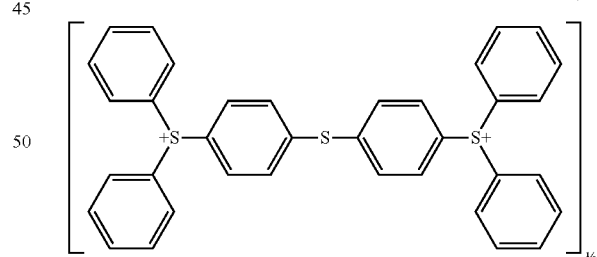
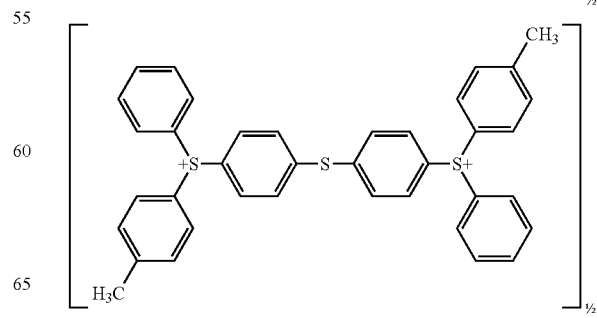

-continued

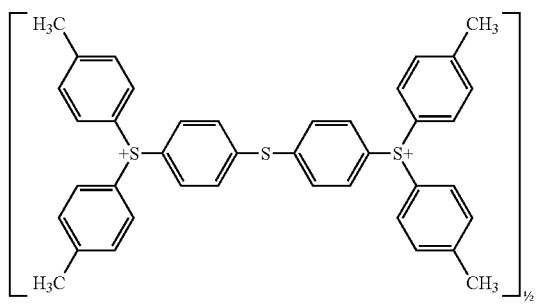

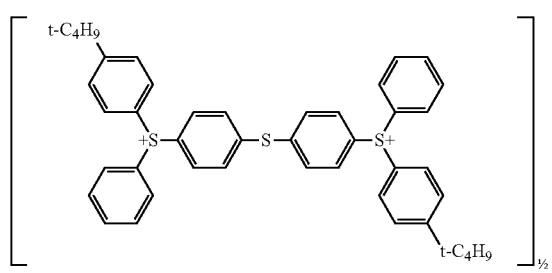

Examples of the salt represented by the formula (B1) include a salt wherein the anion part is any one of the above-mentioned anion parts and the cation part is any one of the above-mentioned cation parts. Preferable examples of the salt include a combination of any one of anions represented by the formulae (b1-1-1) to (b1-1-9) and the cation represented by the formulae (b2-1-1), and a combination of any one of anions represented by the formulae (b1-1-3) to (b1-1-5) and the cation represented by the formulae (b2-3).

The salt represented by the formulae (B1-1) to (B1-17) are preferable, and the salt represented by the formulae (B1-1), (B1-2), (B1-6), (B1-11), (B1-12), (B1-13) and (B1-14) are more preferable.

(B1-1)

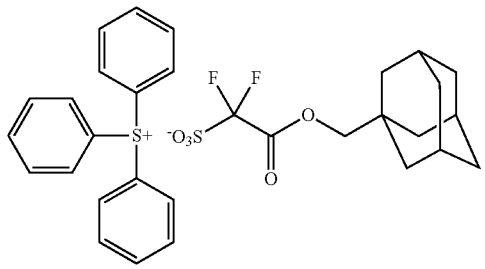

-continued (B1-2)

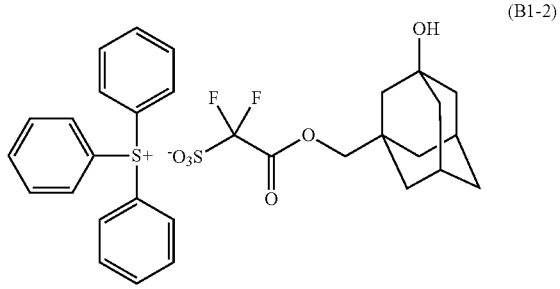

(B1-3)

(B1-4)

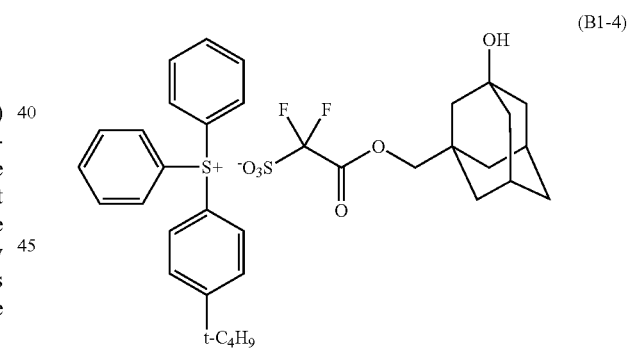

(B1-5)

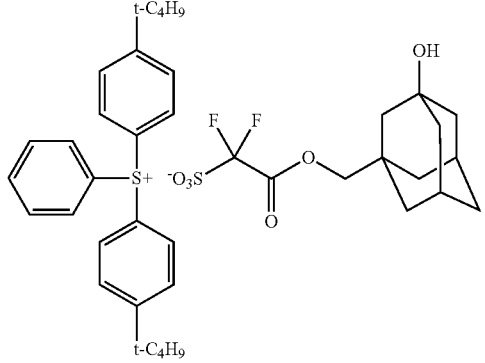

(B1-6)
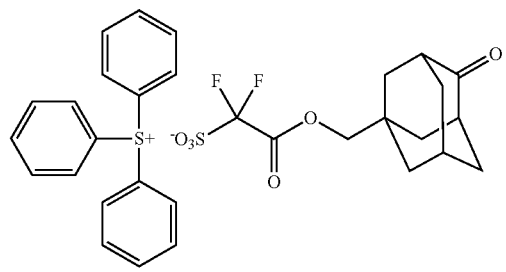
(B1-7)
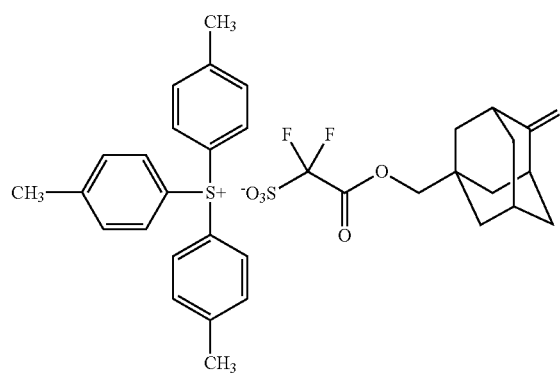
(B1-8)
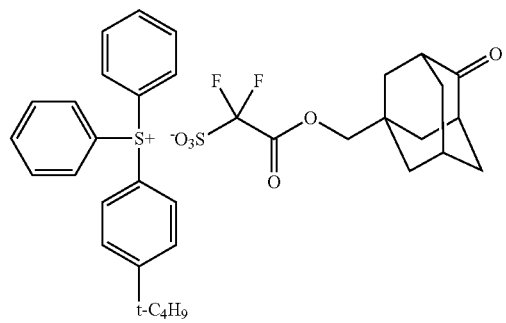
(B1-9)
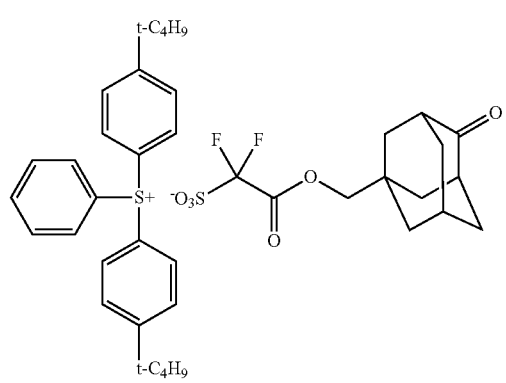
(B1-10)
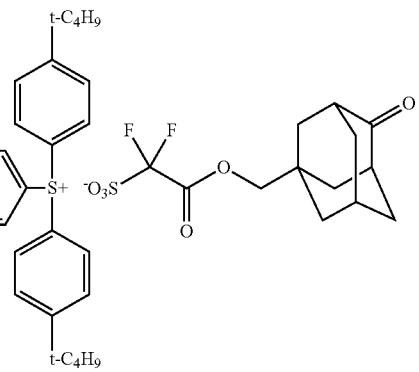
(B1-11)
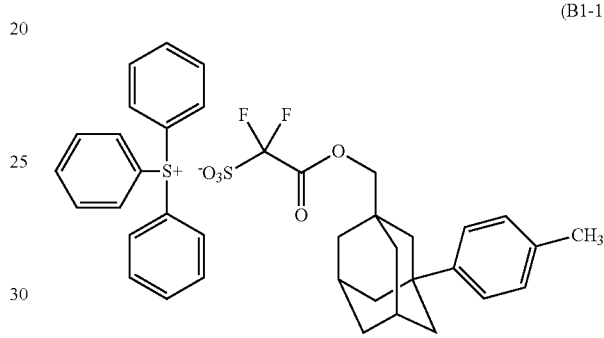
(B1-12)
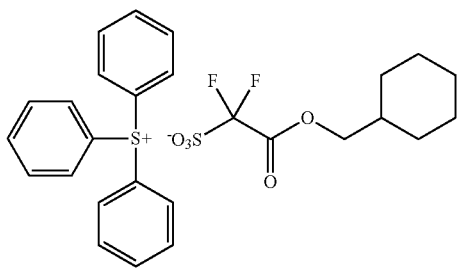
(B1-13)
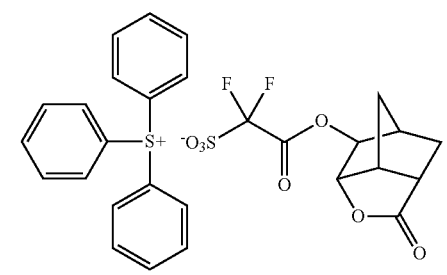
(B1-14)
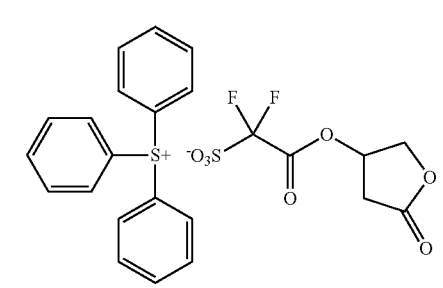

(B1-15)

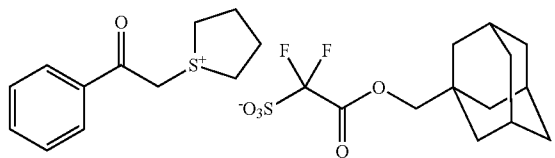

(B1-16)

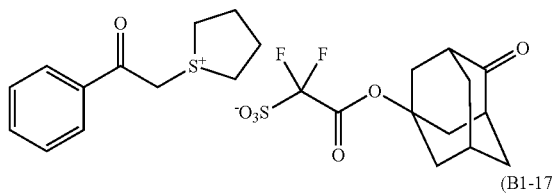

(B1-17)

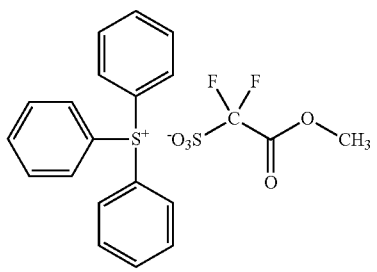

Two or more kinds of the photoacid generator can be used in combination.

The content of Component (C) in the photoresist composition is usually 1 part by weight or more and preferably 3 parts by weight or more per 100 parts by weight of sum of Component (B), POLYMER (I) and POLYMER (II), and it is usually 30 parts by weight or less and preferably 25 parts by weight or less per 100 parts by weight of sum of Component (B), POLYMER (I) and POLYMER (II).

The photoresist composition of the present invention can contain a basic compound as a quencher.

The basic compound is preferably a basic nitrogen-containing organic compound, and examples thereof include an amine compound such as an aliphatic amine and an aromatic amine and an ammonium salt. Examples of the aliphatic amine include a primary amine, a secondary amine and a tertiary amine. Examples of the aromatic amine include an aromatic amine in which aromatic ring has one or more amino groups such as aniline and a heteroaromatic amine such as pyridine. Preferable examples thereof include an aromatic amine represented by the formula (C2):

(C2)

wherein $Ar^{c1}$ represents an aromatic hydrocarbon group, and $R^{c5}$ and $R^{c6}$ independently represent a hydrogen atom, an aliphatic hydrocarbon group, a saturated cyclic hydrocarbon group or an aromatic hydrocarbon group, and the aliphatic hydrocarbon group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group.

The aliphatic hydrocarbon group is preferably an alkyl group and the saturated cyclic hydrocarbon group is preferably a cycloalkyl group. The aliphatic hydrocarbon group preferably has 1 to 6 carbon atoms. The saturated cyclic hydrocarbon group preferably has 5 to 10 carbon atoms. The aromatic hydrocarbon group preferably has 6 to 10 carbon atoms.

As the aromatic amine represented by the formula (C2), an amine represented by the formula (C2-1):

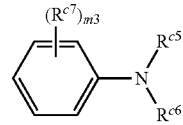

(C2-1)

wherein $R^{c5}$ and $R^{c6}$ are the same as defined above, and $R^{c7}$ is independently in each occurrence an aliphatic hydrocarbon group, an alkoxy group, a saturated cyclic hydrocarbon group or an aromatic hydrocarbon group, and the aliphatic hydrocarbon group, the alkoxy group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, and m3 represents an integer of 0 to 3, is preferable. The aliphatic hydrocarbon group is preferably an alkyl group and the saturated cyclic hydrocarbon group is preferably a cycloalkyl group. The aliphatic hydrocarbon group preferably has 1 to 6 carbon atoms. The saturated cyclic hydrocarbon group preferably has 5 to 10 carbon atoms. The aromatic hydrocarbon group preferably has 6 to 10 carbon atoms. The alkoxy group preferably has 1 to 6 carbon atoms.

Examples of the aromatic amine represented by the formula (C2) include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, and diphenylamine, and among them, preferred is diisopropylaniline and more preferred is 2,6-diisopropylaniline.

Other examples of the basic compound include amines represented by the formulae (C3) to (C11):

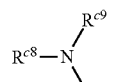

(C3)

(C4)

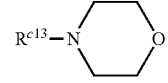

(C5)

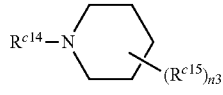

(C6)

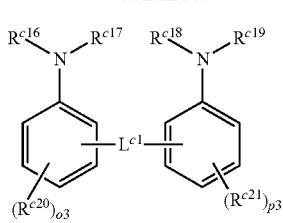 (C7)

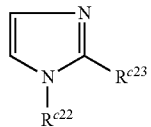 (C8)

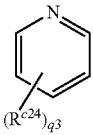 (C9)

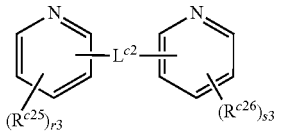 (C10)

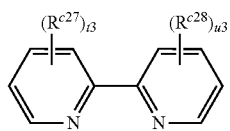 (C11)

wherein $R^{c8}$, $R^{c20}$, $R^{c21}$, and $R^{c23}$ to $R^{c28}$ independently represent an aliphatic hydrocarbon group, an alkoxy group, a saturated cyclic hydrocarbon group or an aromatic hydrocarbon group, and the aliphatic hydrocarbon group, the alkoxy group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group,
$R^{c9}$, $R^{c10}$, $R^{c11}$ to $R^{c14}$, $R^{c16}$ to $R^{c19}$, and $R^{c22}$ independently represents a hydrogen atom, an aliphatic hydrocarbon group, a saturated cyclic hydrocarbon group or an aromatic hydrocarbon group, and the aliphatic hydrocarbon group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group,
$R^{c15}$ is independently in each occurrence an aliphatic hydrocarbon group, a saturated cyclic hydrocarbon group or an alkanoyl group, $L^{c1}$ and $L^{c2}$ independently represents a divalent aliphatic hydrocarbon group, —CO—, —C(=NH)—, —C(=NR$^{c3}$)—, —S—, —S—S— or a combination thereof and $R^{c3}$ represents a C1-C4 alkyl group,
O3 to u3 each independently represents an integer of 0 to 3 and n3 represents an integer of 0 to 8.

The aliphatic hydrocarbon group has preferably 1 to 6 carbon atoms, and the saturated cyclic hydrocarbon group has preferably 3 to 6 carbon atoms, and the alkanoyl group has preferably 2 to 6 carbon atoms, and the divalent aliphatic hydrocarbon group has preferably 1 to 6 carbon atoms. The divalent aliphatic hydrocarbon group is preferably an alkylene group.

Examples of the amine represented by the formula (C3) include hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane and 4,4'-diamino-3,3'-diethyldiphenylmethane.

Examples of the amine represented by the formula (C4) include piperazine. Examples of the amine represented by the formula (C5) include morpholine. Examples of the amine represented by the formula (C6) include piperidine and hindered amine compounds having a piperidine skeleton as disclosed in JP 11-52575 A. Examples of the amine represented by the formula (C7) include 2,2'-methylenebisaniline. Examples of the amine represented by the formula (C8) include imidazole and 4-methylimidazole. Examples of the amine represented by the formula (C9) include pyridine and 4-methylpyridine. Examples of the amine represented by the formula (C10) include di-2-pyridyl ketone, 1,2-di(2-pyridyl)ethane, 1,2-di(4-pyridyl)ethane, 1,3-di(4-pyridyl)propane, 1,2-bis(2-pyridyl)ethene, 1,2-bis(4-pyridyl)ethene, 1,2-di(4-pyridyloxy)ethane, 4,4'-dipyridyl sulfide, 4,4'-dipyridyl disulfide, 2,2'-dipyridylamine and 2,2'-dipicolylamine. Examples of the amine represented by the formula (C11) include bipyridine.

When the photoresist composition contains the basic compound, the content thereof is usually 0.01 to 1% by weight based on sum of solid component.

The photoresist composition of the present invention usually contains one or more solvents. Examples of the solvent include a glycol ether ester such as ethyl cellosolve acetate, methyl cellosolve acetate and propylene glycol monomethyl ether acetate; a glycol ether such as propylene glycol monomethyl ether; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone.

The amount of the solvent is usually 90% by weight or more, preferably 92% by weight or more preferably 94% by weight or more based on total amount of the photoresist composition of the present invention. The amount of the solvent is usually 99.9% by weight or less and preferably 99% by weight or less based on total amount of the photoresist composition of the present invention.

The photoresist composition of the present invention can contain, if necessary, a small amount of various additives such as a sensitizer, a dissolution inhibitor, other polymers, a surfactant, a stabilizer and a dye as long as the effect of the present invention is not prevented.

The photoresist composition of the present invention is useful for a chemically amplified photoresist composition.

A photoresist pattern can be produced by the following steps (1) to (5):

(1) a step of applying the photoresist composition of the present invention on a substrate, (2) a step of forming a photoresist film by conducting drying, (3) a step of exposing the photoresist film to radiation, (4) a step of baking the exposed photoresist film, and (5) a step of developing the baked photoresist film with an alkaline developer, thereby forming a photoresist pattern.

The applying of the photoresist composition on a substrate is usually conducted using a conventional apparatus such as spin coater. The photoresist composition is preferably filtrated with filter having 0.2 μm of a pore size before applying. Examples of the substrate include a silicon wafer or a quartz wafer on which a sensor, a circuit, a transistor or the like is formed.

The formation of the photoresist film is usually conducted using a heating apparatus such as hot plate or a decompressor, and the heating temperature is usually 50 to 200° C., and the operation pressure is usually 1 to $1.0*10^5$ Pa.

The photoresist film obtained is exposed to radiation using an exposure system. The exposure is usually conducted through a mask having a pattern corresponding to the desired photoresist pattern. Examples of the exposure source include a light source radiating laser light in a UV-region such as a KrF excimer laser (wavelength: 248 nm), an ArF excimer laser (wavelength: 193 nm) and a $F_2$ laser (wavelength: 157 nm), and a light source radiating harmonic laser light in a far UV region or a vacuum UV region by wavelength conversion of laser light from a solid laser light source (such as YAG or semiconductor laser).

The temperature of baking of the exposed photoresist film is usually 50 to 200° C., and preferably 70 to 150° C.

The development of the baked photoresist film is usually carried out using a development apparatus. The alkaline developer used may be any one of various alkaline aqueous solution used in the art. Generally, an aqueous solution of tetramethylammonium hydroxide or (2-hydroxyethyl)trimethylammonium hydroxide (commonly known as "choline") is often used. After development, the photoresist pattern formed is preferably washed with ultrapure water, and the remained water on the photoresist pattern and the substrate is preferably removed.

The photoresist composition of the present invention provides a photoresist pattern showing good Exposure Latitude (EL), and therefore, the photoresist composition of the present invention is suitable for ArF excimer laser lithography, KrF excimer laser lithography, ArF immersion lithography, EUV (extreme ultraviolet) lithography, EUV immersion lithography and EB (electron beam) lithography. Further, the photoresist composition of the present invention can especially be used for ArF immersion lithography, EUV lithography and EB lithography. Furthermore, the photoresist composition of the present invention can also be used in double imaging.

EXAMPLES

The present invention will be described more specifically by Examples, which are not construed to limit the scope of the present invention.

The "%" and "part(s)" used to represent the content of any component and the amount of any material used in the following examples and comparative examples are on a weight basis unless otherwise specifically noted. The weight-average molecular weight of any material used in the following examples is a value found by gel permeation chromatography [HLC-8120GPC Type, Column: Three of TSKgel Multipore HXL-M with guard column, manufactured by TOSOH CORPORATION, Solvent: tetrahydrofuran, Flow rate: 1.0 mL/min., Detector: RI Detector, Column temperature: 40° C., Injection volume: 100 μL] using standard polystyrene as a standard reference material.

Structures of compounds were determined by NMR (GX-270 Type or EX-270 Type, manufactured by JEOL LTD.).

Synthesis Example 1

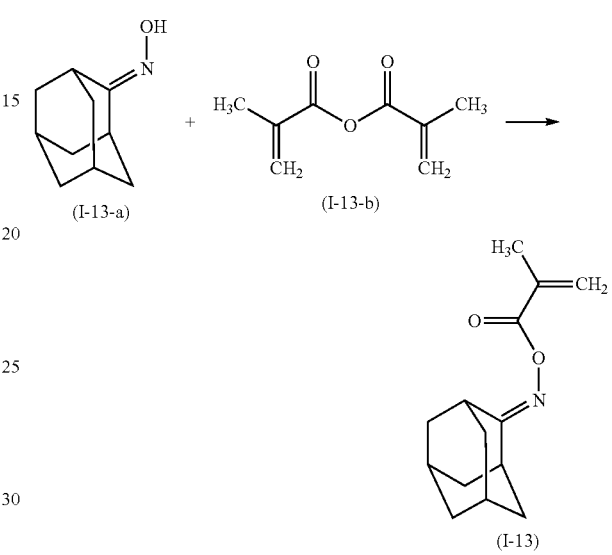

To a solution prepared by mixing 50.0 parts of the compound represented by the formula (I-13-a) and 200 parts of tetrahydrofuran, 33.7 parts of N-methylpyrrolidone and 56.0 parts of the compound represented by the formula (I-13-b) were added. The resultant mixture was stirred at room temperature for 3 hours. To the reaction mixture obtained, 72 parts of 5% hydrochloric acid and 160 parts of ion-exchanged water were added, and then, the resultant mixture was extracted with 400 parts of ethyl acetate. The organic layer obtained was mixed with 167 parts of 10% aqueous potassium carbonate solution, and the resultant mixture was stirred overnight followed by removing an aqueous layer. The organic layer obtained was washed with ion-exchanged water and then, concentrated under reduced pressure to obtain 65.8 parts of the monomer represented by the formula (I-13). The monomer obtained is called as Monomer (I-13). $^1$H-NMR (dimethylsulfoxide-$d_6$): δ (ppm) 6.03 (1H, s), 5.73-5.68 (1H, m), 3.41-3.33 (1H, m), 2.69-2.61 (1H, m), 2.09-1.68 (15H, m)

Synthesis Example 2

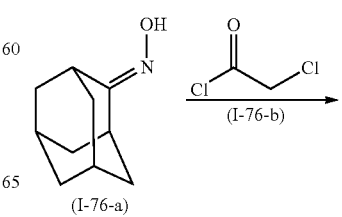

-continued

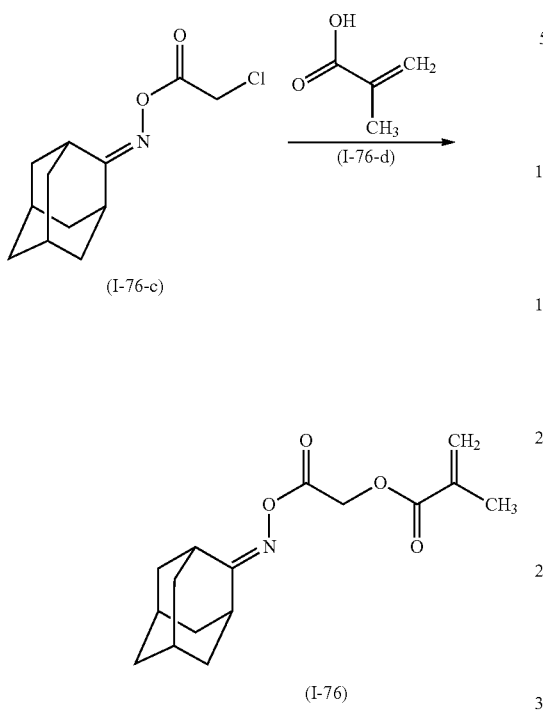

(I-76-c)

(I-76)

To a solution prepared by mixing 10.0 parts of the compound represented by the formula (I-76-a) and 70 parts of methyl isobutyl ketone, 6.0 parts of pyridine and 7.2 parts of the compound represented by the formula (I-76-b) were added. The resultant mixture was stirred at 5° C. for 1 hour. To the reaction mixture obtained, 70 parts of 2% hydrochloric acid was added, and then, the resultant mixture was extracted with 140 parts of ethyl acetate. The organic layer obtained was mixed with 44 parts of 10% aqueous potassium carbonate solution, and the resultant mixture was stirred overnight followed by removing an aqueous layer. The organic layer obtained was washed with ion-exchanged water and then, concentrated under reduced pressure to obtain 14.1 parts of the compound represented by the formula (I-76-c).

$^1$H-NMR (dimethylsulfoxide-$d_6$): δ (ppm) 4.50 (2H, s), 3.42-3.34 ($^1$H, m), 2.69-2.59 (1H, m), 2.09-1.67 (12H, m)

To a solution prepared by mixing 2.86 parts of the compound represented by the formula (I-76-d) and 12 parts of N,N-dimethylformamide, 2.3 parts of potassium carbonate and 0.28 part of potassium iodide were added. The resultant mixture was stirred at 40° C. for 1 hour. To the reaction mixture obtained, 7.3 parts of the compound represented by the formula (I-76-c) was added, and then, the resultant mixture was stirred at 40° C. for 3 hours. The reaction mixture obtained was cooled down to room temperature, and then, added to a mixture of 41 parts of 5% aqueous oxalic acid solution and 160 parts of ethyl acetate to conduct the extraction. The organic layer obtained was washed with ion-exchanged water and then, concentrated under reduced pressure to obtain 7.9 parts of the monomer represented by the formula (I-76). The monomer obtained is called as Monomer (I-76).

$^1$H-NMR (dimethylsulfoxide-$d_6$) δ (ppm) 6.14-6.07 (1H, m), 5.81-5.73 (1H, m), 4.89 (2H, s), 3.42-3.29 (1H, m), 2.70-2.60 (1H, m), 2.09-1.61 (15H, m)

Synthesis Example 3

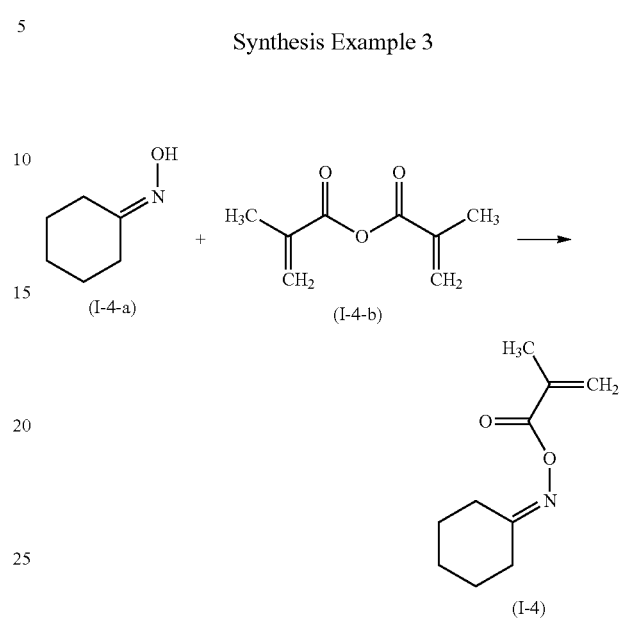

(I-4)

The monomer represented by the formula (I-4) can be obtained according to the same manner in Synthesis Example 1 except that the compound represented by the formula (I-4-a) is used in place of the compound represented by the formula (I-13-a). The monomer obtained is called as Monomer (I-4).

In Polymer Synthesis Examples and Resin Synthesis Examples, Monomer (M-1), Monomer (M-2), Monomer (M-3), Monomer (M-4), Monomer (M-5), Monomer (I-13), Monomer (I-76) and Monomer (I-4) represented by the followings were used in addition to monomers prepared in the above.

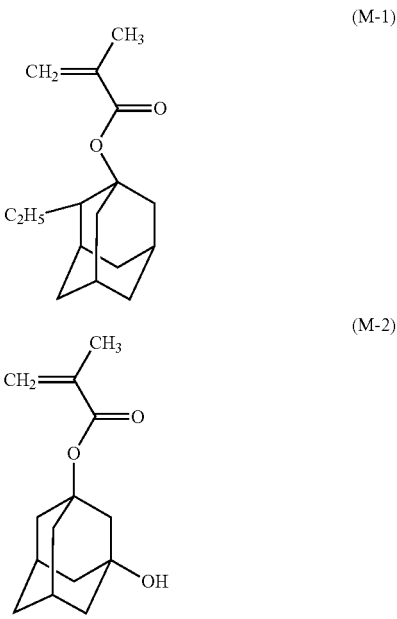

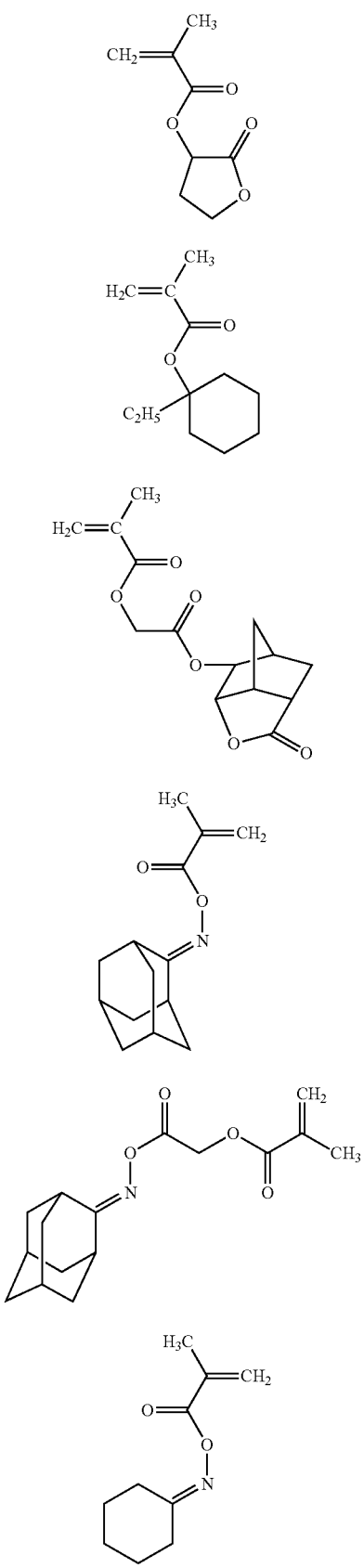

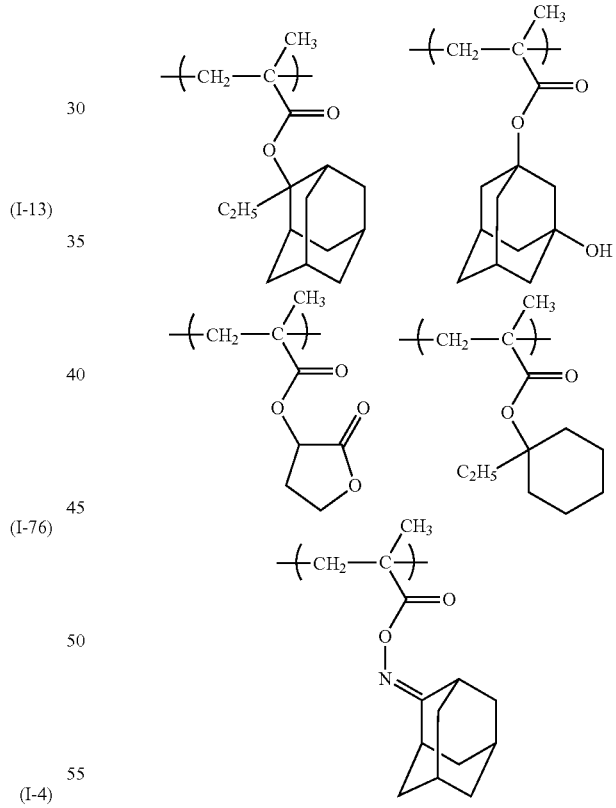

Polymer Synthesis Example 1

To a flask equipped with a stirrer, a thermometer and a condenser, 6.50 parts of Monomer (M-1), 0.74 part of Monomer (M-2), 9.09 parts of Monomer (M-3), 3.70 parts of Monomer (M-4) and 0.73 part of Monomer (I-13) (molar ratio: 25/3/51/18/3 (Monomer (M-1)/Monomer (M-2)/Monomer (M-3)/Monomer (M-4)/Monomer (I-13)) were added under an atmosphere of nitrogen, and 1,4-dioxane of which amount was 1.5 times part based on total parts of all monomers was added thereto prepare a solution. To the solution, 2,2'-azobisisobutyronitrile as an initiator in a ratio of 0.8 mol % based on all monomer molar amount and 2,2'-azobis (2,4-dimethylvaleronitrile) as an initiator in a ratio of 2.4 mol % based on all monomer molar amount were added, and the mixture obtained was heated at 66° C. for about 5 hours. The reaction mixture obtained was poured into a large amount of a mixture of methanol and water to cause precipitation. The precipitate was isolated and then washed with methanol to obtain a polymer having a weight-average molecular weight of about $1.4 \times 10^4$ and a dispersion degree of 1.89 in a yield of 84%. The polymer had the following structural units. This is called as Polymer I1.

Polymer Synthesis Example 2

To a flask equipped with a stirrer, a thermometer and a condenser, 6.50 parts of Monomer (M-1), 0.74 part of Monomer (M-2), 9.09 parts of Monomer (M-3), 3.70 parts of Monomer (M-4) and 0.91 part of Monomer (I-76) (molar ratio: 25/3/51/18/3 (Monomer (M-1)/Monomer (M-2)/Monomer (M-3)/Monomer (M-4)/Monomer (I-76)) were added under an atmosphere of nitrogen, and 1,4-dioxane of which amount was 1.5 times part based on total parts of all monomers was added thereto prepare a solution. To the solution, 2,2'-azobisisobutyronitrile as an initiator in a ratio of 0.8 mol % based on all monomer molar amount and 2,2'-azobis (2,4-dimethylvaleronitrile) as an initiator in a ratio of 2.4 mol % based on all monomer molar amount were added, and the mixture obtained was heated at 66° C. for about 5 hours. The reaction mixture obtained was poured into a large amount of a mixture of methanol and water to cause precipitation. The precipitate was isolated and then washed with methanol to obtain a polymer having a weight-average molecular weight of about $1.4 \times 10^4$ and a dispersion degree of 1.90 in a yield of 83%. The polymer had the following structural units. This is called as Polymer I2.

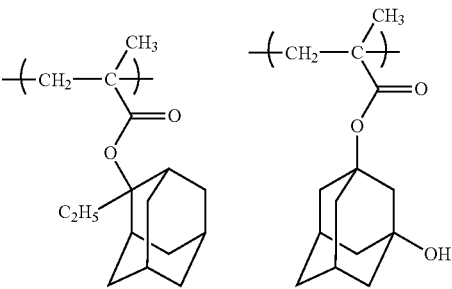

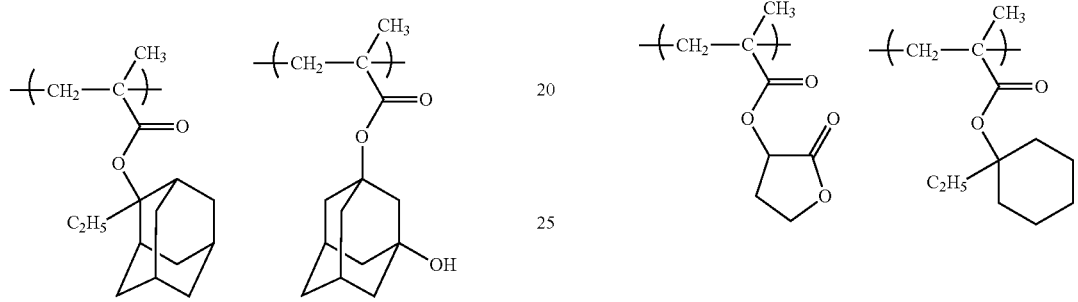

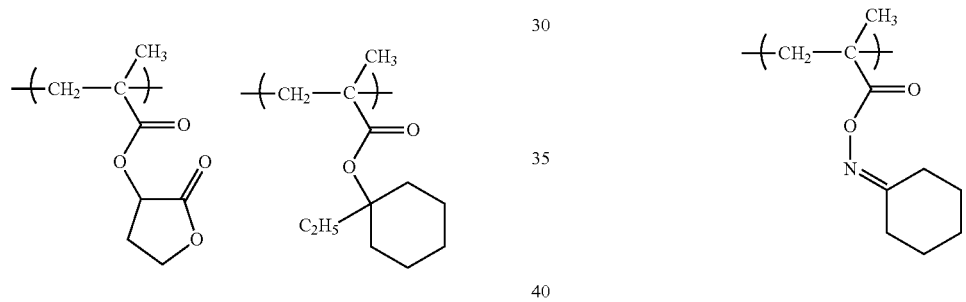

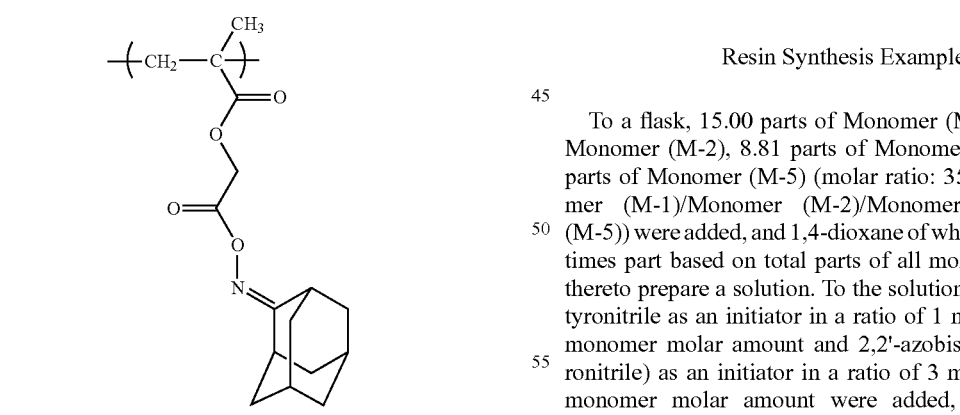

Polymer Synthesis Example 3

The polymerization reaction is conducted according to the same manner in Polymer Synthesis Example 1 except that the Monomer (I-4) is used in place of Monomer (I-13) to be able to obtain a polymer. This is called as Polymer I3. Polymer I3 has the following structural units.

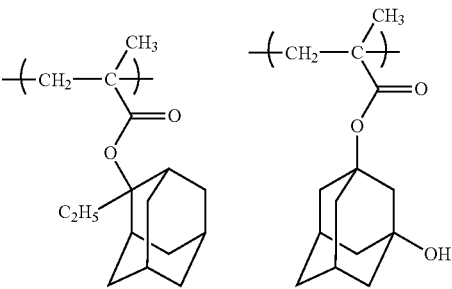

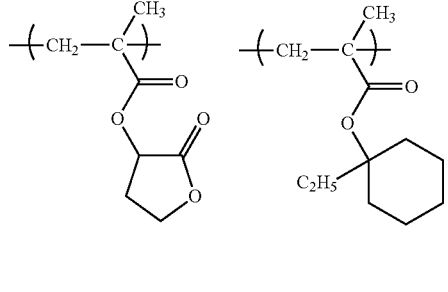

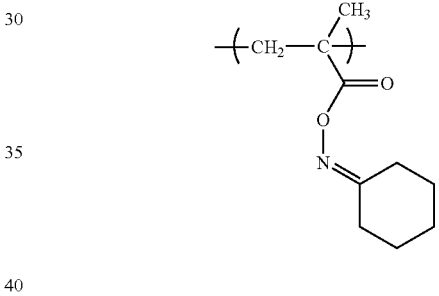

Resin Synthesis Example 1

To a flask, 15.00 parts of Monomer (M-1), 4.89 parts of Monomer (M-2), 8.81 parts of Monomer (M-3) and 11.12 parts of Monomer (M-5) (molar ratio: 35/12/30/23 (Monomer (M-1)/Monomer (M-2)/Monomer (M-3)/Monomer (M-5)) were added, and 1,4-dioxane of which amount was 1.5 times part based on total parts of all monomers was added thereto prepare a solution. To the solution, 2,2'-azobisisobutyronitrile as an initiator in a ratio of 1 mol % based on all monomer molar amount and 2,2'-azobis(2,4-dimethylvaleronitrile) as an initiator in a ratio of 3 mol % based on all monomer molar amount were added, and the mixture obtained was heated at 77° C. for about 5 hours. The reaction mixture obtained was poured into a large amount of a mixture of methanol and water to cause precipitation. The precipitate was isolated and then the operation wherein the precipitate was mixed with a large amount of a mixture of methanol and water followed by isolation of the precipitate was repeated three times for purification. As the result, a resin having a weight-average molecular weight of about $8.1 \times 10^3$ was obtained in a yield of 78%. The resin had the following structural units. This is called as Resin A1.

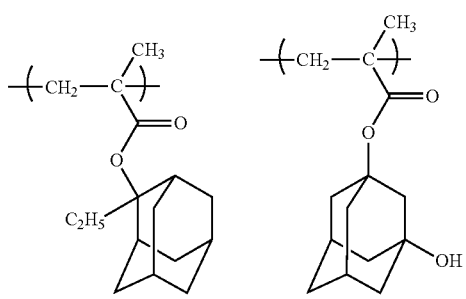

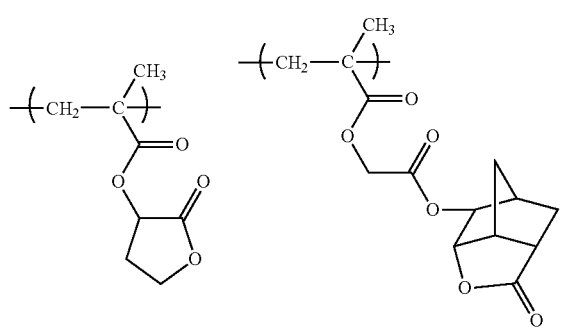

Resin Synthesis Example 2

To a flask equipped with a stirrer, a thermometer and a condenser, 12.00 parts of Monomer (M-1), 1.37 parts of Monomer (M-2), 17.76 parts of Monomer (M-3) and 6.83 parts of Monomer (M-4) (molar ratio: 25/3/54/18 (Monomer (M-1)/Monomer (M-2)/Monomer (M-3)/Monomer (M-4)) were added under an atmosphere of nitrogen, and 1,4-dioxane of which amount was 1.5 times part based on total parts of all monomers was added thereto prepare a solution. To the solution, 2,2'-azobisisobutyronitrile as an initiator in a ratio of 0.8 mol % based on all monomer molar amount and 2,2'-azobis (2,4-dimethylvaleronitrile) as an initiator in a ratio of 2.4 mol % based on all monomer molar amount were added, and the mixture obtained was heated at 66° C. for about 5 hours. The reaction mixture obtained was poured into a large amount of a mixture of methanol and water to cause precipitation. The precipitate was isolated and then washed with methanol to obtain a resin having a weight-average molecular weight of about $1.1 \times 10^4$ and a dispersion degree of 1.69 in a yield of 79%. The resin had the following structural units. This is called as Resin A2.

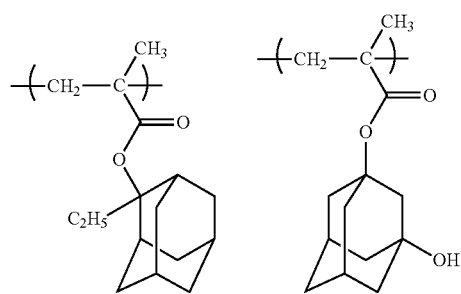

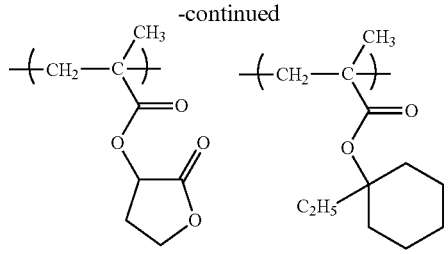

Examples 1 and 2

Resin

Resin A2
<Polymer>
Polymer I1
<Acid Generator>
B2:

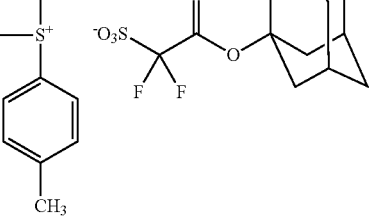

<Quencher>
C1: 2,6-diisopropylaniline
<Solvent>
E1:

| propylene glycol monomethyl ether acetate | 240 parts |
| propylene glycol monomethyl ether | 20 parts |
| 2-heptanone | 20 parts |
| γ-butyrolactone | 3.5 parts |

The following components were mixed and dissolved, further, filtrated through a fluorine resin filter having pore diameter of 0.2 μm, to prepare photoresist compositions.
Resin (kind and amount are described in Table 8)
Polymer (kind and amount are described in Table 8)
Acid generator (kind and amount are described in Table 8)
Quencher (kind and amount are described in Table 8)
Solvent E1

TABLE 8

| Ex. No | Resin (kind/amount (part)) | Polymer (kind/amount (part)) | Acid generator (kind/amount (part)) | Quencher (kind/amount (part)) |
|---|---|---|---|---|
| Ex. 1 | A2/9.0 | I1/1.0 | B2/0.96 | C1/0.08 |
| Ex. 2 | A2/8.0 | I1/2.0 | B2/0.96 | C1/0.067 |

Silicon wafers having a diameter of 12 inches were each coated with "ARC-29", which is an organic anti-reflective coating composition available from Nissan Chemical Industries, Ltd., and then baked under the conditions: 205° C., 60 seconds, to form a 780 Å-thick organic anti-reflective coating. Each of the photoresist compositions prepared as above was spin-coated over the anti-reflective coating so that the thickness of the resulting film became 75 nm after drying. The silicon wafers thus coated with the respective photoresist compositions were each prebaked on a direct hotplate at 100° C. for 60 seconds. Using an ArF immersion excimer scanner ("XT-1900Gi" manufactured by ASML, NA=1.35, ¾ Annular, X-Y deflection), each wafer thus formed with the respective photoresist film was subjected to line and space pattern immersion exposure, with the exposure quantity being varied stepwise.

After the exposure, each wafer was subjected to post-exposure baking on a hotplate at 95° C. for 60 seconds and then to paddle development for 60 seconds with an aqueous solution of 2.38% tetramethylammonium hydroxide.

Exposure Latitude (EL): Each of line and space patterns obtained by exposing through a reticle having a pitch of 90 nm of which line width is 38 nm and space width is 52 nm and developing was observed with a scanning electron microscope. Line widths of the patterns obtained were plotted against exposure amounts (mJ/cm$^2$) on forming the pattern to make a graph which contained the approximate line and of which a horizontal axis was an exposure amount and a vertical axis was a line width of the pattern. Each slope of the approximate lines in the range of the line width of 36 nm to 44 nm was calculated. When the value of the slope is less than 1.50, exposure latitude is very good and its evaluation is marked by "⊚", when the value of the slope is 1.50 or more and less than 1.70, exposure latitude is good and its evaluation is marked by "○", and when the value of the slope is 1.70 or more, exposure latitude is bad and its evaluation is marked by "X". The smaller the value of the slope is, the better EL is. The results thereof are shown in Table 10. Each of the values of the slopes is also shown in parentheses in a column of "EL" of Table 10.

Examples 3 to 7 and Comparative Example 1

Resin

Resin A1
<Polymer>
Polymer I1, I2
<Monomer>
Monomer (I-13)
<Acid Generator>
B1:

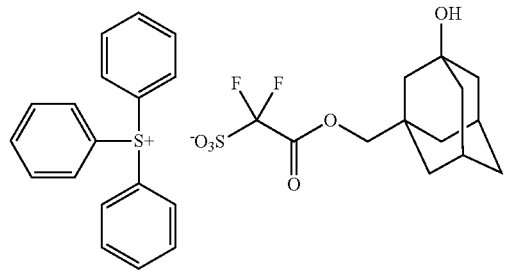

<Quencher>
C1: 2,6-diisopropylaniline
<Solvent>
E1:

| | |
|---|---|
| propylene glycol monomethyl ether acetate | 240 parts |
| propylene glycol monomethyl ether | 20 parts |
| 2-heptanone | 20 parts |
| γ-butyrolactone | 3.5 parts |

The following components were mixed and dissolved, further, filtrated through a fluorine resin filter having pore diameter of 0.2 μm, to prepare photoresist compositions.
Resin (kind and amount are described in Table 9)
Polymer or Monomer (kind and amount are described in Table 9)
Acid generator (kind and amount are described in Table 9)
Quencher (kind and amount are described in Table 9)
Solvent E1

TABLE 9

| Ex. No. | Resin (kind/amount (part)) | Polymer/ Monomer (kind/amount (part)) | Acid generator (kind/amount (part)) | Quencher (kind/amount (part)) |
|---|---|---|---|---|
| Ex. 3 | A1/10 | I1/0.3 | B1/0.51 | C1/0.068 |
| Ex. 4 | A1/10 | I1/0.5 | B1/0.51 | C1/0.068 |
| Ex. 5 | A1/10 | I1/1.0 | B1/0.51 | C1/0.068 |
| Ex. 6 | A1/10 | I-13/0.02 | B1/0.51 | C1/0.068 |
| Ex. 7 | A1/10 | I2/1.0 | B1/0.51 | C1/0.068 |
| Comp. Ex. 1 | A1/10 | — | B1/0.51 | C1/0.068 |

Silicon wafers having a diameter of 12 inches were each coated with "ARC-29", which is an organic anti-reflective coating composition available from Nissan Chemical Industries, Ltd., and then baked under the conditions: 205° C., 60 seconds, to form a 780 Å-thick organic anti-reflective coating. Each of the photoresist compositions prepared as above was spin-coated over the anti-reflective coating so that the thickness of the resulting film became 75 nm after drying. The silicon wafers thus coated with the respective photoresist compositions were each prebaked on a direct hotplate at 100° C. for 60 seconds. Using an ArF immersion excimer scanner ("XT-1900Gi" manufactured by ASML, NA=1.35, ¾ C-Quad, X-Y deflection), each wafer thus formed with the respective photoresist film was subjected to line and space pattern immersion exposure, with the exposure quantity being varied stepwise.

After the exposure, each wafer was subjected to post-exposure baking on a hotplate at 95° C. for 60 seconds and then to paddle development for 60 seconds with an aqueous solution of 2.38% tetramethylammonium hydroxide.

Exposure Latitude (EL): Each of line and space patterns obtained by exposing through a reticle having a pitch of 180 nm of which line width is 60 nm and space width is 120 nm and developing was observed with a scanning electron microscope. Line widths of the patterns obtained were plotted against exposure amounts (mJ/cm$^2$) on forming the pattern to make a graph which contained the approximate line and of which a horizontal axis was an exposure amount and a vertical axis was a line width of the pattern. Each slope of the approximate lines in the range of the line width of 63 nm to 77 nm was calculated. When the value of the slope is less than 1.50, exposure latitude is very good and its evaluation is marked by "⊚", when the value of the slope is 1.50 or more and less than 1.70, exposure latitude is good and its evaluation is marked by "◎", and when the value of the slope is 1.70 or more, exposure latitude is bad and its evaluation is marked by "X". The smaller the value of the slope is, the better EL is. The results thereof are shown in Table 10. Each of the values of the slopes is also shown in parentheses in a column of "EL" of Table 10.

TABLE 10

| Ex. No. | EL |
|---|---|
| Ex. 1 | ◎ (1.12) |
| Ex. 2 | ◎ (0.96) |
| Ex. 3 | ○ (1.62) |
| Ex. 4 | ◎ (1.45) |
| Ex. 5 | ◎ (1.36) |
| Ex. 6 | ◎ (1.32) |
| Ex. 7 | ◎ (1.46) |
| Ref. Ex. 1 | X (1.71) |

The good photoresist pattern can be obtained according to the same manner in the above Example except that Polymer I3 is used in place of Polymer I1.

The photoresist composition of the present invention provides a good photoresist pattern having good Exposure latitude.

What is claimed is:

1. A photoresist composition comprising:
at least one selected from the group consisting of a monomer represented by the formula (I):

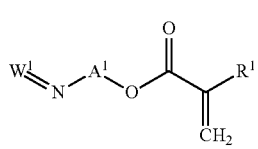

(I)

wherein $R^1$ represents a hydrogen atom or a methyl group, $W^1$ represents a C3-C20 divalent saturated cyclic hydrocarbon group which can have one or more substituents selected from the group consisting of a hydroxyl group, a halogen atom, a cyano group and a nitro group and in which one or more —$CH_2$— can be replaced by —O— or —CO—, $A^1$ represents a single bond or *—O—CO—W1— wherein * represents a binding position to $W^1$=N— and W1 represents a C1-C10 divalent saturated hydrocarbon group in which one or more —$CH_2$— can be replaced by —O—, —CO— or —NH—, a polymer consisting of a structural unit derived from the monomer represented by the formula (I) and a polymer consisting of a structural unit derived from the monomer represented by the formula (I) and a structural unit derived from a monomer represented by the formula (II):

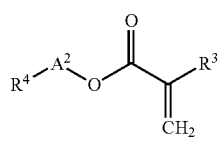

(II)

wherein $R^3$ represents a hydrogen atom or a methyl group, $A^2$ represents a single bond or *—O—CO—$(CH_2)_n$— wherein * represents a binding position to $R^4$—, n represents an integer of 1 to 7 and $R^4$ represents a C3-C20 saturated cyclic hydrocarbon group in which one or more —$CH_2$— can be replaced by —O— or —CO—, a resin having an acid-labile group and being insoluble or poorly soluble in an aqueous alkali solution but becoming soluble in an aqueous alkali solution by the action of an acid, and an acid generator.

2. The photoresist composition according to claim 1, wherein $W^1$ is a group represented by the formula ($W^1$-A):

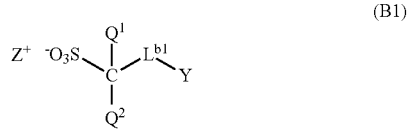

($W^1$-A)

wherein $R^5$ is independently in each occurrence a hydroxyl group, a halogen atom, a cyano group or a nitro group and m represents an integer of 0 to 5.

3. The photoresist composition according to claim 2, wherein $R^5$ is a hydroxyl group.

4. The photoresist composition according to claim 1, wherein the acid generator is a salt represented by the formula (B1):

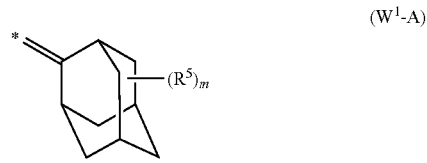

(B1)

wherein $Q^1$ and $Q^2$ each independently represent a fluorine atom or a C1-C6 perfluoroalkyl group, $L^{b1}$ represents a single bond or a C1-C17 divalent saturated hydrocarbon group in which one or more —$CH_2$— can be replaced by —O— or —CO—, Y represents a C1-C18 aliphatic hydrocarbon group which can have one or more substituents or a C3-C18 saturated cyclic hydrocarbon group which can have one or more substituents, and one or more —$CH_2$— in the aliphatic hydrocarbon group and the saturated cyclic hydrocarbon group can be replaced by —O—, —$SO_2$— or —CO—, and $Z^+$ represents an organic counter cation.

5. A process for producing a photoresist pattern comprising the following steps (1) to (5):
(1) a step of applying the photoresist composition according to claim 1 on a substrate,
(2) a step of forming a photoresist film by conducting drying,
(3) a step of exposing the photoresist film to radiation,
(4) a step of baking the exposed photoresist film, and
(5) a step of developing the baked photoresist film with an alkaline developer, thereby forming a photoresist pattern.

* * * * *